United States Patent
Chu et al.

(10) Patent No.: US 9,617,147 B2
(45) Date of Patent: Apr. 11, 2017

(54) DUAL LAYER MICROELECTROMECHANICAL SYSTEMS DEVICE AND METHOD OF MANUFACTURING SAME

(71) Applicant: Taiwan Semiconductor Manufacturing Company, Ltd., Hsin-Chu (TW)

(72) Inventors: Chia-Hua Chu, Hsinchu County (TW); Chun-Wen Cheng, Hsinchu County (TW); Jiou-Kang Lee, Hsinchu (TW); Kai-Chih Liang, Hsinchu County (TW); Chung-Hsien Lin, Hsinchu (TW); Te-Hao Lee, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/685,309

(22) Filed: Apr. 13, 2015

(65) Prior Publication Data

US 2015/0217996 A1    Aug. 6, 2015

Related U.S. Application Data

(63) Continuation of application No. 13/749,033, filed on Jan. 24, 2013, now Pat. No. 9,006,015.

(51) Int. Cl.
*H01L 21/00* (2006.01)
*B81C 1/00* (2006.01)

(52) U.S. Cl.
CPC ...... *B81C 1/00269* (2013.01); *B81C 1/00039* (2013.01); *B81C 1/00261* (2013.01); *B81B 2201/0235* (2013.01); *B81B 2201/0242* (2013.01); *B81B 2201/0257* (2013.01); *B81B 2203/0307* (2013.01); *B81B 2207/012* (2013.01); *B81C 2203/035* (2013.01)

(58) Field of Classification Search
CPC ............... B81C 2201/0183; B81C 2201/0121
See application file for complete search history.

(56) References Cited

U.S. PATENT DOCUMENTS

| | | | |
|---|---|---|---|
| 5,511,428 A | 4/1996 | Goldberg et al. | |
| 8,415,768 B1 * | 4/2013 | Golda | H01L 23/5384 257/619 |
| 9,006,015 B2 * | 4/2015 | Chu | B81C 1/00039 438/455 |
| 2007/0092983 A1 | 4/2007 | Weigold | |
| 2008/0137884 A1 | 6/2008 | Kim et al. | |
| 2009/0007413 A1 | 1/2009 | Jafri et al. | |
| 2009/0080682 A1 | 3/2009 | Ogura et al. | |
| 2011/0092018 A1 | 4/2011 | LaFond et al. | |
| 2012/0094435 A1 | 4/2012 | Nasiri et al. | |
| 2014/0206123 A1 | 7/2014 | Chu | |

FOREIGN PATENT DOCUMENTS

CN    200831394    8/2008

* cited by examiner

*Primary Examiner* — Reema Patel
(74) *Attorney, Agent, or Firm* — Haynes and Boone, LLP

(57) ABSTRACT

Exemplary microelectromechanical system (MEMS) devices, and methods for fabricating such are disclosed. An exemplary method includes providing a silicon-on-insulator (SOI) substrate, wherein the SOI substrate includes a first silicon layer separated from a second silicon layer by an insulator layer; processing the first silicon layer to form a first structure layer of a MEMS device; bonding the first structure layer to a substrate; and processing the second silicon layer to form a second structure layer of the MEMS device.

20 Claims, 54 Drawing Sheets

DUAL LAYER MICROELECTROMECHANICAL SYSTEMS DEVICE AND METHOD OF MANUFACTURING SAME

PRIORITY DATA

The present application is a continuation application of U.S. patent application Ser. No. 13/749,033, filed Jan. 24, 2013, which is incorporated herein by reference in its entirety.

BACKGROUND

Microelectromechanical systems (MEMS) devices are electro-mechanical systems often incorporated into integrated circuit devices, such as integrated circuit devices fabricated using complementary metal-oxide-semiconductor (CMOS) fabrication technologies (referred to as CMOS devices). Current MEMS device fabrication methods present difficulty. For example, for MEMS sensors, thick structure layers (for example, greater than about 25 μm) are typically required to fabricate the proof mass so that inertia force is increased for improving device performance. The sensor structures for such MEMS sensors thus often have large dimensions to achieve soft spring or torsion-type (or seesaw-type structures). In another example, MEMS microphones typically require two structure layers. Conventional fabrication techniques require trench sealing/filling processes. It has been observed that the thickness of the structure layers during fabrication present difficulty when filling/sealing the trenches. Accordingly, although existing MEMS devices and methods for manufacturing MEMS devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
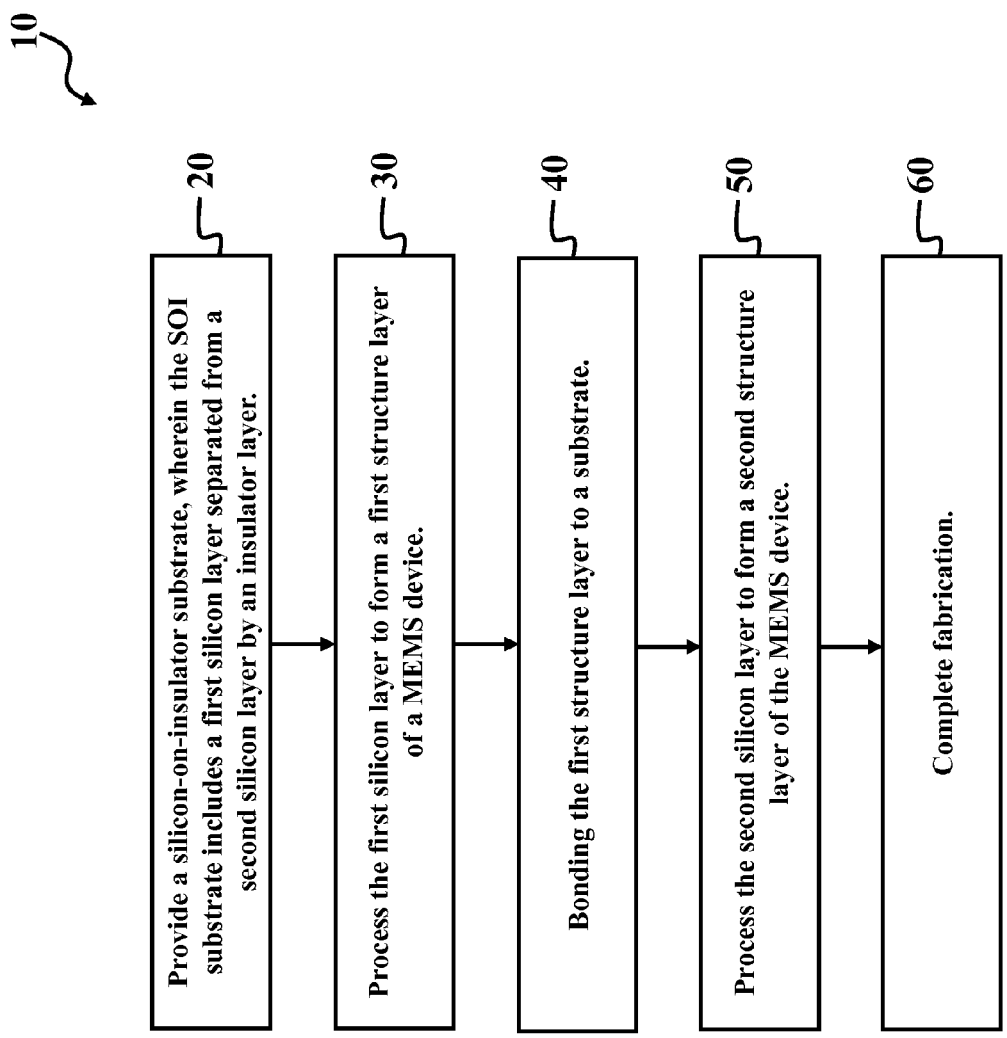
FIG. 1 is a flow chart of a method for fabricating a MEMS device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flow chart of a method 10 for fabricating a device according to various aspects of the present disclosure. The method 10 fabricates a microelectromechanical systems (MEMS) device, in particular, a MEMS device having dual structure layers. At block 20, a silicon-on-insulator substrate is provided. The SOI substrate includes a first silicon layer separated from a second silicon layer by an insulator layer. At block 30, the first silicon layer is processed to form a first structure layer of a MEMS device. At block 40, the first structure layer is bonded to a substrate. At block 50, the second silicon layer is processed to form a second structure layer of the MEMS device. At block 60, subsequent processing can be implemented to complete fabrication of the MEMS device. Additional steps can be provided before, during, and after the method 10, and some of the steps described can be replaced or eliminated for other embodiments of the method. The discussion that follows illustrates various embodiments of devices, specifically, MEMS devices, that can be fabricated according to the method 10 of FIG. 1.

FIGS. 2-15 are diagrammatic cross-sectional views of a device 100, in portion or entirety, at various stages of fabrication according to the method 10 of FIG. 1. In the depicted embodiment, the device 100 includes an integrated circuit device, specifically a CMOS device integrated with a MEMS device. Accordingly, the device 100 is alternatively referred to as a CMOS-MEMS device. FIGS. 2-15 have been simplified for the sake of clarity to better understand the inventive concepts of the present disclosure. Additional features can be added in the device 100, and some of the features described below can be replaced or eliminated for additional embodiments of the device 100.

Figure 2:
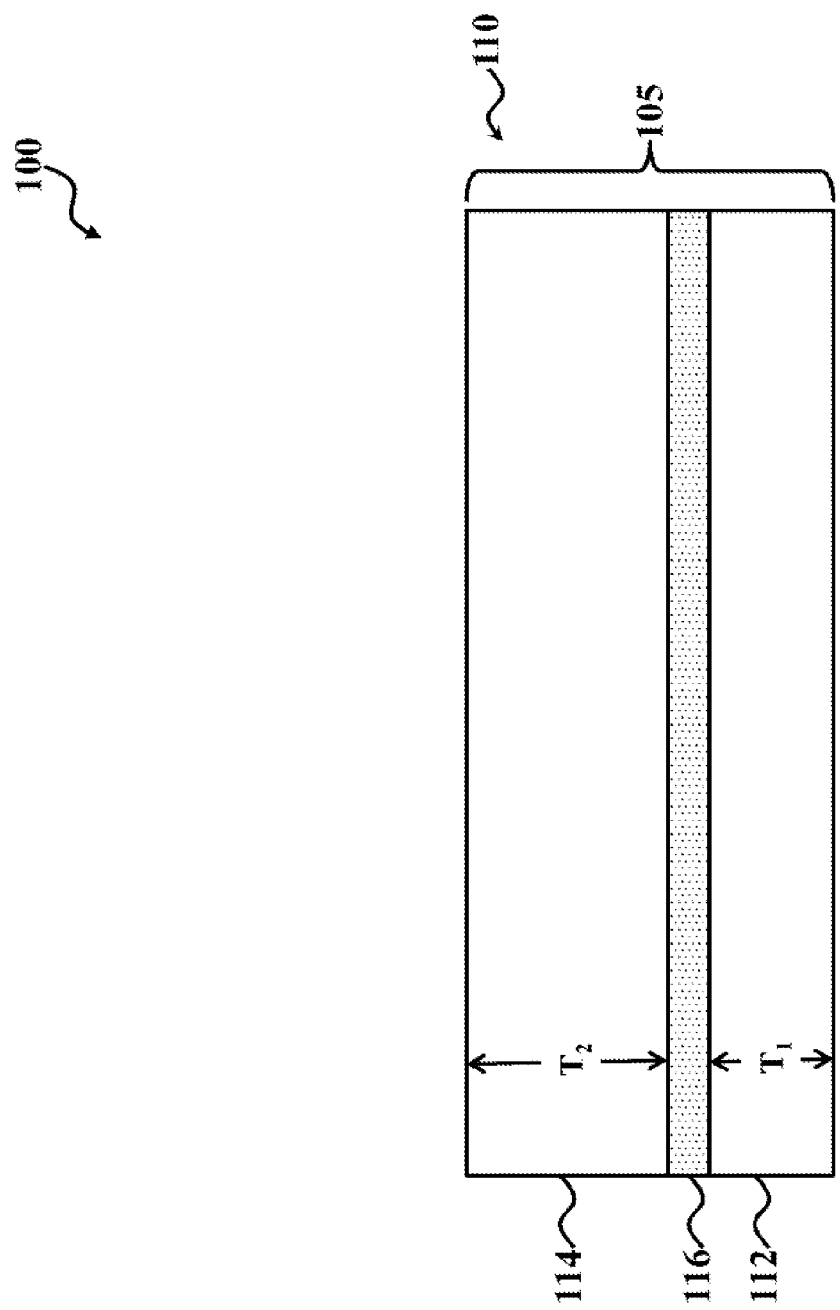
FIGS. 2-15 are diagrammatic cross-sectional views of a MEMS device during various stages of the method of FIG. 1 according to various aspects of the present disclosure.

In FIGS. 2-15, a substrate 105 is processed to form a MEMS device 110. In the depicted embodiment, the MEMS device 110 is a motion sensor (for example, a gyroscope or an accelerometer). Alternatively, the MEMS device is a RF MEMS device (for example, an RF switch, resonator, or filter), a MEMS magnetometer, an optical MEMS device (for example, a MEMS micro-mirror), a MEMS oscillator, a MEMS microphone, and/or any other MEMS type device. One of ordinary skill in the art will recognize that the MEMS device alternatively includes nanoelectromechanical elements, for example, the MEMS device is alternatively a nanoelectromechanical systems (NEMS) device. Referring to FIG. 2, the processing begins with the substrate 105, which includes a semiconductor layer 112 separated from a semiconductor layer 114 by an insulator layer 116. In the depicted embodiment, the semiconductor layer 112 and the semiconductor layer 114 are silicon layers, and the insulator layer 116 is an oxide layer. The substrate 105 is thus a silicon-on-insulator (SOI) substrate. The SOI substrate is fabricated using separation by implantation of oxygen (SIMOX), wafer bonding, and/or other suitable methods. Alternatively, the semiconductor layer 112 and the semiconductor layer 114 include other semiconductor materials, and/or the insulator layer 116 includes insulating materials other than an oxide material. In the present example (FIG. 2), the semiconductor layer 112 has a thickness ($T_1$) of about 10 μm to about 60 μm, and the semiconductor layer 114 has a thickness ($T_2$) of about 500 μm to about 800 μm.

Figure 3:
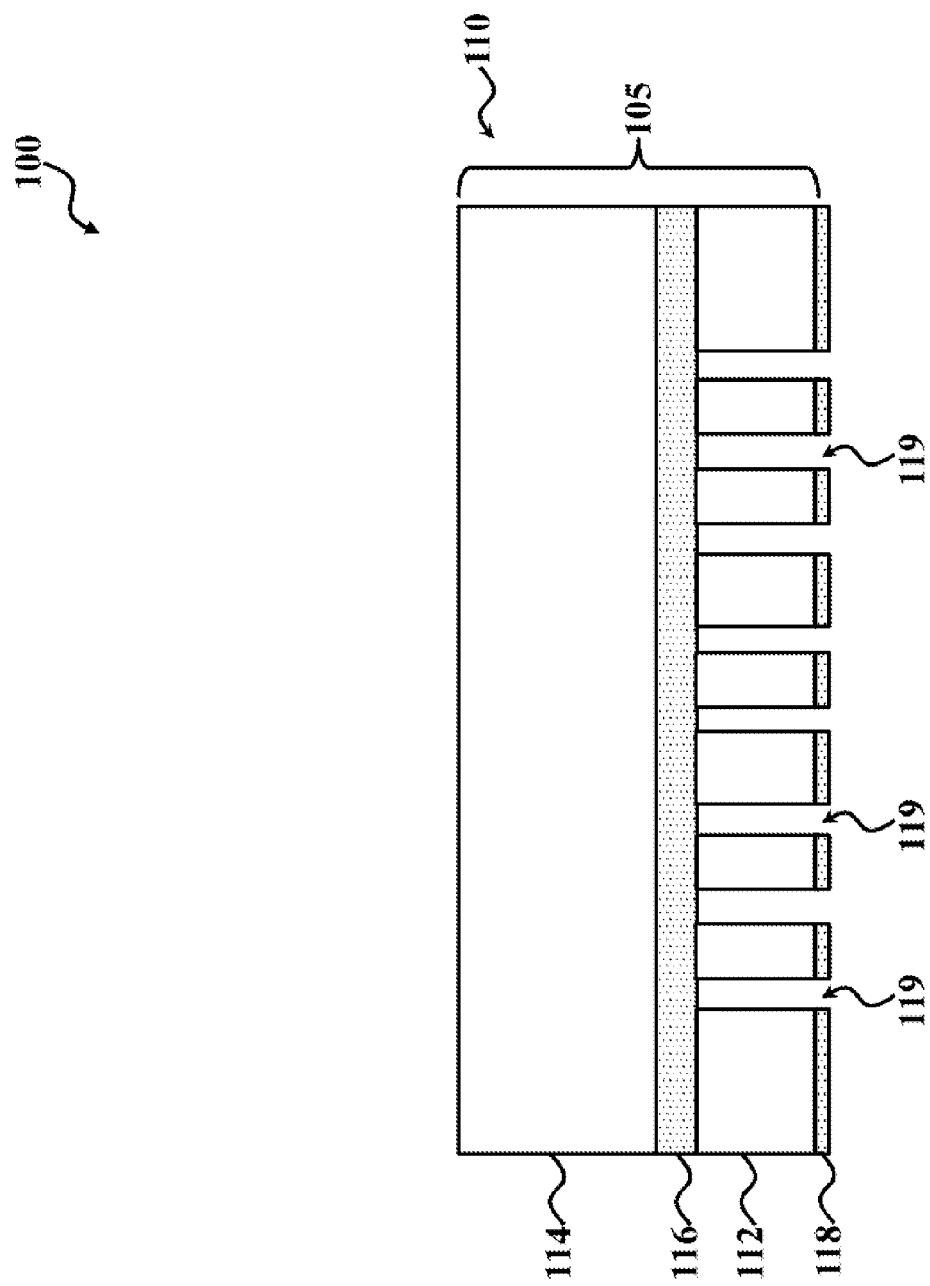

In FIG. 3, the semiconductor layer 112 is processed to form a first structure (or proof mass) layer of the MEMS device 110. For example, a patterned mask layer 118 is formed over the semiconductor layer 112, and the semiconductor layer 112 is etched using the patterned mask layer 118 as a mask, thereby forming gaps 119 (also referred to as openings or trenches) in the semiconductor layer 112. The gaps 119 extend through the thickness of the semiconductor layer 112. In the depicted embodiment, the patterned mask layer 118 is a dielectric layer, such as an oxide-containing layer (for example, a silicon oxide layer). The patterned mask layer 118 is formed using various deposition processes, lithography patterning processes, etching processes, other suitable processes, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process implements nanoimprint technology. The etching processes include dry etching, wet etching, other etching methods, or combinations thereof.

Figure 4:
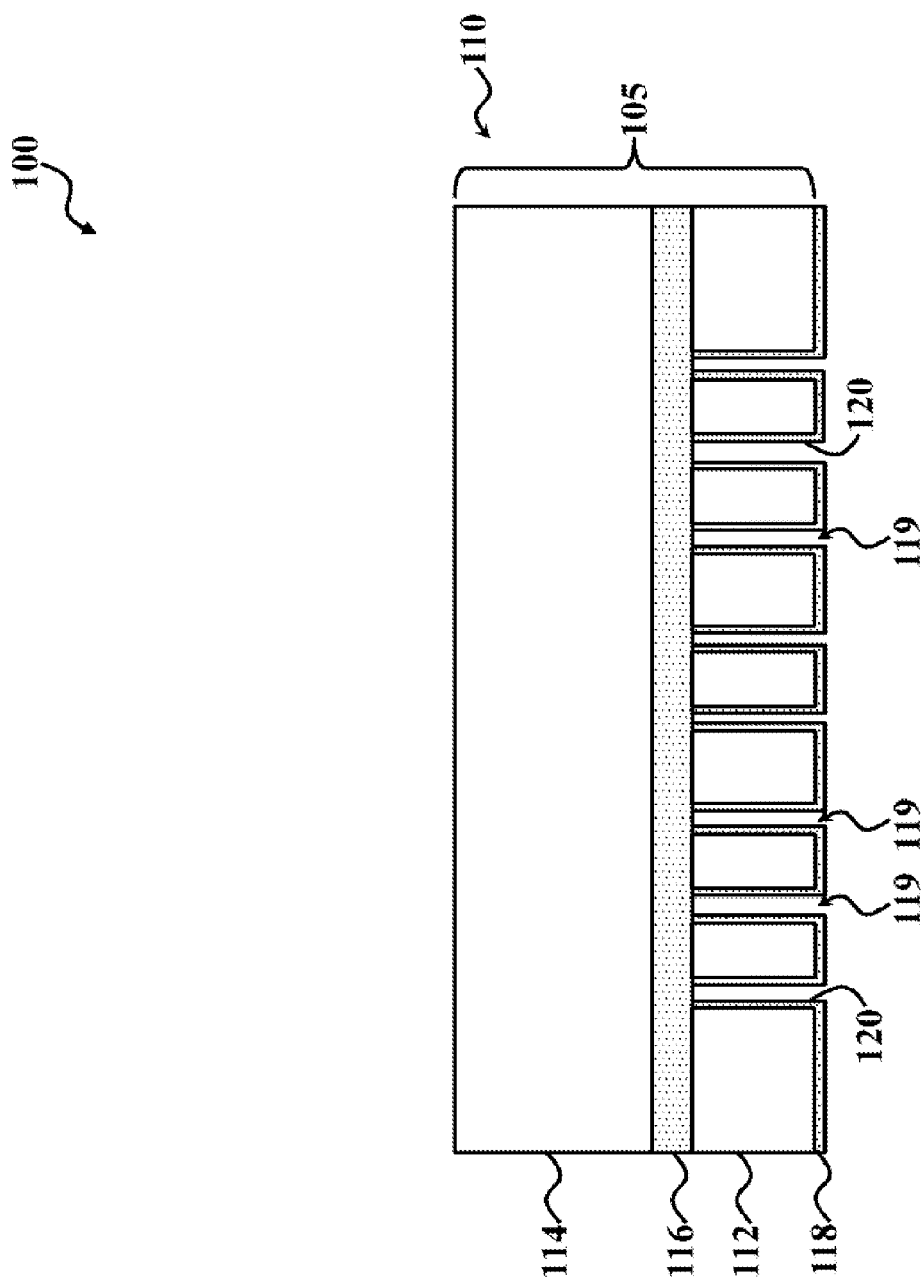
Figure 5:
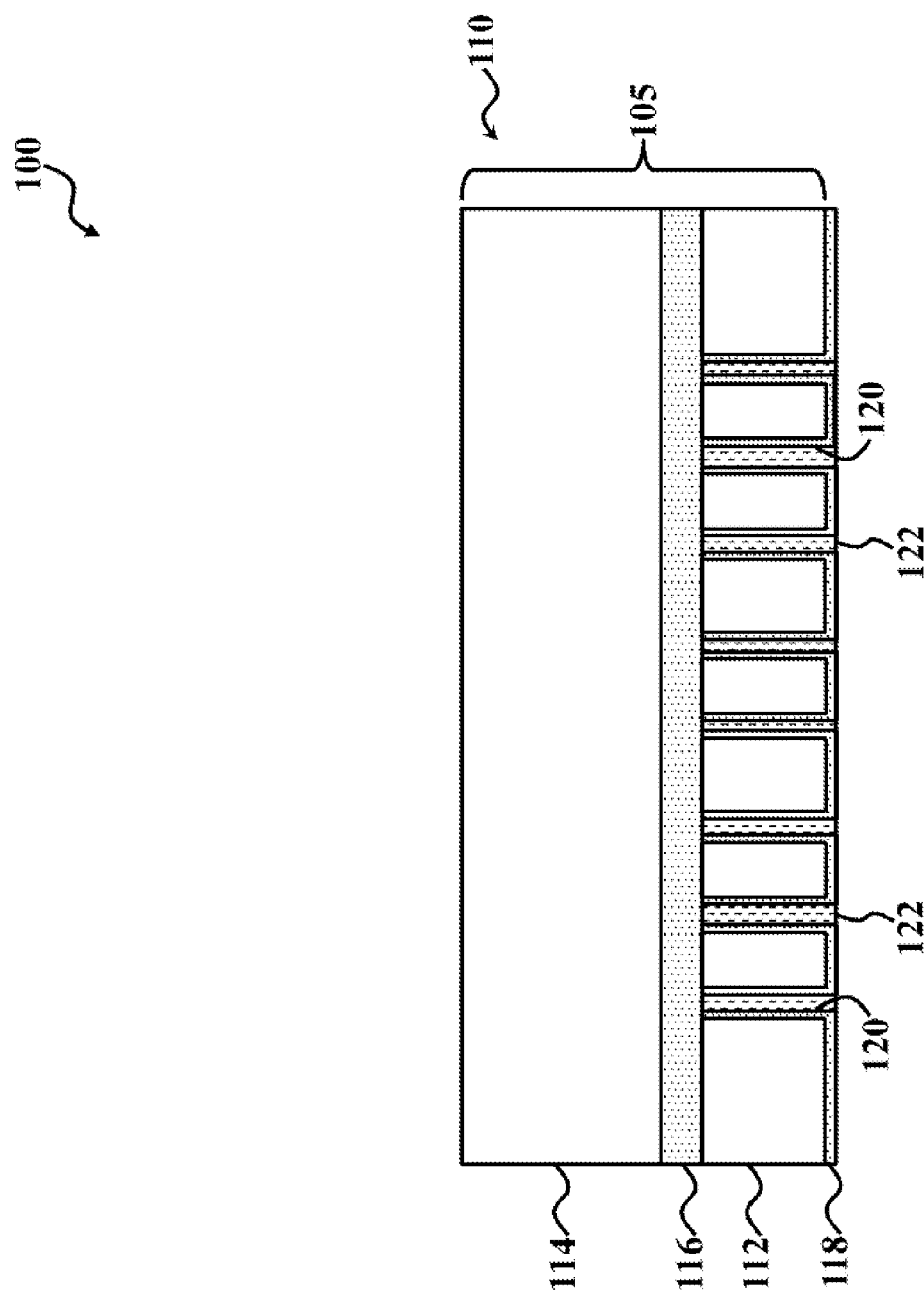
Figure 6:
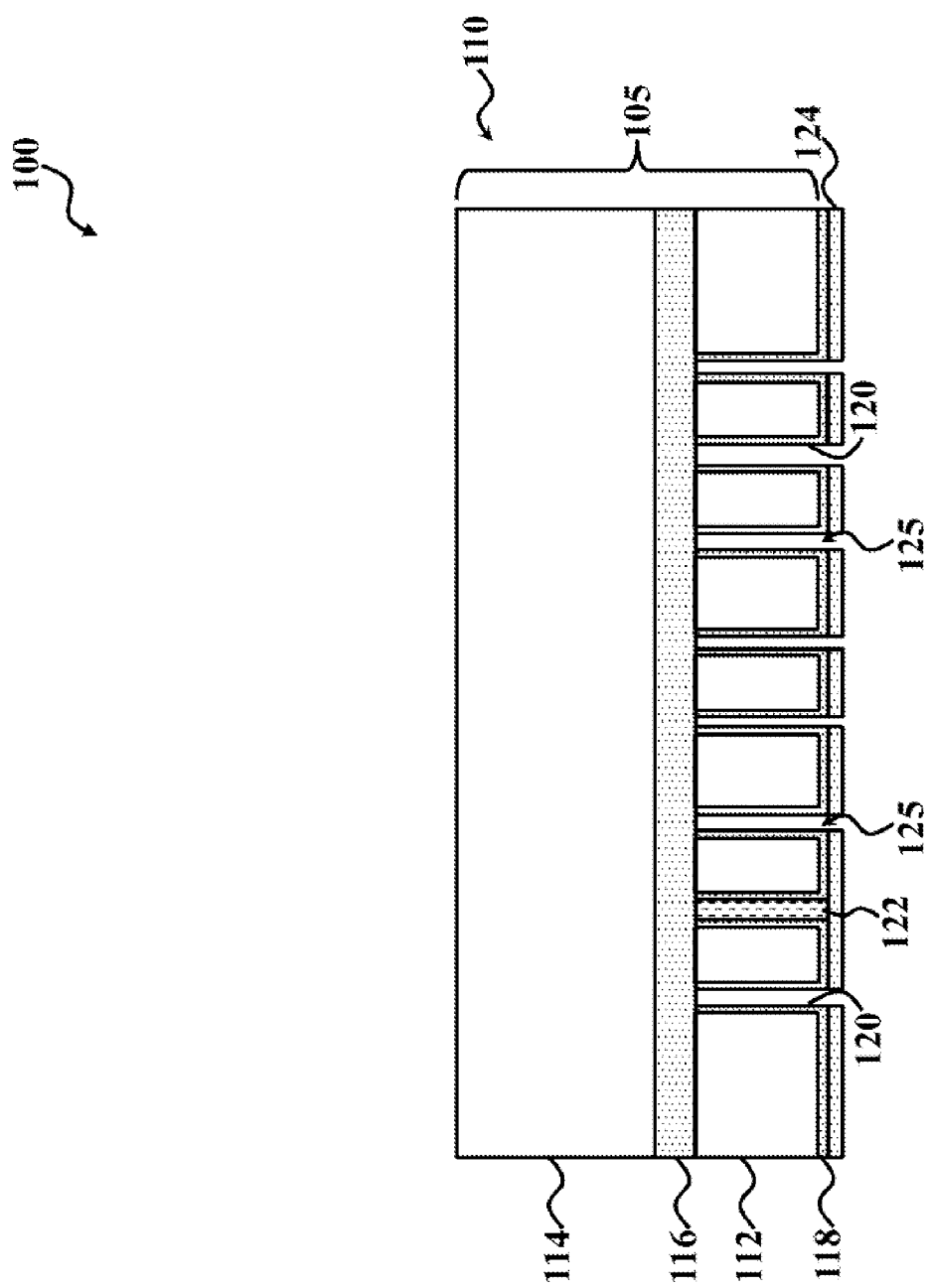

In FIGS. 4-6, the substrate 105 is processed to provide small sensing gaps for the MEMS device 110 by reducing a width of the gaps 119. Alternatively, where the MEMS device 110 does not necessitate small sensing gaps, the processing of the substrate 105 in FIGS. 4-6 can be omitted from the following process, such that processing of the substrate 105 proceeds to that described with reference to FIG. 7. In FIG. 4, a dielectric layer 120 is formed along sidewalls of the semiconductor layer 112, particularly along the sidewalls of the semiconductor layer 112 that define gaps 119 in the semiconductor layer 112. In the depicted embodiment, an oxidation process is performed to form an oxide layer along the sidewalls (which can be referred to as oxide sidewalls). In an example, the oxidation process converts a portion of the silicon layer (the semiconductor layer 112) into silicon oxide, such that the dielectric layer 120 is a silicon oxide layer. In an example, the dielectric layer 120 has a thickness along the sidewalls of about 50 nm to about 1 μm. The oxide sidewalls facilitate the small sensing gaps, thereby providing enhanced sensing for in-plane movement of the MEMS device 110.

In FIG. 5, conductive structures 122 are formed in the gaps 119. In the depicted embodiment, the conductive structures 122 are polysilicon structures. In an example, the polysilicon structures are doped. The conductive structures 122 are formed by depositing a conductive layer over the patterned mask layer 118 to fill the gaps 119, and performing an etch back process, a chemical mechanical polishing (CMP) process, or a combination thereof on the conductive layer until the patterned mask layer 118 is reached, such that the patterned dielectric layer 118 acts as an etch stop layer. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition methods, or combinations thereof.

In FIG. 6, processing continues by removing conductive structures 122 based on design requirements of the MEMS device 100. For example, a patterned mask layer 124 is formed over the patterned mask layer 118, thereby exposing at least one conductive structure 122, and the exposed conductive structures 122 are removed by an etching process. The removed conductive structures 122 form gaps 125 that extend through the semiconductor layer 112. In the depicted embodiment, the patterned mask layer 124 is a dielectric layer, such as an oxide-containing layer (for example, a silicon oxide layer). In furtherance of the depicted embodiment, where the conductive structures 122 are polysilicon structures, the etching process selectively etches the exposed polysilicon structures. The patterned mask layer 124 is formed using various deposition processes, lithography patterning processes, etching processes, other suitable processes, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process implements nanoimprint technology. The etching processes include dry etching, wet etching, other etching methods, or combinations thereof.

Figure 7:
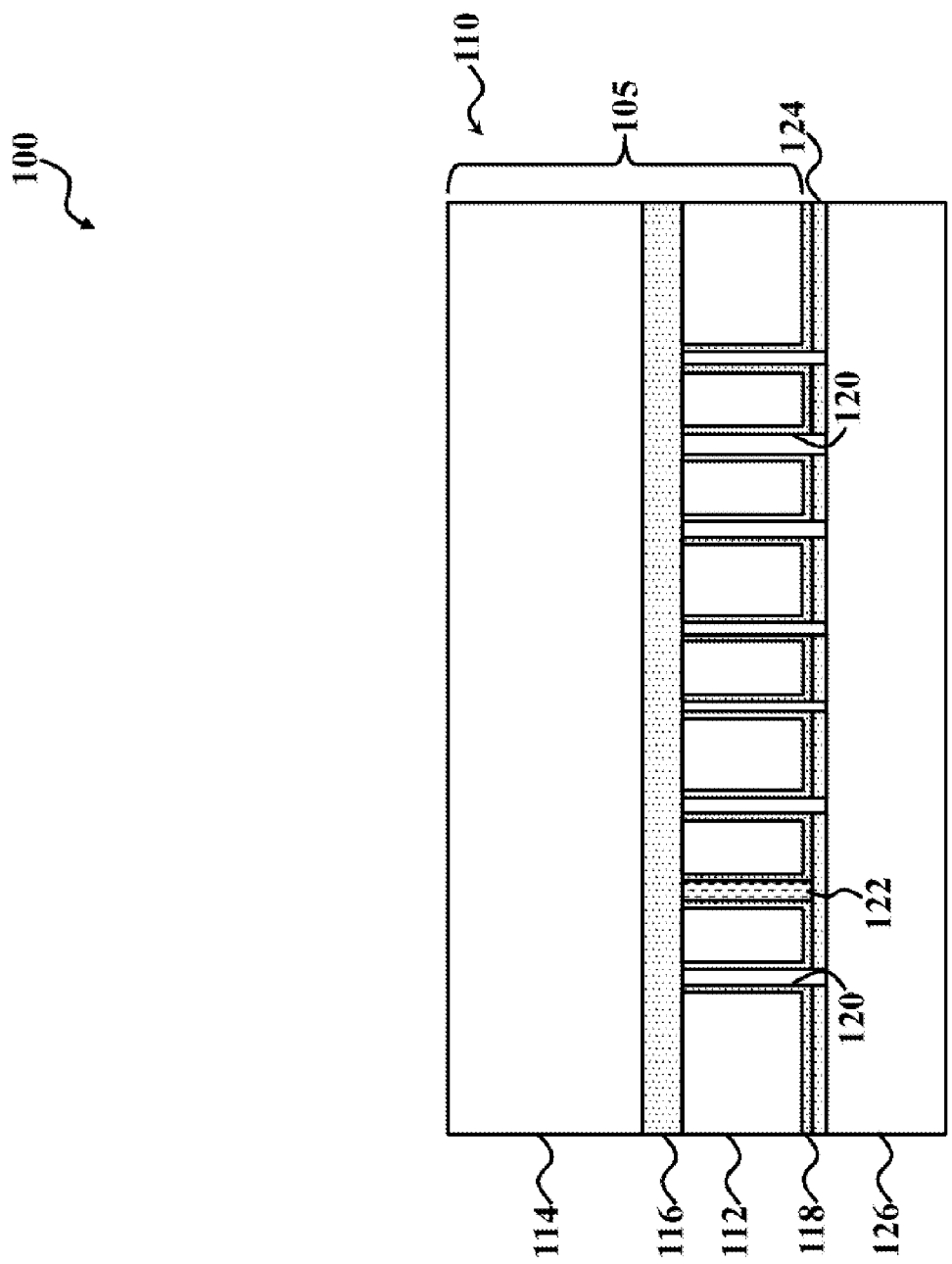

In FIG. 7, the substrate 105 is bonded to a substrate 126. In the depicted embodiment, the substrate 126 is a silicon substrate. Alternatively, the substrate 126 is another type of semiconductor substrate or other suitable substrate. In the present example, the patterned mask layer 124 effects a fixed coupling of the substrates 105 and 126 (particularly, coupling of the substrate 126 and the first structure layer of the MEMS device 110). More specifically, the patterned mask layer 124 effects a fusion bond between substrates 105 and 126. The fusion bonding results from bringing the substrates 105 and 126 into intimate contact, such that the substrates 105 and 126 hold together due to atomic attraction forces (Van der Waal forces). In the depicted embodiment, since the patterned mask layer 124 includes silicon oxide ($SiO_2$), the fusion bond arises from $SiO_2$/Si bonding (for example, contact between the $SiO_2$ patterned masking layer 124 and the Si substrates 105 and 126). Other types and/or methods for bonding the substrate 105 to the substrate 126 are contemplated by the present disclosure.

Figure 8:
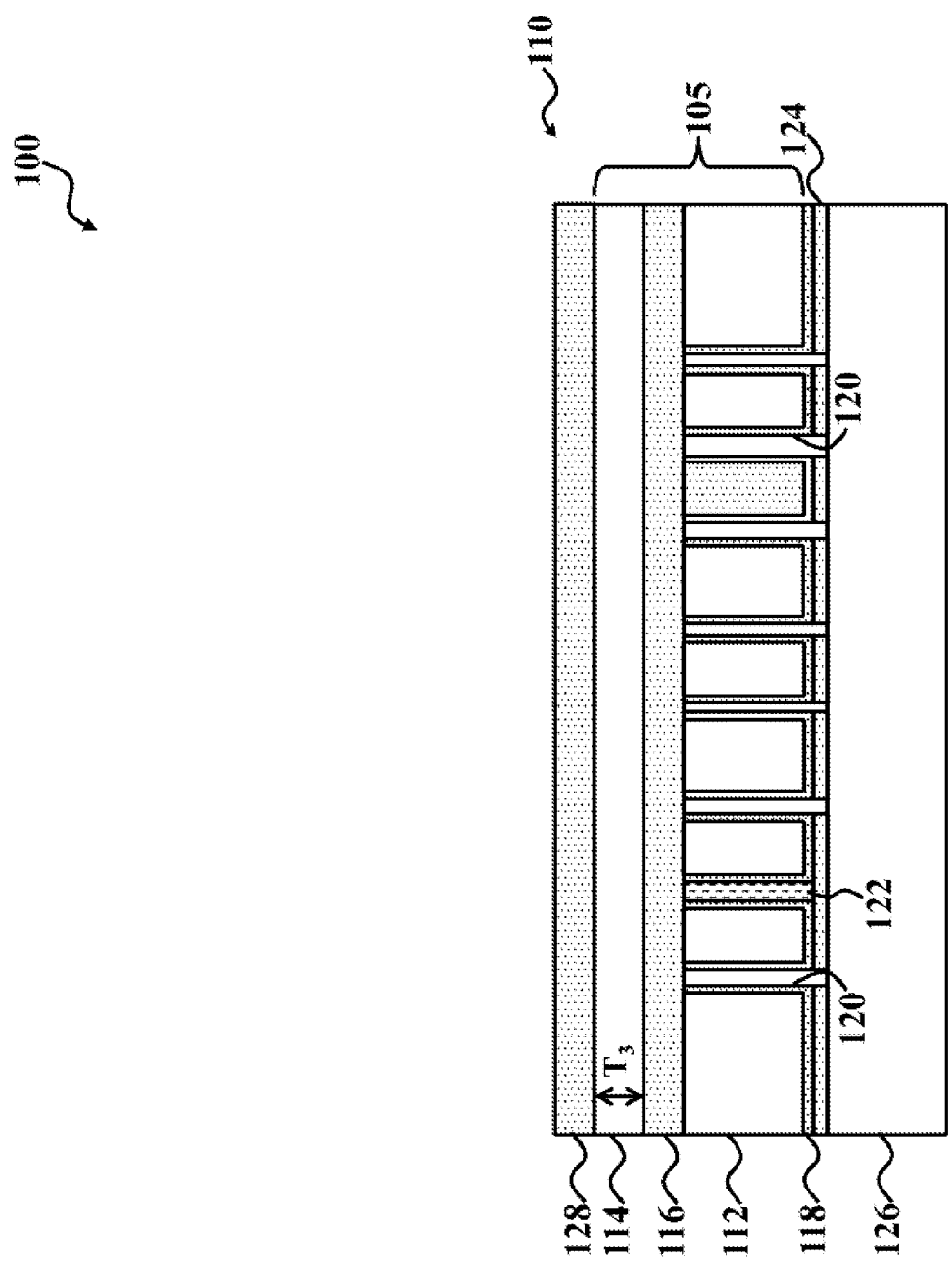

In FIGS. 8-14, the semiconductor layer 114 is processed to form a second structure layer (or back plate) of the MEMS device 110. In FIG. 8, a thinning process is performed to reduce the thickness of the semiconductor layer 114. In the present example, after the thinning process, the semiconductor layer 114 has a thickness ($T_3$) of about 0.5 μm to about 20 μm. The thinning process is an etch back process, chemical mechanical polishing process, other thinning process, or combinations thereof. After the thinning process, a mask layer 128 is formed over the semiconductor layer 114. In the depicted embodiment, the mask layer 128 is a dielectric layer, such as an oxide-containing layer (for example, a silicon oxide layer).

Figure 9:
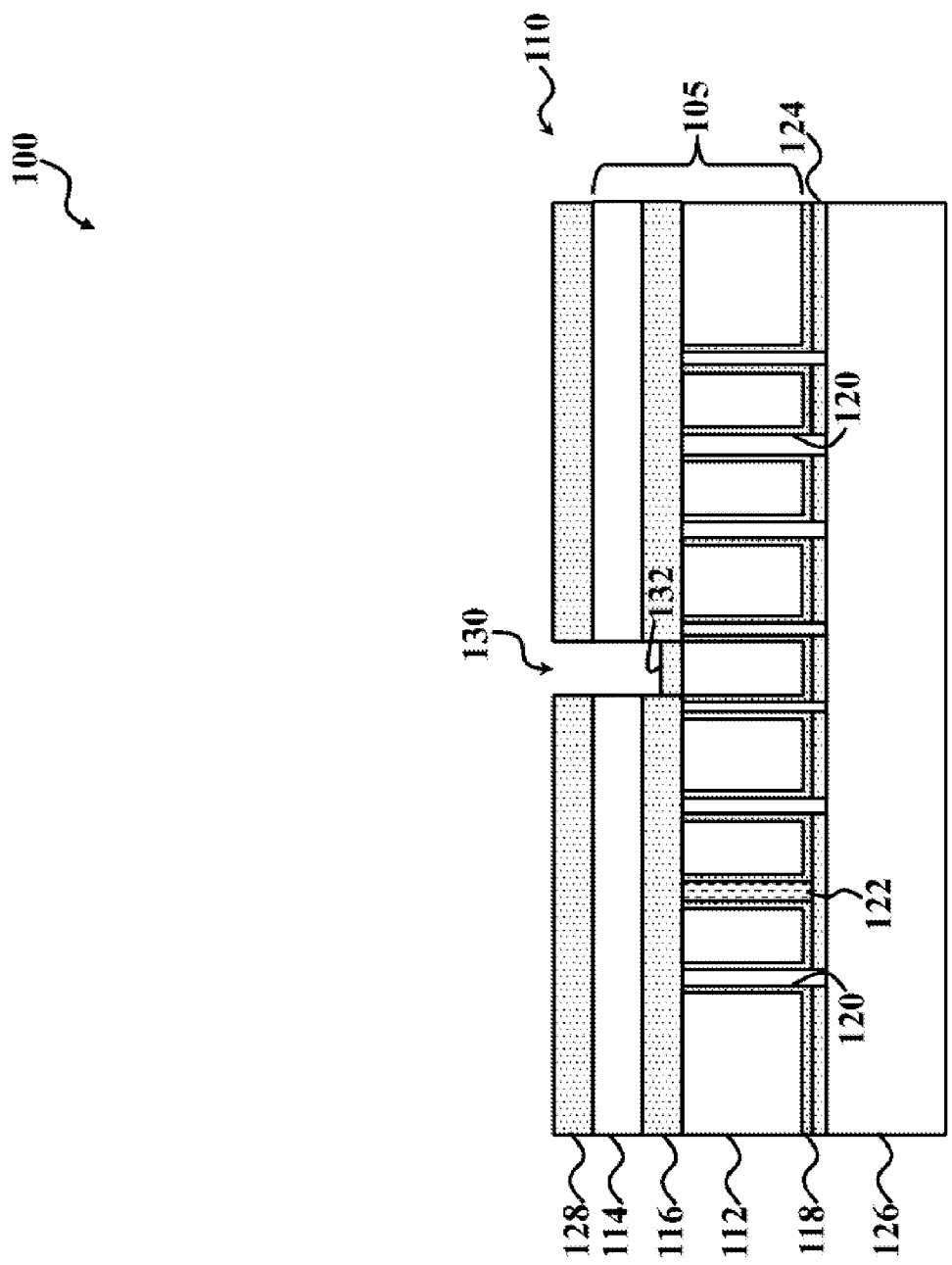

The mask layer 128 is patterned depending on design requirements of the MEMS device 110. For example, where the MEMS device necessitates small sensing gaps, processing continues with reference to FIG. 9. Alternatively, where the MEMS device 110 does not necessitate small sensing gaps, the processing of the substrate 105 in FIG. 9 can be omitted from the following process, such that processing of the substrate 105 proceeds to that described with reference to FIG. 10. In FIG. 9, portions of the mask layer 128, the semiconductor layer 114, and the insulator layer 116 are removed to define a sensing gap 130. The openings of the patterned mask layer 128, patterned semiconductor layer 114, and patterned insulator layer 116 combine to form the sensing gap 130, and keep the dielectric layer 132 remaining above the semiconductor layer 112 thin. A dielectric layer 132 above the semiconductor layer 112 is to define a thickness of the sensing gap 130. In the depicted embodiment, the dielectric layer 132 is an oxide-containing layer, such as a silicon oxide layer. In an example, the sensing gap 130 has a thickness of about 50 nm to about 1 μm. The sensing gap 130 provides enhanced sensing for out-of-plane movement of the MEMS device 110.

Figure 10:
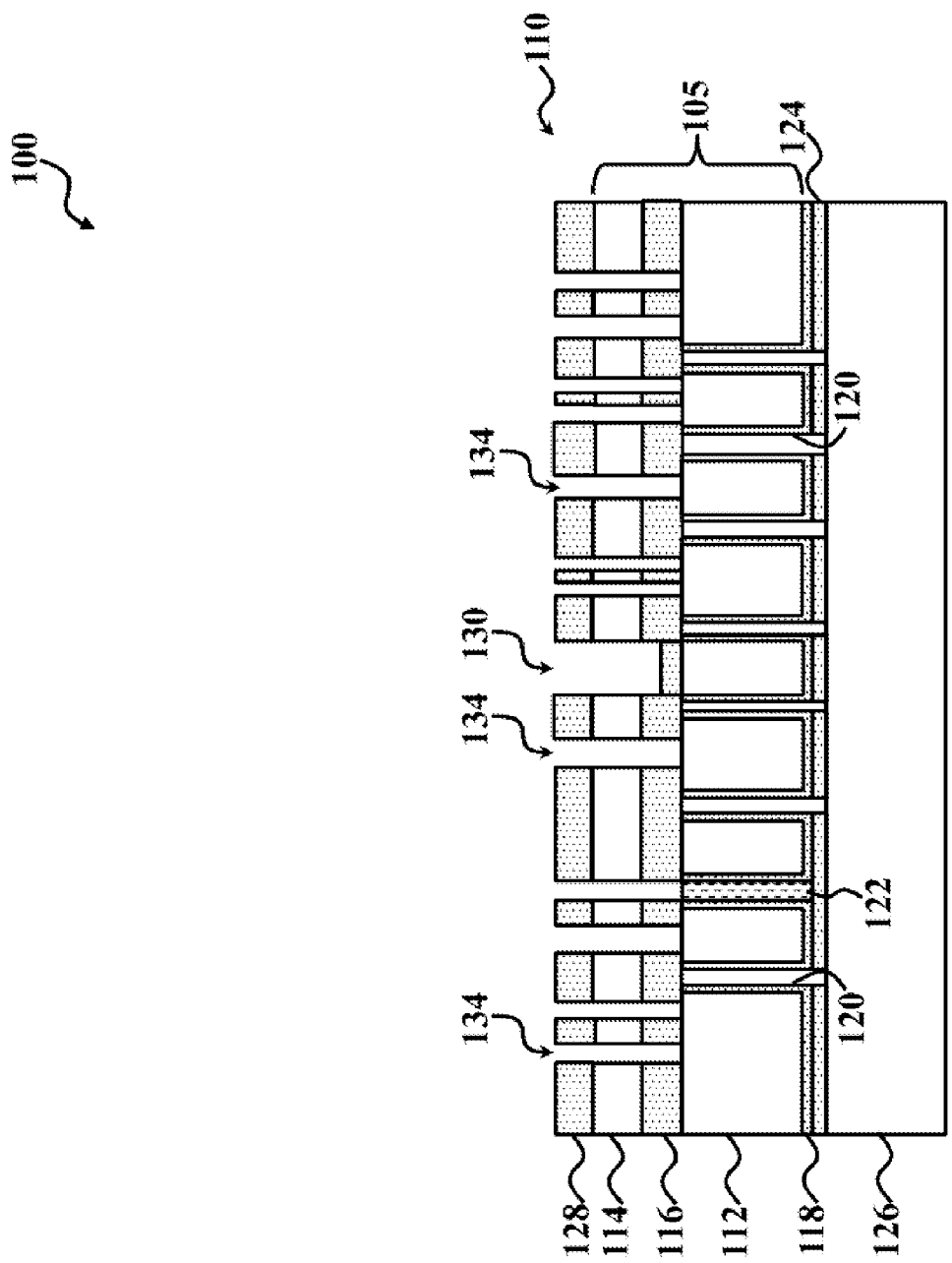

In FIG. 10, portions of the mask layer 128, the semiconductor layer 114, and the insulator layer 116 are removed to define via openings 134. The openings of the patterned mask layer 128, patterned semiconductor layer 114, and patterned insulator layer 116 combine to form the via openings 134, which expose the semiconductor layer 112.

Figure 11:
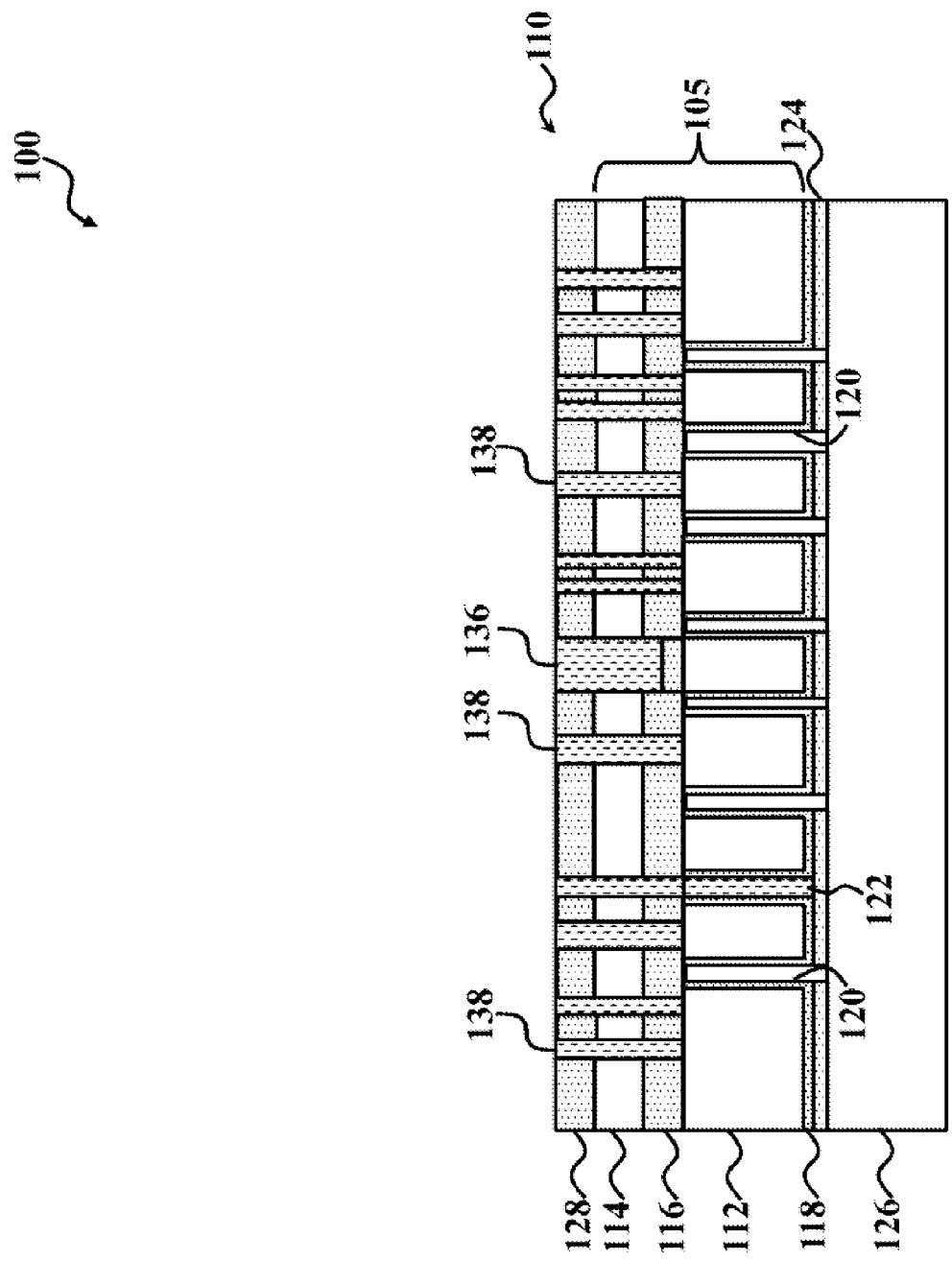

In FIG. 11, a conductive structure 136 is formed in the sensing gap 130, and conductive structures 138 are formed in the via openings 134. In the depicted embodiment, the conductive structures 136 and 138 are polysilicon structures. In an example, the polysilicon structures are doped. The conductive structures 136 and 138 are formed by depositing a conductive layer over the patterned mask layer 128 to fill the sensing gap 130 and via openings 134, and then performing an etch back process, a chemical mechanical polishing (CMP) process, or a combination thereof on the conductive layer until the patterned mask layer 128 is reached, such that the patterned mask layer 128 acts as an etch stop layer. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition methods, or combinations thereof.

Figure 12:
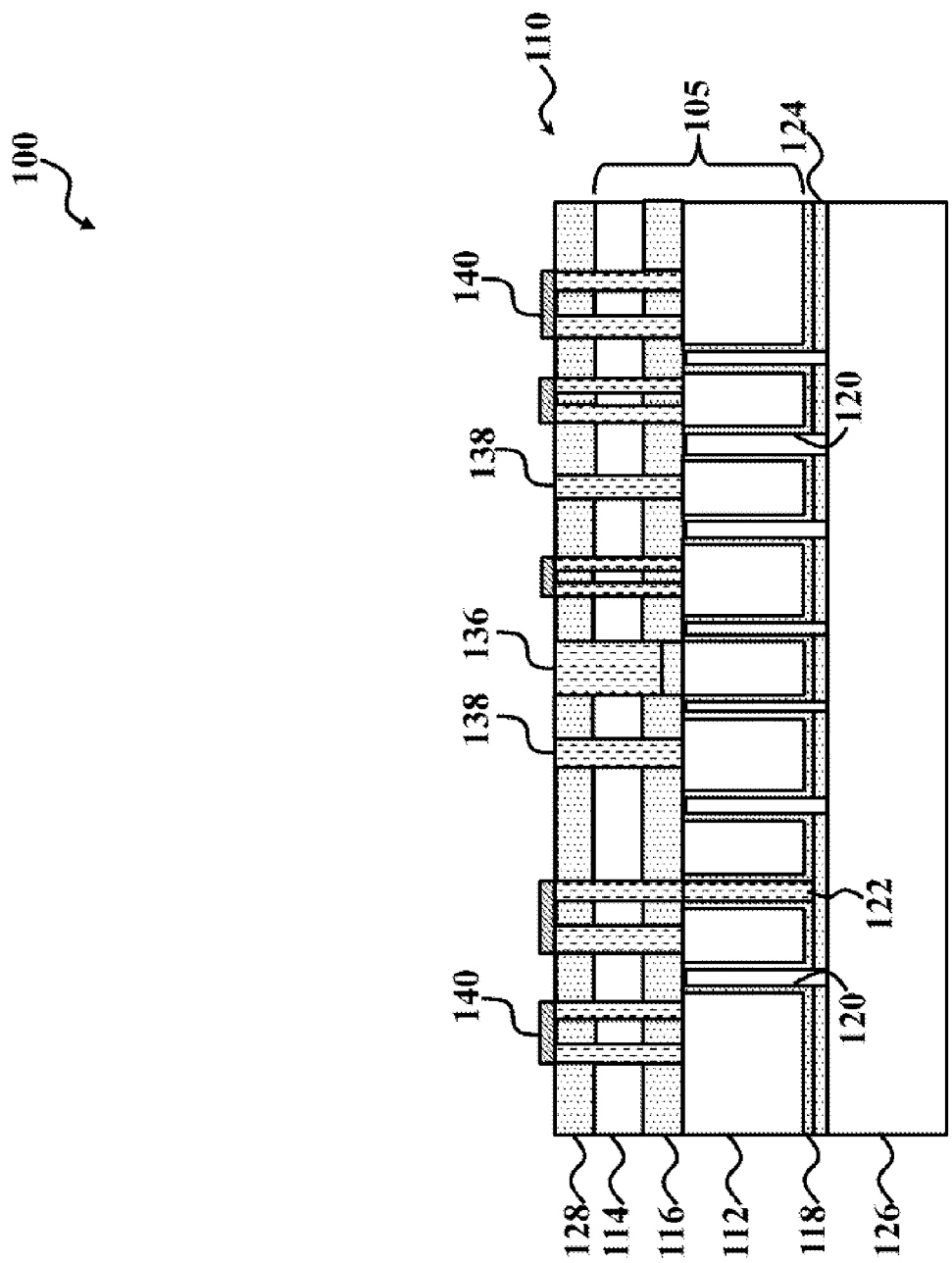

In FIG. 12, bonding features 140 are formed over portions of the conductive structures 138 and patterned mask layer 128. In the present example, the bonding features 140 are a single bonding layer. The bonding layer includes a conductive material, such as a metal material or a semiconductor material. In the depicted embodiment, the bonding layer includes a metal material, such as AlCu. The bonding features 140 are formed by depositing a conductive layer over the patterned mask layer 128, conductive structure 136, and conductive structures 138 and then patterning the conductive layer depending on design requirements of the MEMS device 110. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition methods, or combinations thereof. The conductive layer is patterned using lithography patterning processes, etching processes, other suitable processes, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process implements nanoimprint technology. The etching processes include dry etching, wet etching, other etching methods, or combinations thereof.

Figure 13:
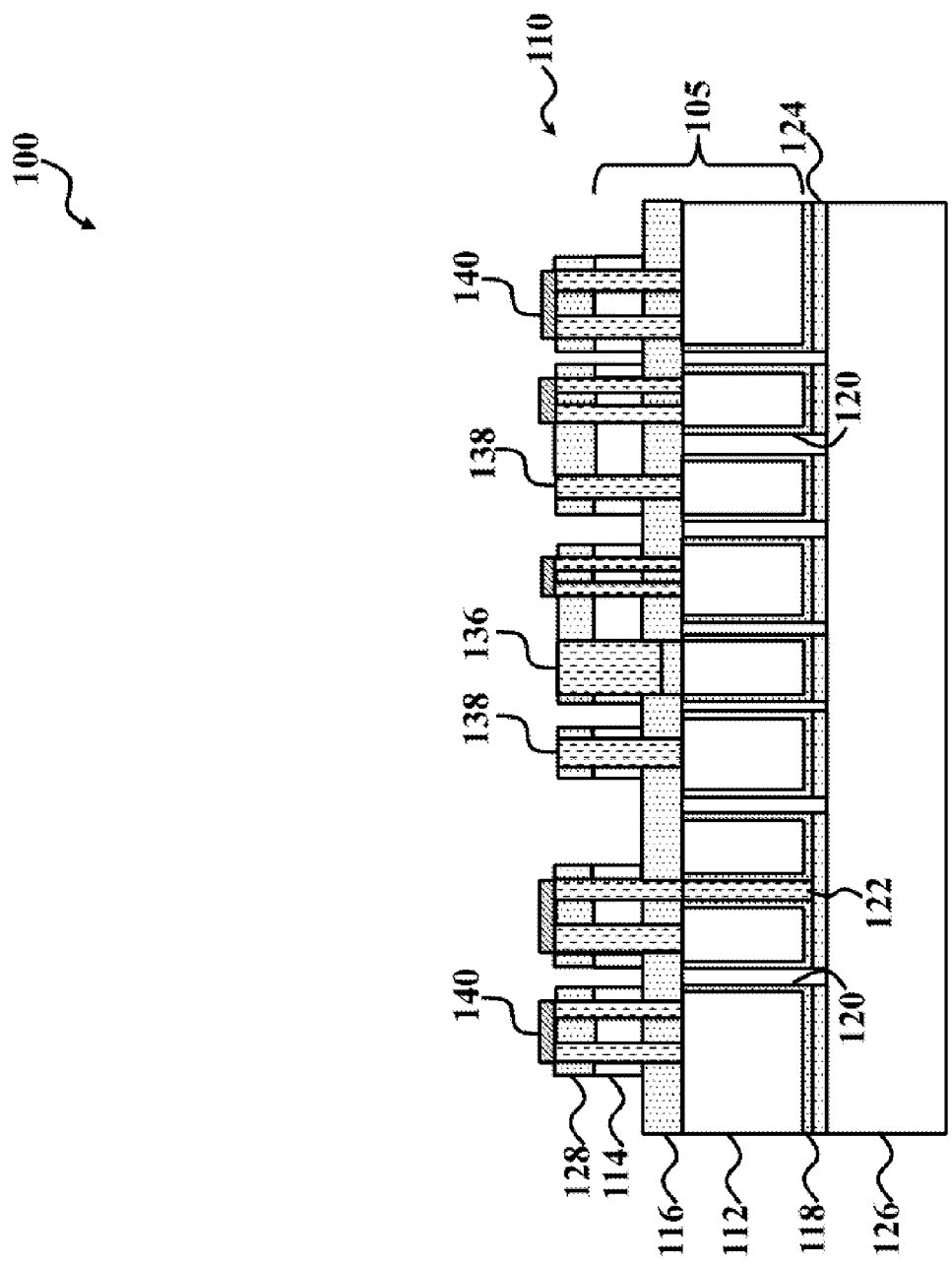
Figure 14:
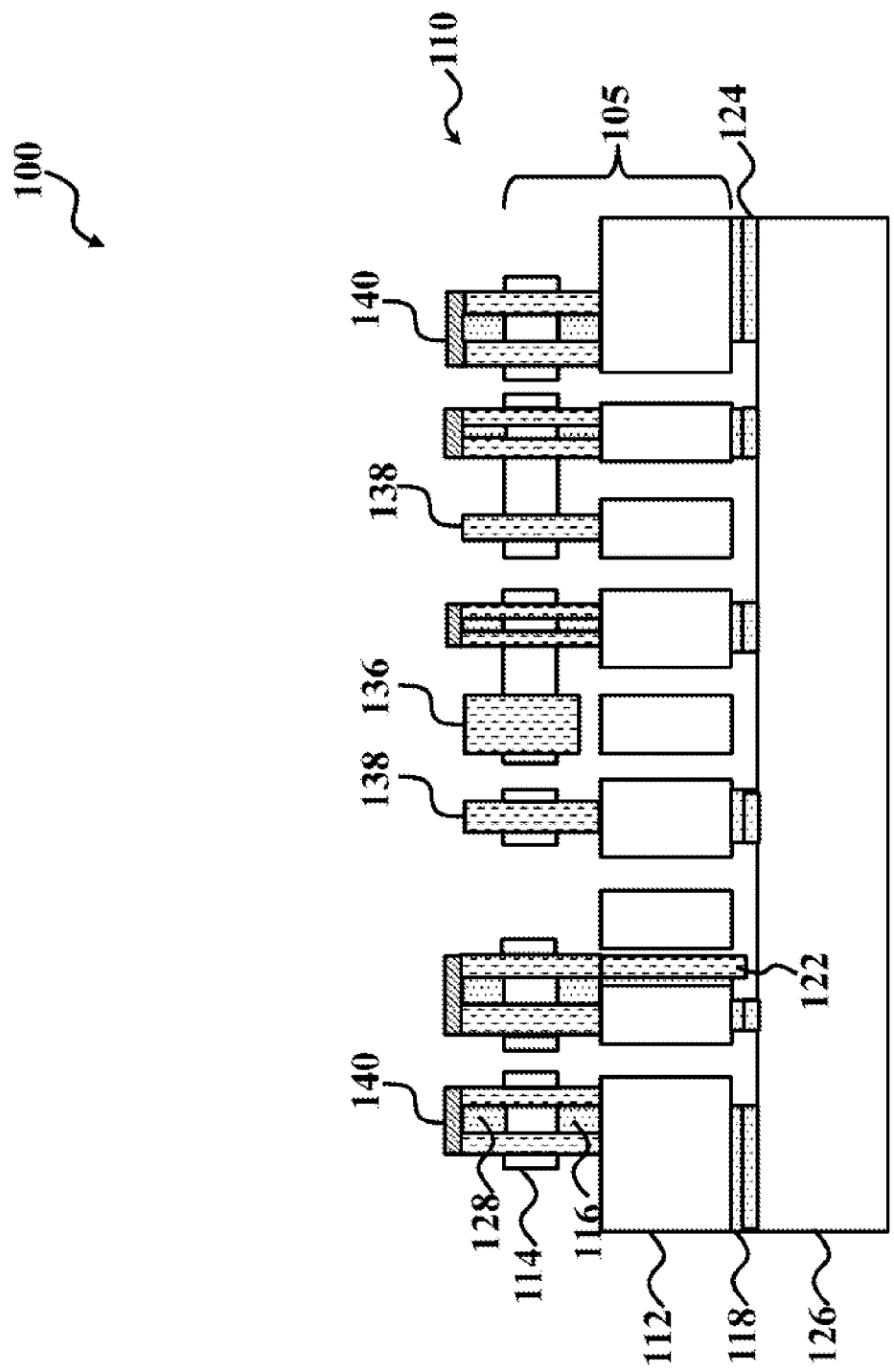

In FIG. 13, the mask layer 128 and the semiconductor layer 114 are further patterned using the processes described herein to define the second structure layer (or back plate) of the MEMS device 110. In FIG. 14, a process is performed to remove portions of the mask layer 128, the insulator layer 116, the dielectric layer 120, the mask layer 124, and the mask layer 118. In the depicted embodiment, where the mask layer 128, insulator layer 116, dielectric layer 120, mask layer 124, and mask layer 118 are oxide-containing layers, a sacrificial oxide release process is performed to remove desired portions of such layers, thereby completing fabrication of the MEMS device 110. In an example, the sacrificial oxide release process is a vapor process, such as a vapor HF process.

Figure 15:
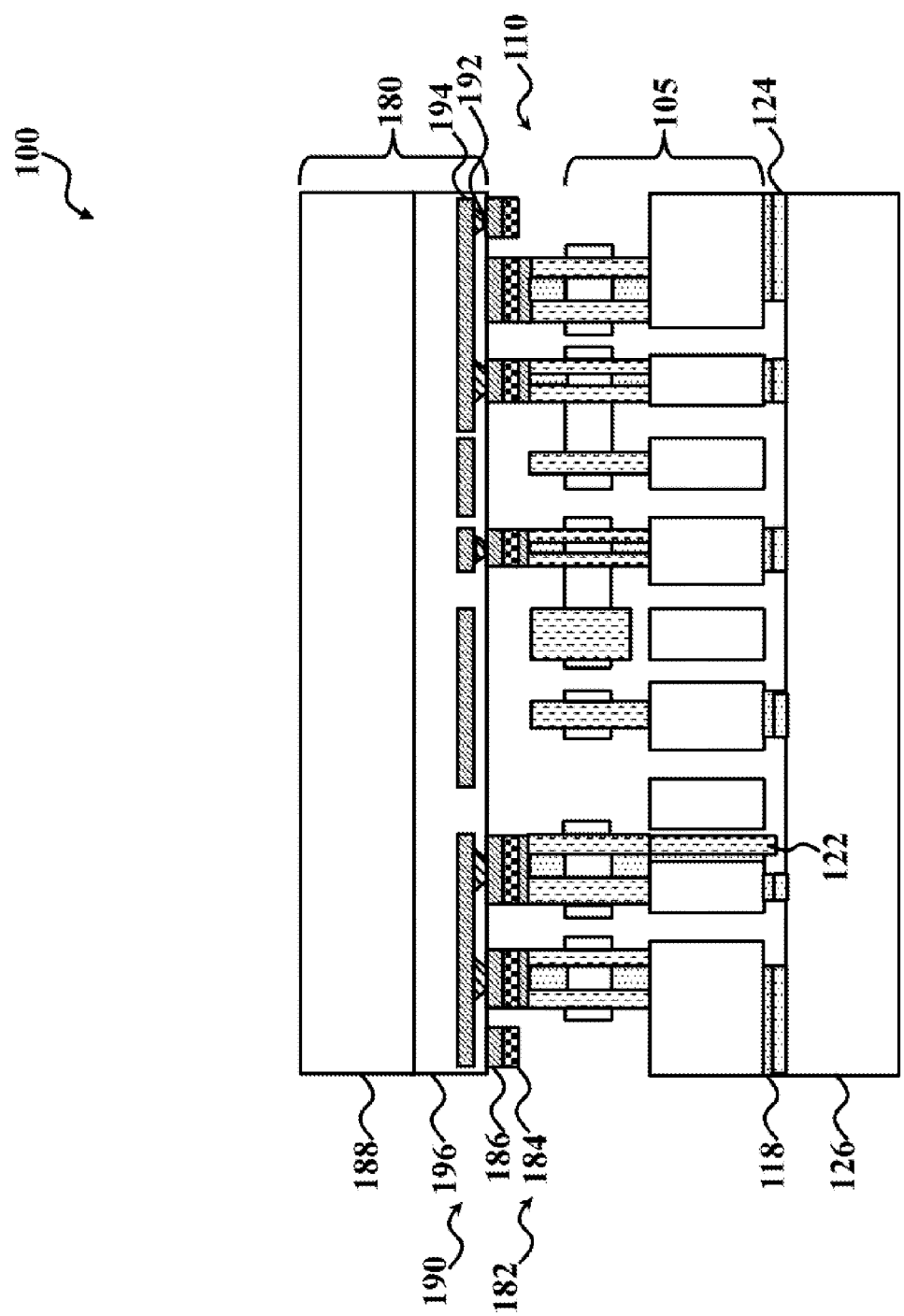
Figure 16:
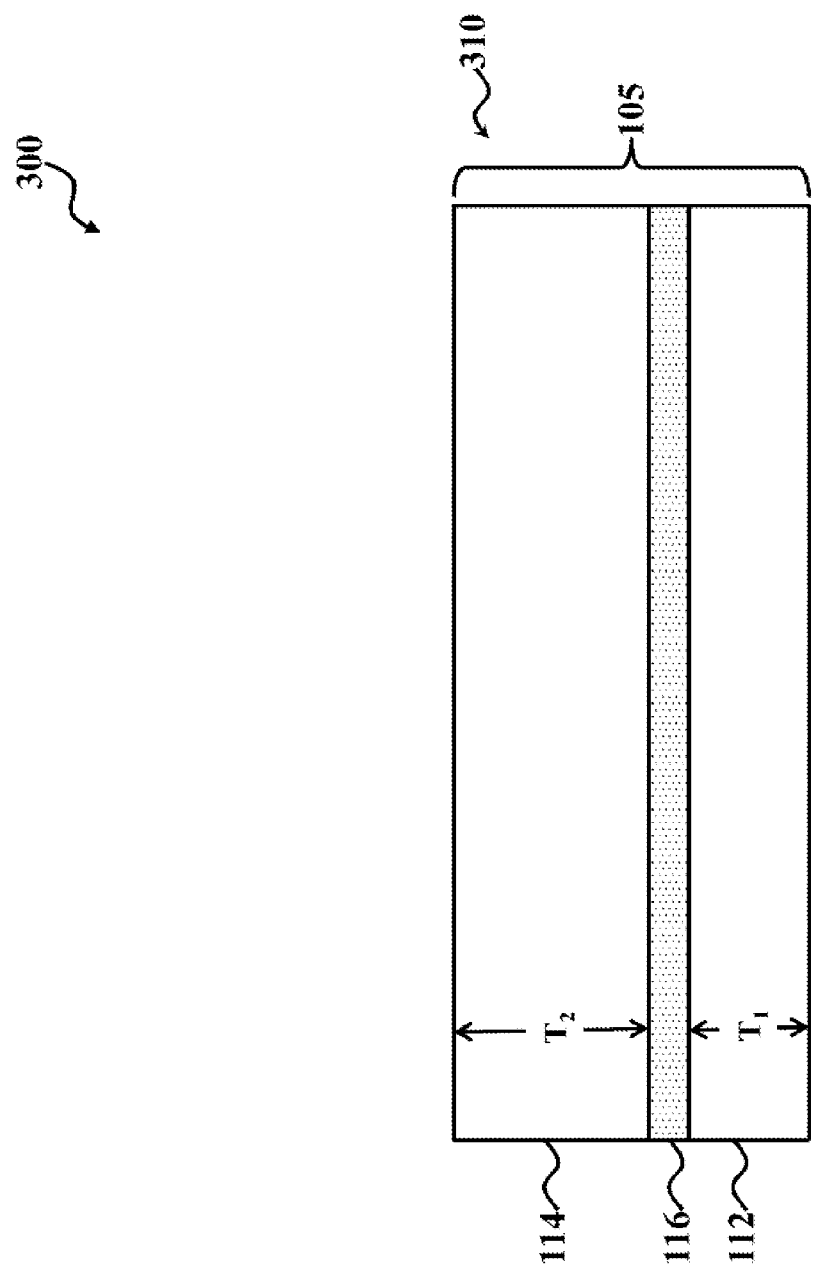
FIGS. 16-29 are diagrammatic cross-sectional views of another device, in portion or entirety, at various stages of fabrication according to the method of FIG. 1, according to various aspects of the present disclosure.
Figure 17:
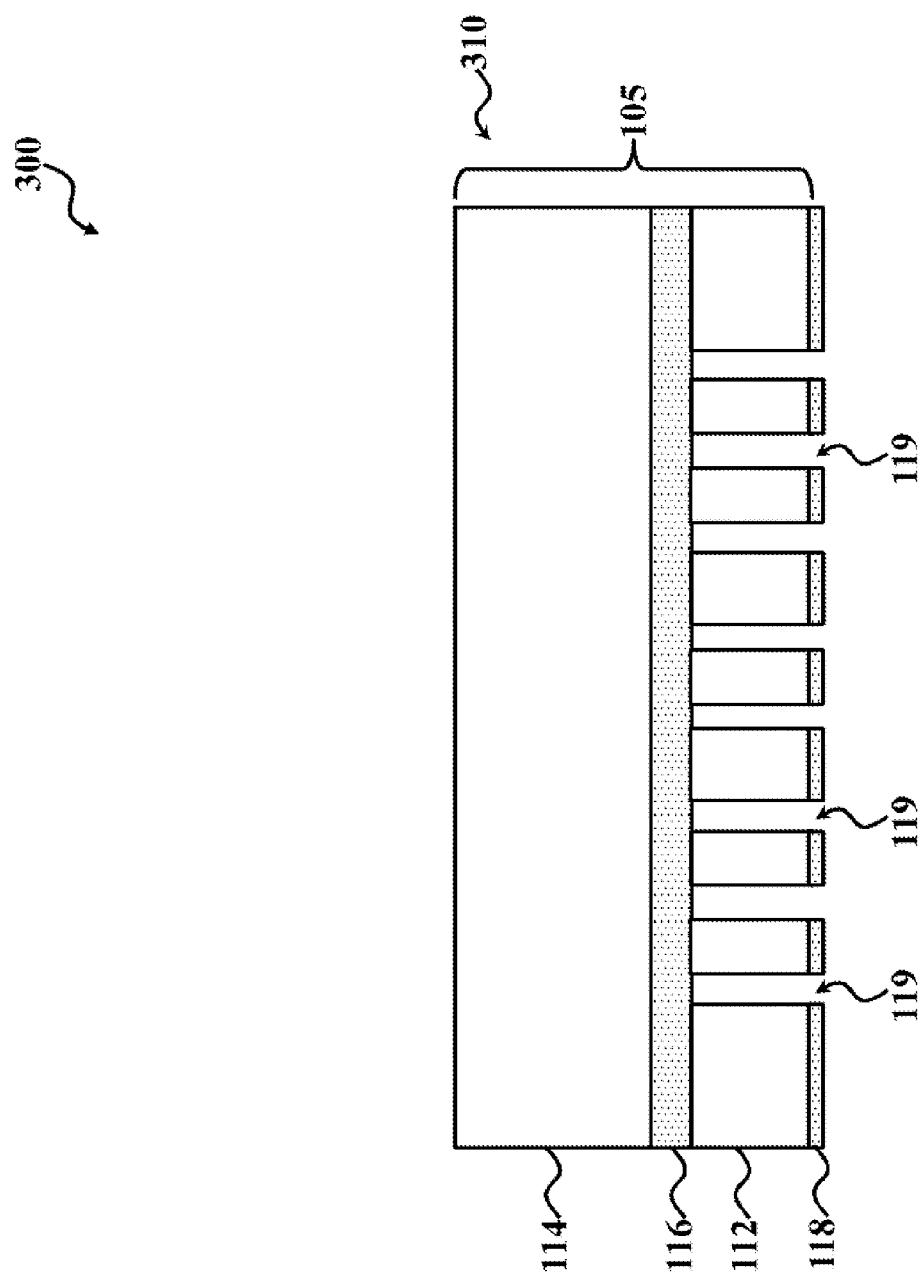
Figure 18:
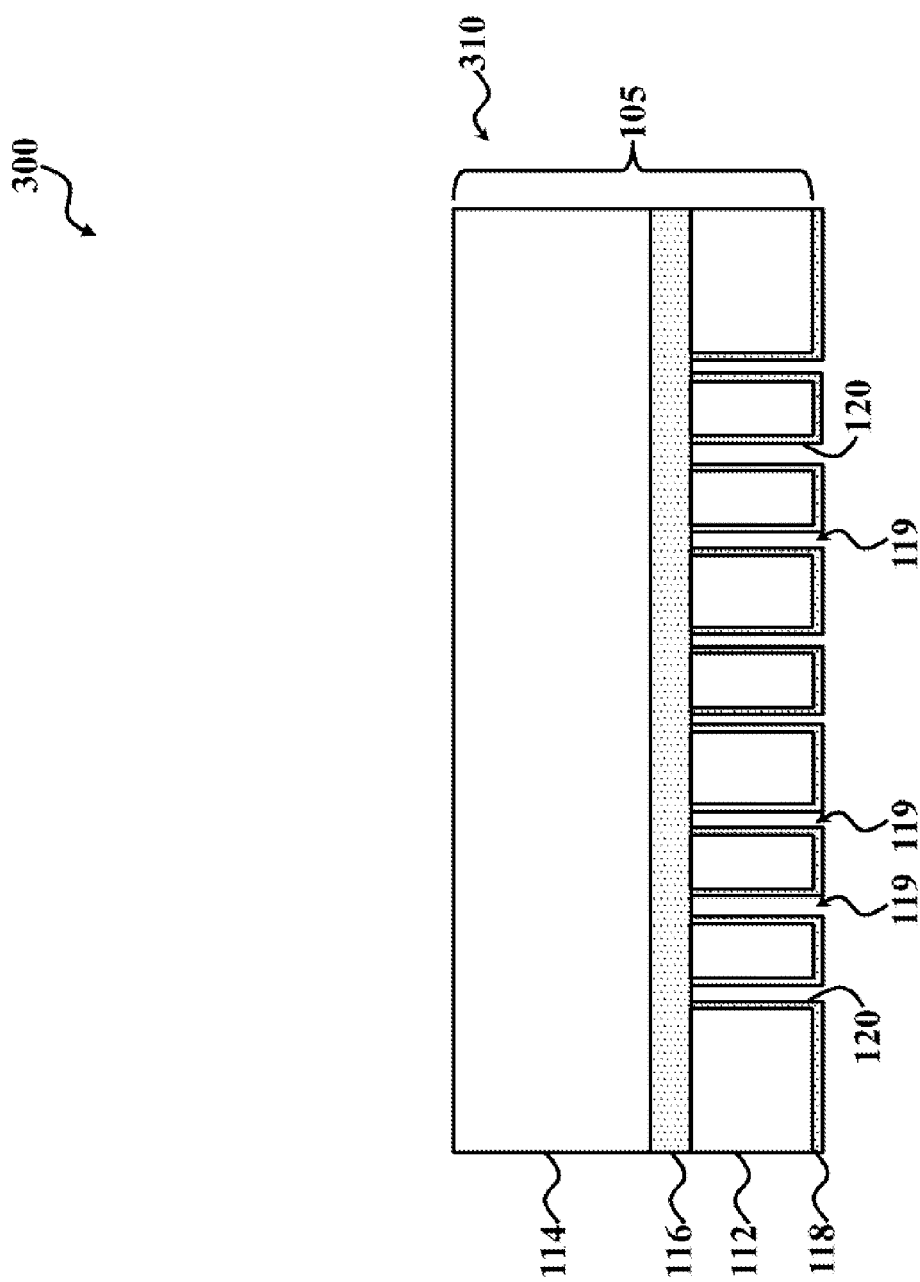
Figure 19:
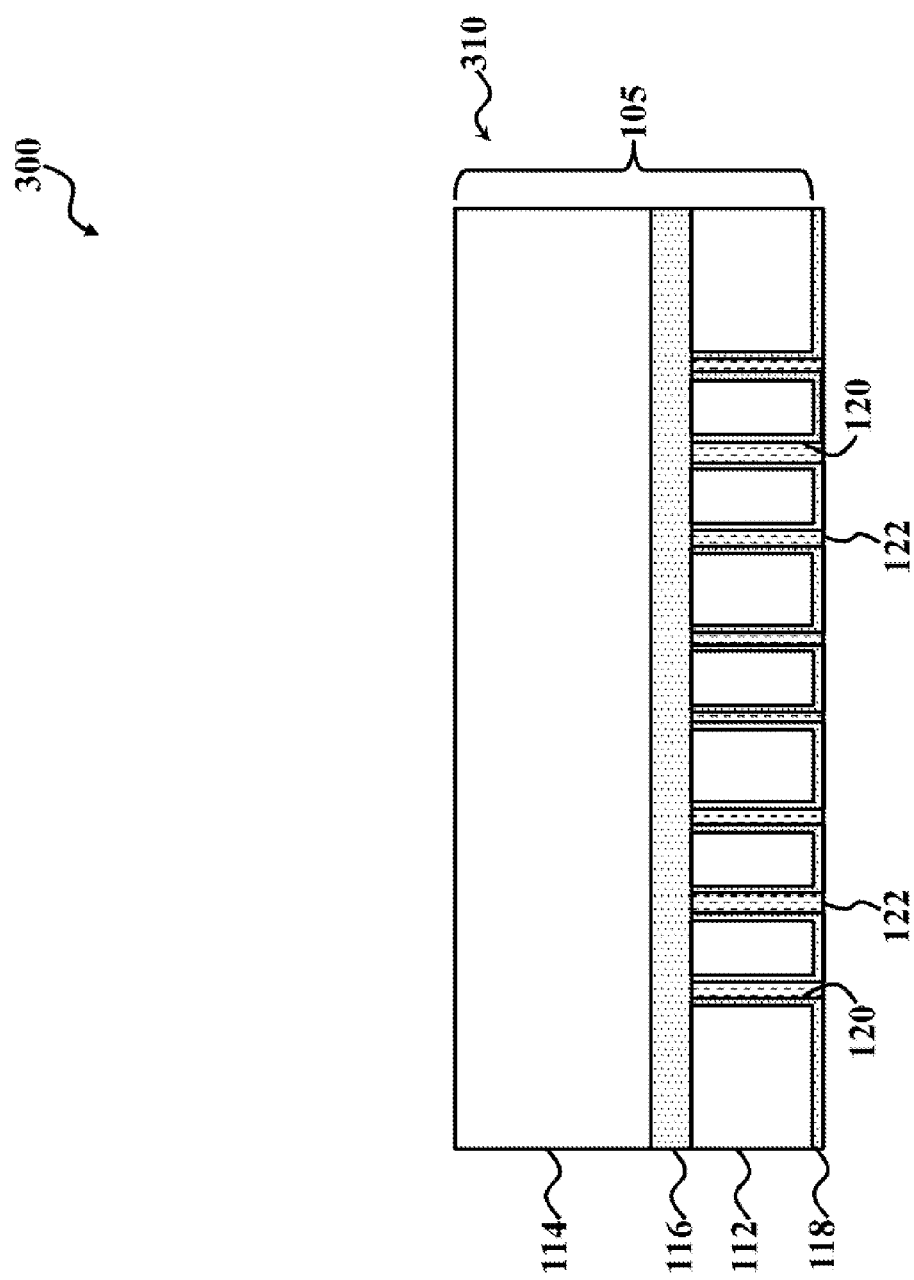
Figure 20:
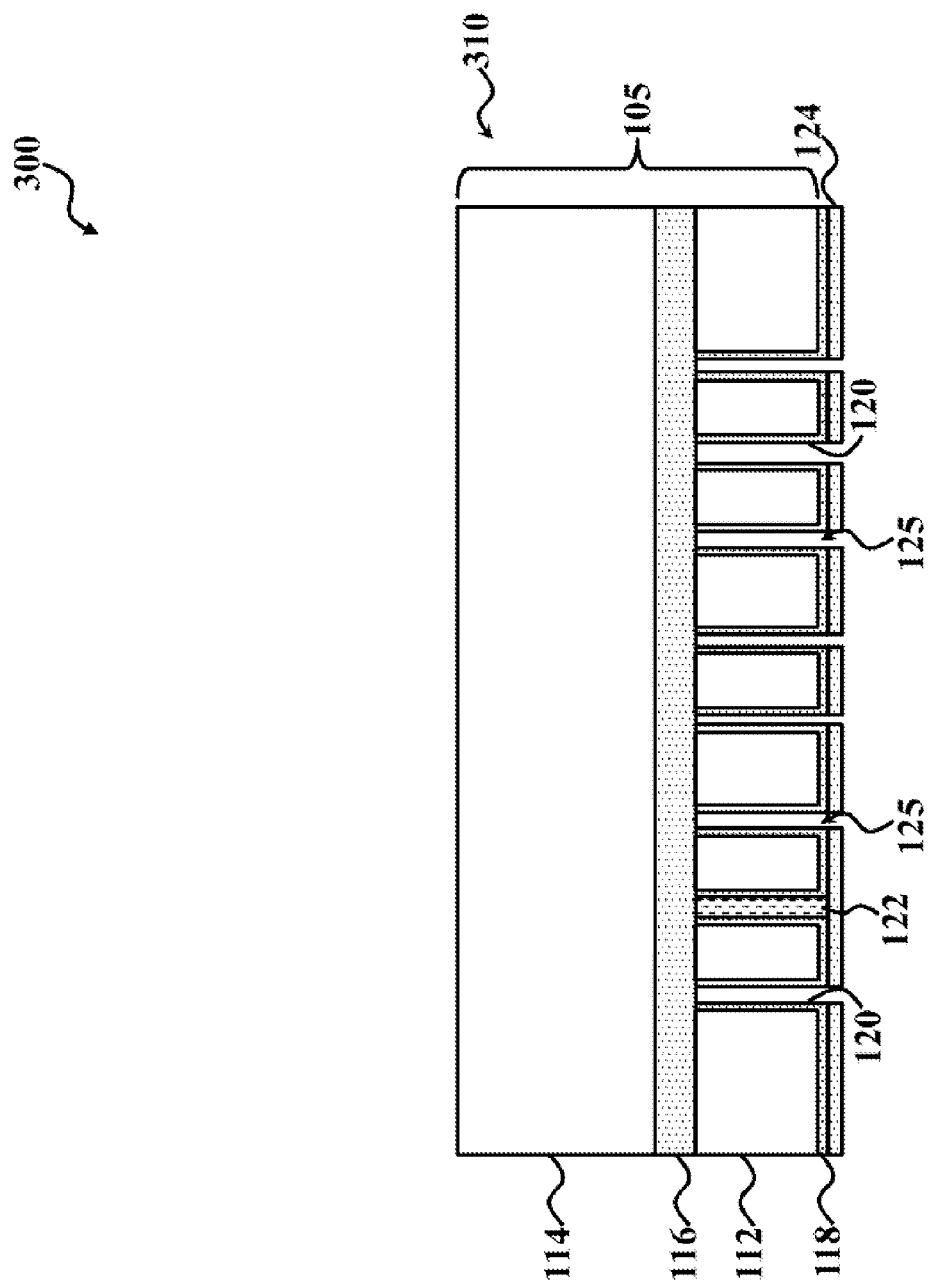

In FIG. 15, the MEMS device 110 is then coupled with a substrate 180. In the present example, the bonding features 140 and bonding features 182 of the substrate 180 affect a fixed and electrical coupling of the MEMS device 110 and the substrate 180. In the depicted embodiment, the bonding features 182 include a bonding layer 186 and a bonding layer 184. In the present example, the bonding layer 186 includes a metal material, such as AlCu, and the bonding layer 184 includes a semiconductor material, such as germanium. The bonding layer 186 and the bonding layer 184 alternatively include other materials. The bonding features 182 contact the bonding features 140, and cooperate with bonding features 140 to effect coupling of the MEMS device 110 and the substrate 180. In the present example, the bonding features 182 effect a eutectic bond with bonding feature 140. A eutectic bond is formed by heating two (or more) materials that are in contact such that the two (or more) materials diffuse together to form an alloy composition. Since the bonding features 182 and the bonding features 140 include metal materials (for example, AlCu/Ge and AlCu), the eutectic bond arises from metal/metal bonding (Al/Al bonding) and/or metal/semiconductor bonding (Ge/Al bonding). Alternatively, by using different materials, the eutectic bonding process could result from other metal/metal and metal/semiconductor bonding, such as Ge/Au bonding, Si/Au bonding, Si/Al bonding, and/or other suitable bonding.

Other types and/or methods for bonding the MEMS device 110 to the substrate 180 are contemplated by the present disclosure.

The substrate 180 is a capping substrate. In the present example, the substrate 180 includes an integrated circuit device, or portion thereof, designed and formed by CMOS technology based processes. The substrate 180 is thus referred to as a CMOS substrate. Alternatively or additionally, the integrated circuit device may be formed using other integrated circuit fabrication technologies. The CMOS substrate 180 includes a substrate 188. The substrate 188 is a semiconductor substrate, such as a silicon substrate. Alternatively or additionally, the semiconductor substrate includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 188 includes various layers that are not separately depicted and that combine to form various microelectronic elements that may include: transistors (for example, metal-oxide-semiconductor field-effect transistors (MOSFETs) including CMOS transistors, bipolar junction transistors (BJTs), high voltage transistors, high frequency transistors, p-channel and/or n-channel field-effect transistors (PFETs/NFETs); resistors; diodes; capacitors; inductors; fuses; other suitable elements, or combinations thereof. The various layers may include high-k dielectric layers, gate layers, hard mask layers, interfacial layers, capping layers, diffusion/barrier layers, dielectric layers, conductive layers, other suitable layers, or combinations thereof. The various layers of the substrate 188 may also include various doped regions, isolation features, other features, or combinations thereof. The microelectronic elements are interconnected to one another to form a portion of the CMOS substrate 180, such as a logic device, memory device (for example, a static random access memory (SRAM)), radio frequency (RF) device, input/output (I/O) device, system-on-chip (SoC) device, other suitable type of device, or combinations thereof.

The CMOS substrate 180 also includes a multilayer interconnect (MLI) structure 190 disposed over the substrate 188. The MLI structure 190 includes various conductive features, such as vertical interconnects 192, such as contacts and/or vias, and/or horizontal interconnects 194, such as conductive lines. In the depicted embodiment, the conductive lines 194 correspond with a top conductive layer of the MLI structure 190, which may be referred to as a top metal (TM) layer. The various conductive features 192 and 194 include conductive materials, such as metal. In an example, metals include aluminum, aluminum/silicon/copper alloy, copper, titanium, titanium nitride, tantalum, tantalum nitride, tungsten, polysilicon, metal silicide, or combinations thereof. The various conductive features 192 and 194 of the MLI interconnect structure 190 are disposed in an interlayer (or inter-level) dielectric (ILD) layer 196. The ILD layer 196 includes silicon oxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof. In an example, the ILD layer 196 may have a multilayer structure. The ILD layer 196 may be formed by a technique including spin-on coating, CVD, sputtering, or other suitable processes. In an example, the MLI structure 190 and ILD 196 are formed in an integrated process including a damascene process, such as a dual damascene process or single damascene process. Further, the device 100 undergoes further processing, for example, to form through silicon vias (TSVs) and/or other features for packaging and electrical coupling.

FIGS. 16-29 are diagrammatic cross-sectional views of another device 300, in portion or entirety, at various stages of fabrication according to the method 10 of FIG. 1. The embodiment of FIGS. 16-29 is similar in many respects to the embodiment of FIGS. 2-15. For example, in the depicted embodiment, the device 300 includes an integrated CMOS-MEMS device. Accordingly, similar features in FIGS. 2-15 and 16-29 are identified by the same reference numerals for clarity and simplicity. FIGS. 16-29 have been simplified for the sake of clarity to better understand the inventive concepts of the present disclosure. Additional features can be added in the device 300, and some of the features described below can be replaced or eliminated in other embodiments of the device 300.

In FIGS. 16-29, the substrate 105 is processed to form a MEMS device 310. In the depicted embodiment, the MEMS device 310 is a motion sensor (for example, a gyroscope or an accelerometer). Alternatively, the MEMS device is a RF MEMS device (for example, an RF switch, resonator, or filter), a MEMS magnetometer, an optical MEMS device (for example, a MEMS micro-mirror), a MEMS oscillator, a MEMS microphone, and/or any other MEMS type device. One of ordinary skill in the art will recognize that the MEMS device alternatively includes nanoelectromechanical elements, for example, the MEMS device is alternatively a nanoelectromechanical systems (NEMS) device.

Figure 21:
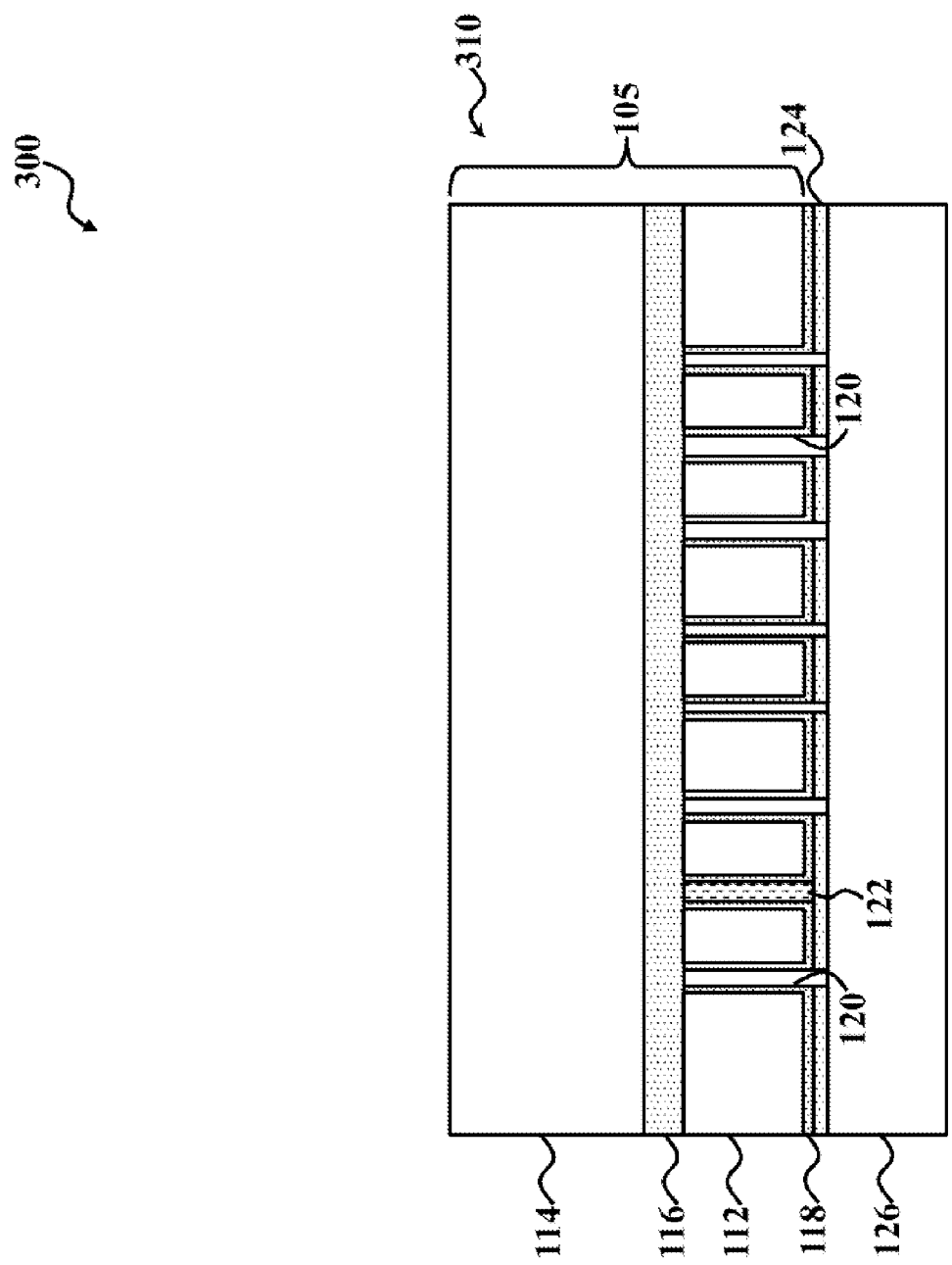

In FIGS. 16-20, the semiconductor layer 112 is processed to form a first structure (or proof mass) layer of the MEMS device 310. The processing of the semiconductor layer 112 of the MEMS device 310 is similar to the processing of the semiconductor layer 112 of the MEMS device 110, which is described with reference to FIGS. 2-6. In FIG. 21, the substrate 105 is bonded with the substrate 126, such that the first structure layer of the MEMS device 310 is coupled with the substrate 126, similar to the bonding of the substrate 105 of the MEMS device 110 and substrate 126 described above with reference to FIG. 7.

Figure 22:
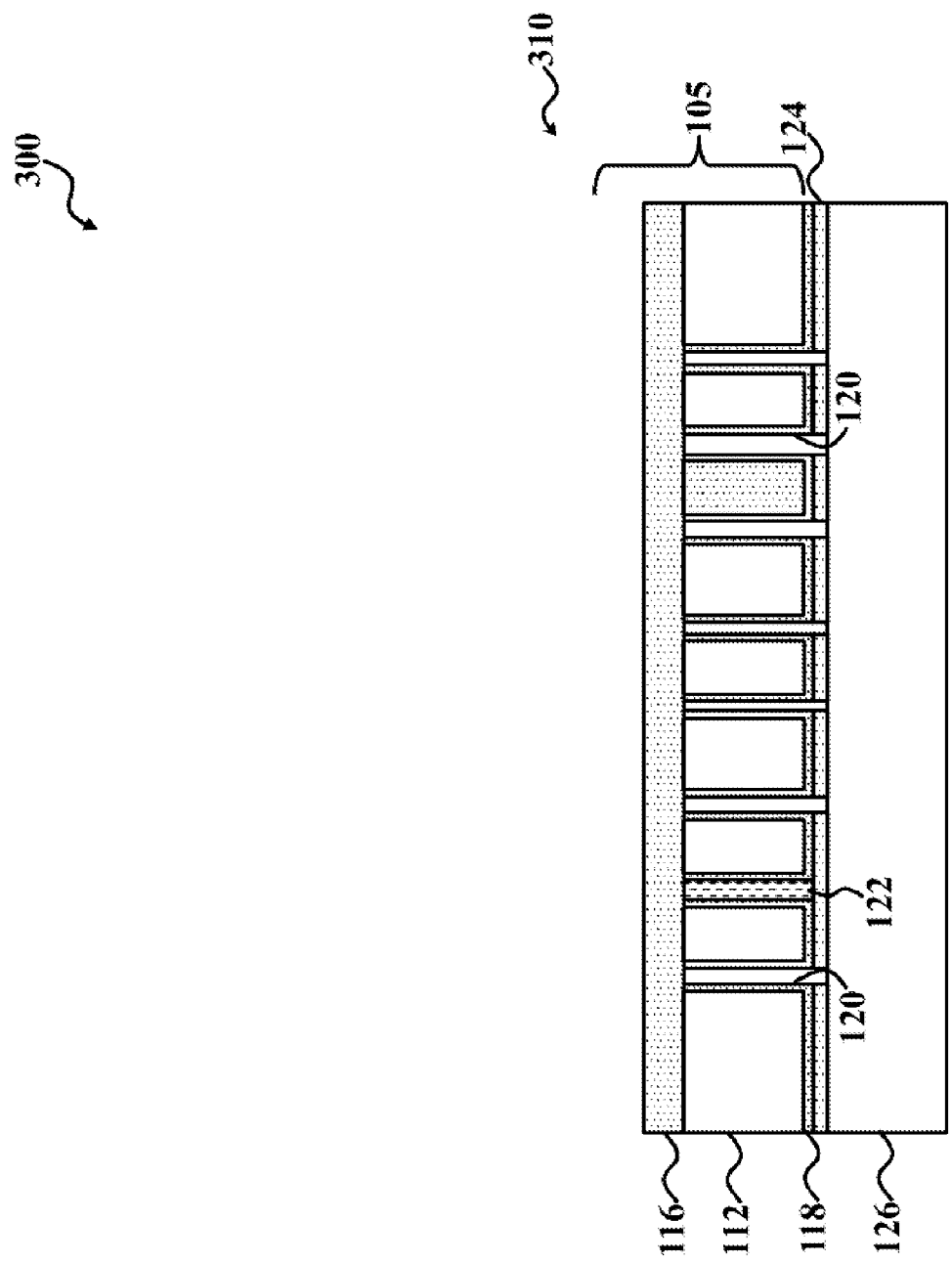
Figure 23:
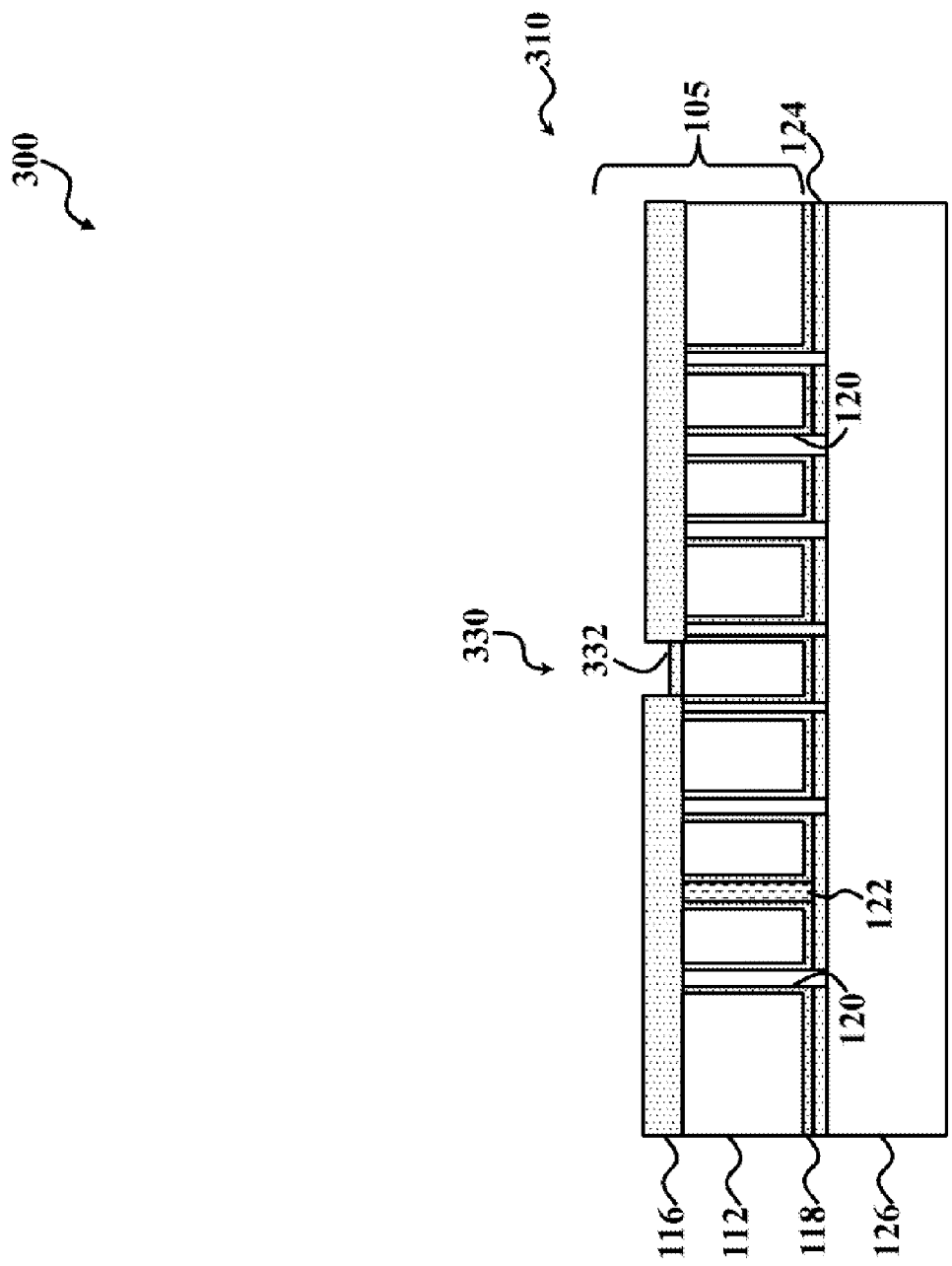

In FIGS. 22-28, the semiconductor layer 114 is processed to form a second structure layer (or back plate) of the MEMS device 310. In FIG. 22, in contrast to processing of the semiconductor layer 114 of the MEMS device 110, the semiconductor layer 114 is completely removed to expose the insulator layer 116. An etch back process, chemical mechanical polishing process, other removal process, or combinations thereof is used to remove the semiconductor layer 114. After removing the semiconductor layer 114, the insulator layer 116 is patterned depending on design requirements of the MEMS device 310, similar to the mask layer 128 (described with reference to FIG. 8 and FIG. 9). For example, where the MEMS device 310 necessitates small sensing gaps, processing continues with reference to FIG. 23. Alternatively, where the MEMS device 310 does not necessitate small sensing gaps, the processing of the substrate 105 in FIG. 23 can be omitted from the following process, such that processing of the substrate 105 proceeds to that described with reference to FIG. 24. In FIG. 23, portions of the insulator layer 116 are removed to define a sensing gap 330. For example, the insulator layer 116 is patterned to include an opening that defines a width of the sensing gap 330 and exposes the semiconductor layer 112.

A dielectric layer 332 is formed over the exposed semiconductor layer 112 to define a thickness of the sensing gap 330. In the depicted embodiment, the dielectric layer 332 is an oxide-containing layer, such as a silicon oxide layer. In an example, the sensing gap 330 has a thickness of about 50 nm to about 1 µm. The sensing gap 330 provides enhanced sensing for out-of-plane movement of the MEMS device 310.

Figure 24:
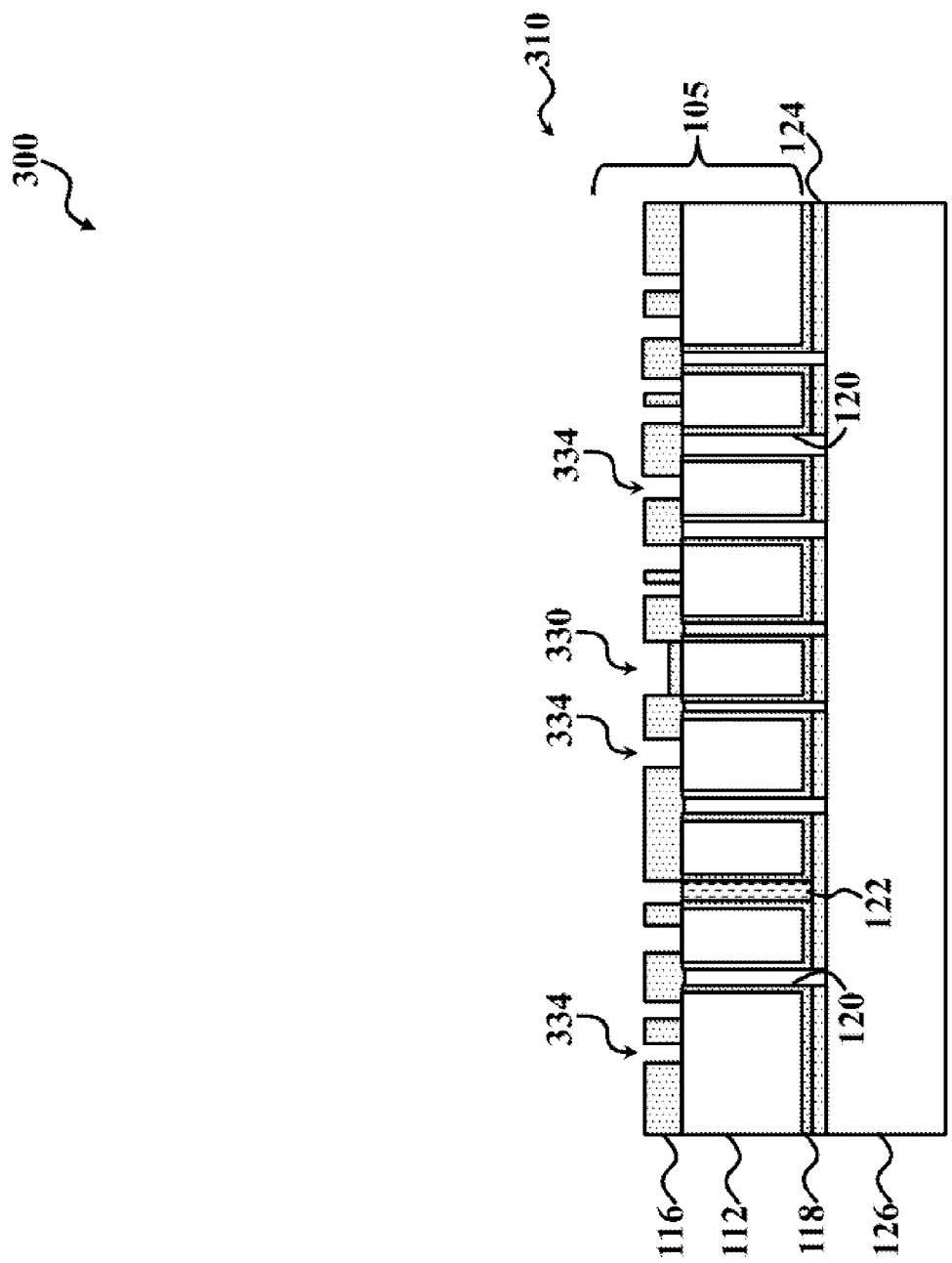
Figure 25:
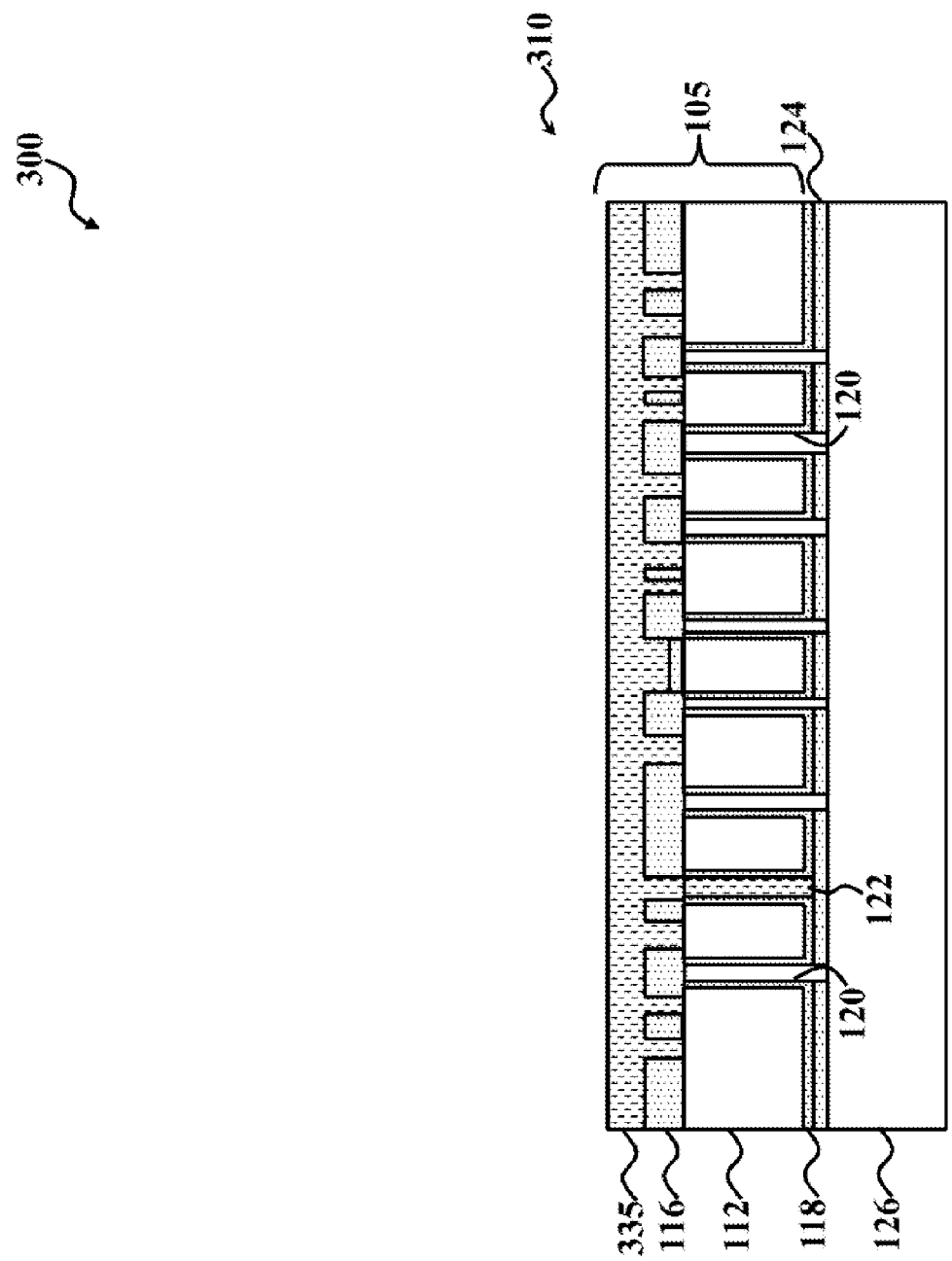
Figure 26:
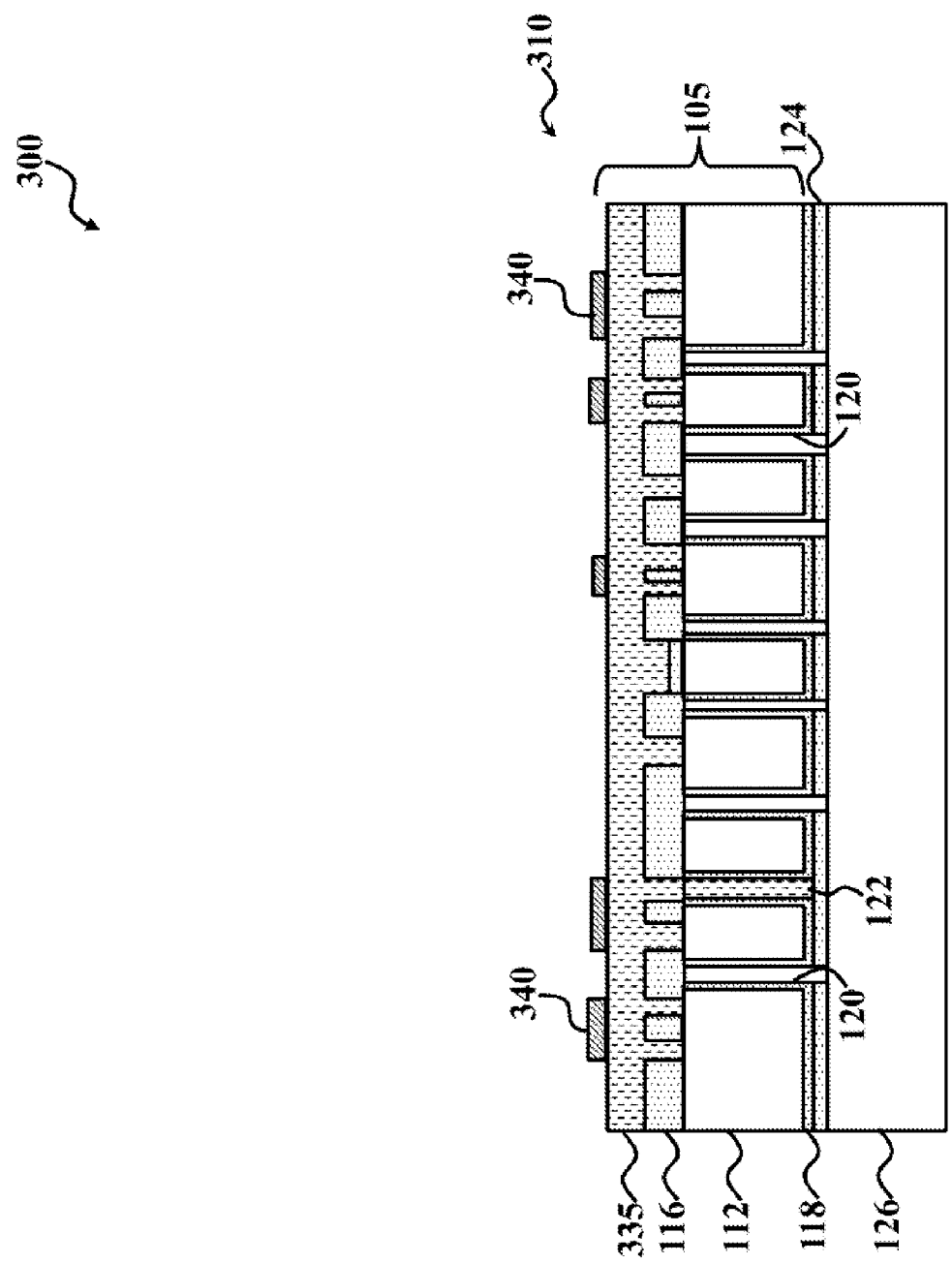

In FIG. 24, portions of the insulator layer 116 are removed to define via openings 334, similar to the via openings 134 defined for the MEMS device 110, described with reference to FIG. 10. For example, the insulator layer 116 is further patterned to include the via openings 334 that expose the semiconductor layer 112. In FIG. 25, conductive structures are formed in the sensing gap 330 and the via openings 334. For example, in FIG. 25, a conductive layer 335 is formed over the patterned insulator layer 116 and the semiconductor layer 112, such that the conductive layer 335 fills the sensing gap 330 and the via openings 334. In the depicted embodiment, the conductive layer 335 is a polysilicon layer. Alternatively, the conductive layer includes another conductive material. The conductive layer 335 has a thickness of about 0.5 µm to about 20 µm. The conductive layer 335 is formed by a deposition process, for example, chemical vapor deposition (CVD), physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition methods, or combinations thereof.

Subsequent processing of the device 300 is similar to the device 100. For example, in FIG. 26, bonding features 340 are formed over portions of the conductive structures 338, similar to the bonding features 140 described with reference to FIG. 12.

Figure 27:
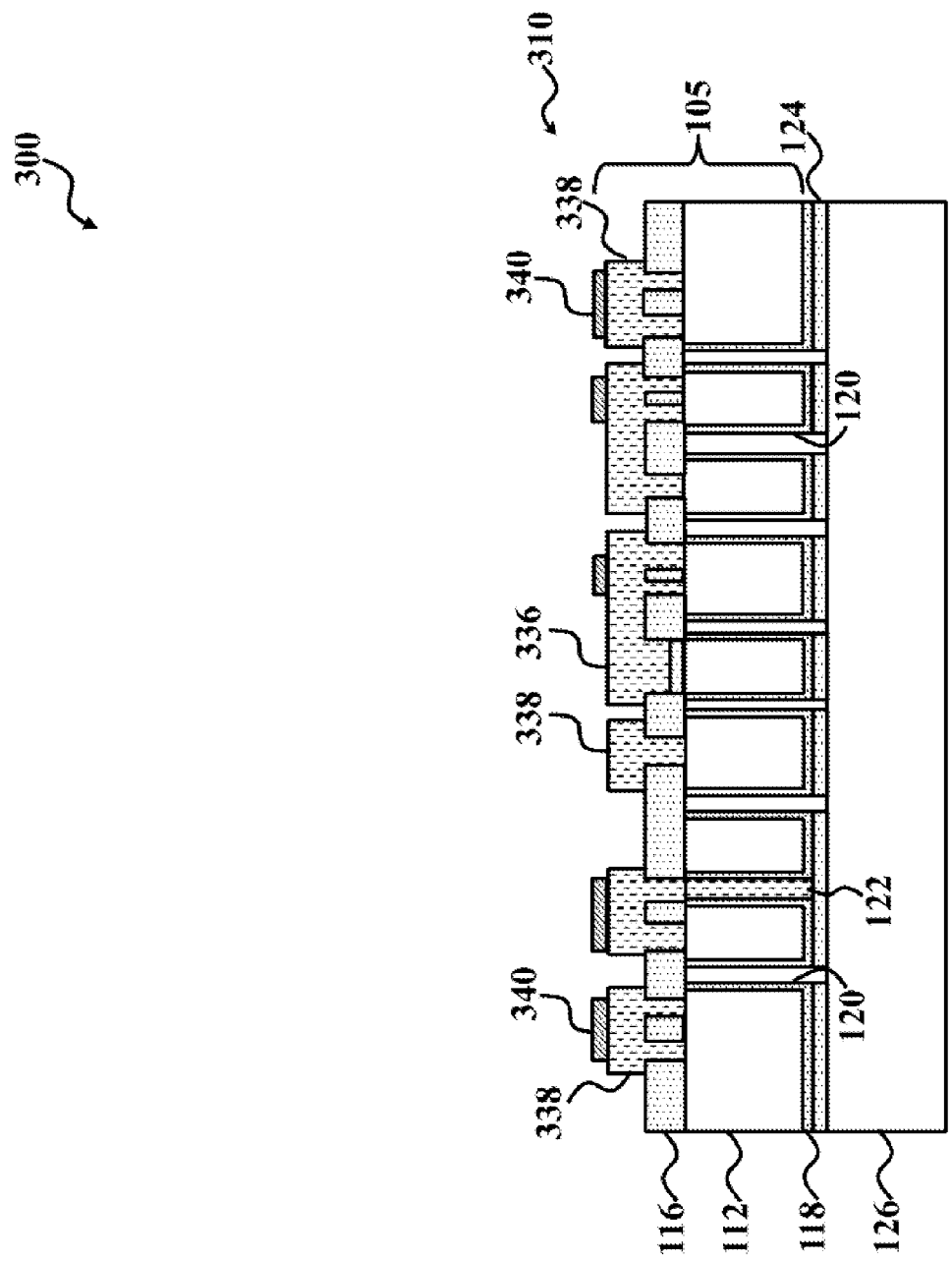

In FIG. 27, the conductive layer 335 is patterned to form conductive structure 336 in the sensing gap 330 and conductive structures 338 in the via openings 334. In the depicted embodiment, the conductive structures 336 and 338 are polysilicon structures. In an example, the polysilicon structures are doped. In the present example, the conductive layer 335 is patterned to form the conductive structures 336 and 338 using lithography patterning processes, etching processes, other suitable processes, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process implements nanoimprint technology. The etching processes include dry etching, wet etching, other etching methods, or combinations thereof.

Figure 28:
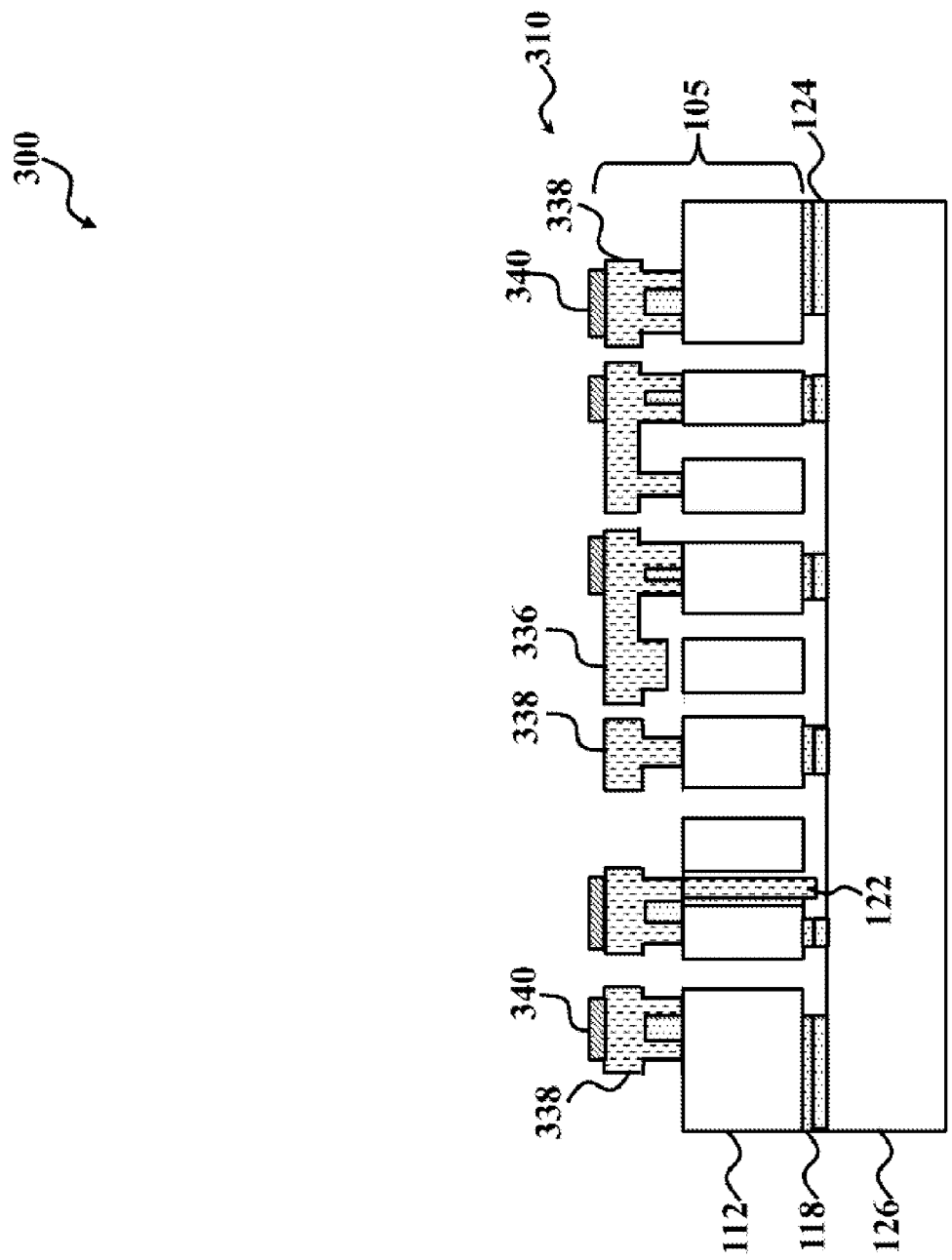
Figure 29:
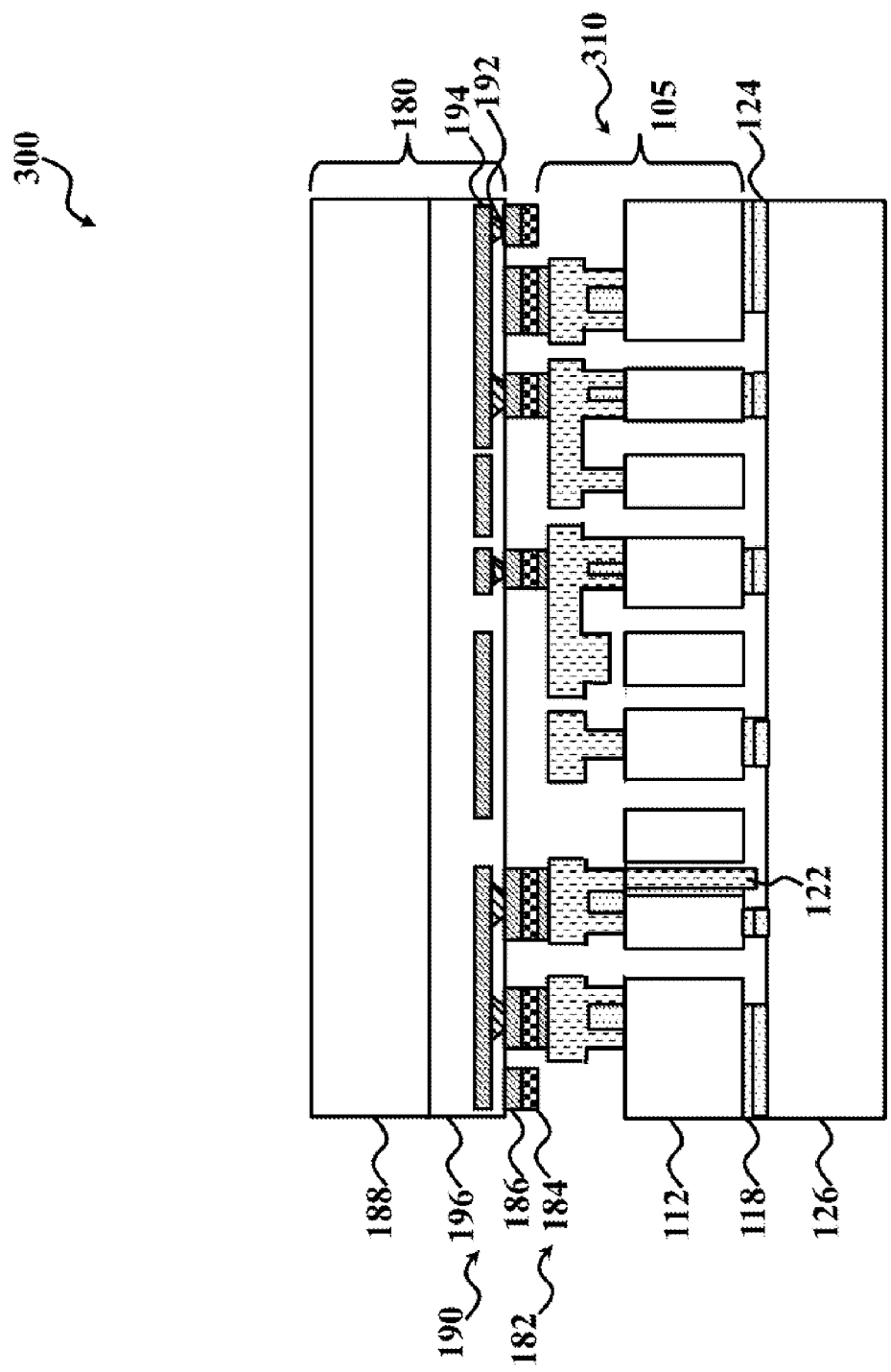

Then, in FIG. 28, a process further defines the second structure layer (or back plate) of the MEMS device 310, similar to the process for further defining the second structure layer (or back plate) of the MEMS device 110, described with reference to FIG. 14. For example, in FIG. 28, a process is performed to remove portions of the insulator layer 116, dielectric layer 120, mask layer 124, and mask layer 118. In the depicted embodiment, where the insulator layer 116, dielectric layer 120, mask layer 124, and mask layer 118 are oxide-containing layers, a sacrificial oxide release process is performed to remove desired portions of such layers, thereby completing fabrication of the MEMS device 310. In an example, the sacrificial oxide release process is a vapor process, such as a vapor HF process. In FIG. 29, the MEMS device 310 is then coupled with the substrate 180, similar to the MEMS device 110 coupled to the substrate, which is described with reference to FIG. 15. The device 300, similar to the device 100, undergoes further processing, for example, to form through silicon vias (TSVs) and/or other features for packaging and electrical coupling.

FIGS. 30-42 are diagrammatic cross-sectional views of another device 500, in portion or entirety, at various stages of fabrication according to the method 10 of FIG. 1. The embodiment of FIGS. 30-42 is similar in many respects to the embodiment of FIGS. 2-15. For example, in the depicted embodiment, the device 500 includes a MEMS device. Accordingly, similar features in FIGS. 2-15 and 30-42 are identified by the same reference numerals for clarity and simplicity. FIGS. 30-42 have been simplified for the sake of clarity to better understand the inventive concepts of the present disclosure. Additional features can be added in the device 500, and some of the features described below can be replaced or eliminated in other embodiments of the device 500.

In FIGS. 30-42, the substrate 105 is processed to form a MEMS device 510. In the depicted embodiment, the MEMS device 510 is a MEMS microphone. Alternatively, the MEMS device is a motion sensor (for example, a gyroscope or an accelerometer), a RF MEMS device (for example, an RF switch, resonator, or filter), a MEMS magnetometer, an optical MEMS device (for example, a MEMS micro-mirror), a MEMS oscillator, and/or any other MEMS type device. One of ordinary skill in the art will recognize that the MEMS device alternatively includes nanoelectromechanical elements, for example, the MEMS device is alternatively a nanoelectromechanical systems (NEMS) device.

Figure 30:
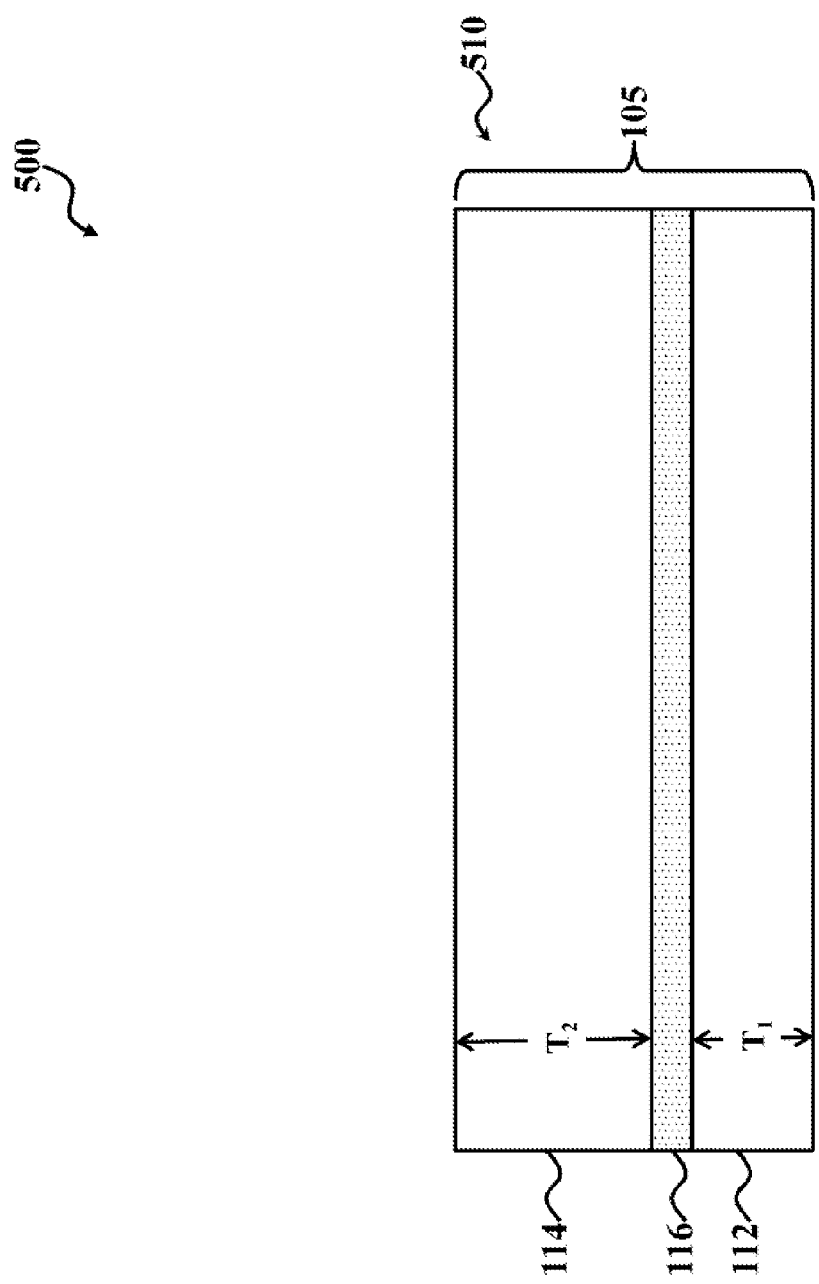
FIGS. 30-42 are diagrammatic cross-sectional views of yet another device, in portion or entirety, at various stages of fabrication according to the method of FIG. 1, according to various aspects of the present disclosure.
Figure 31:
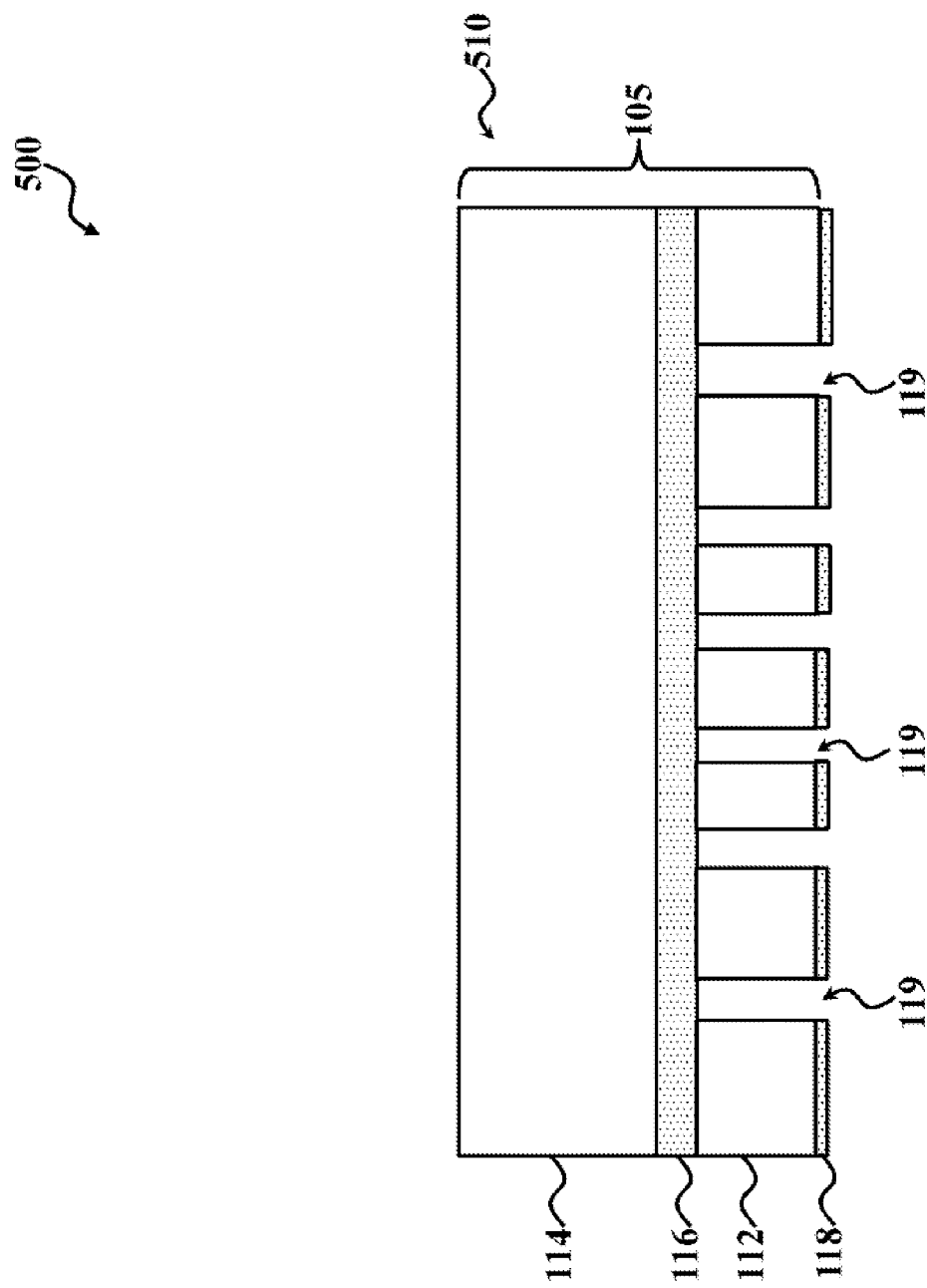
Figure 32:
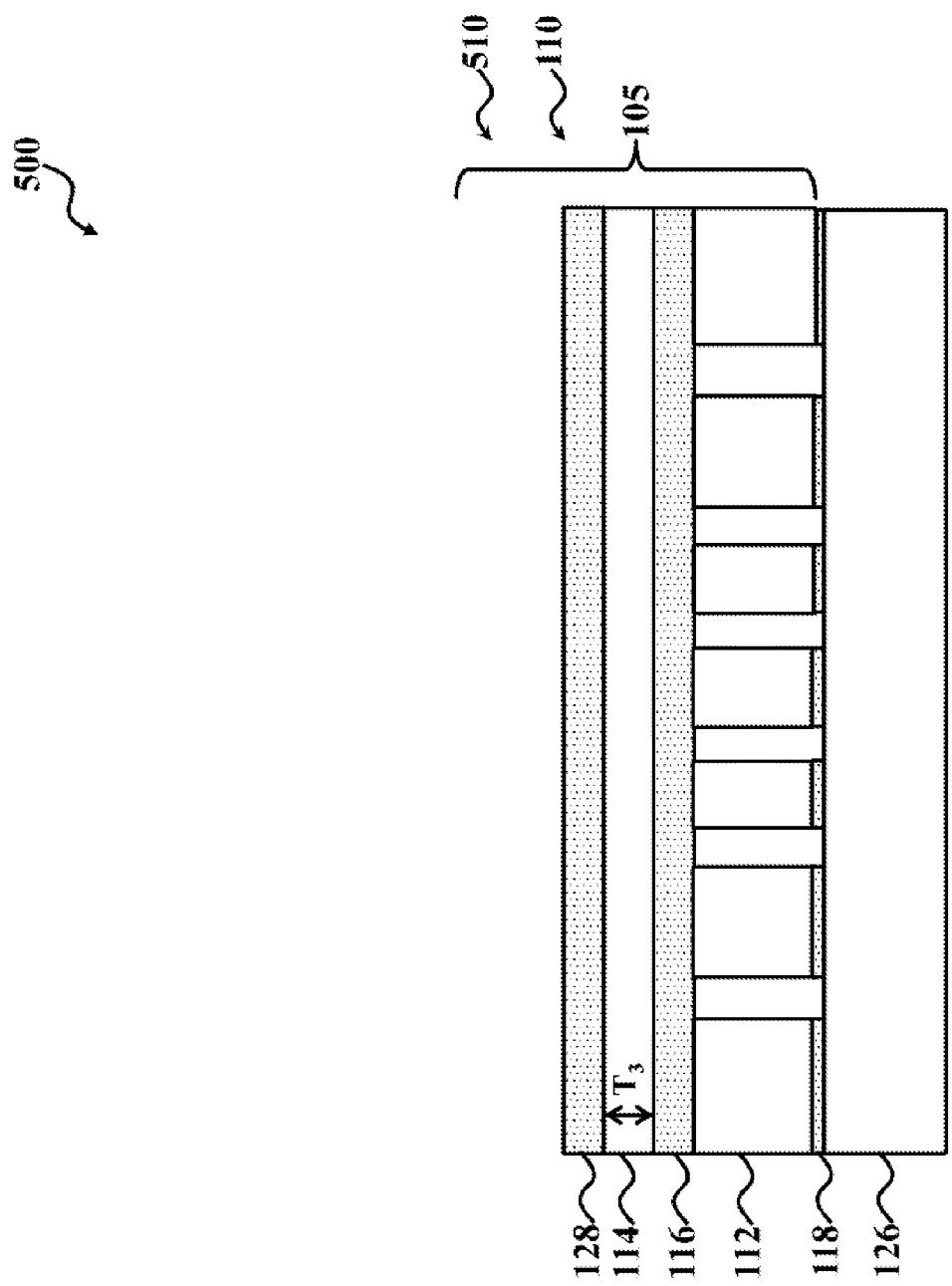

In FIG. 30 and FIG. 31, the semiconductor layer 112 is processed to form a first structure layer of the MEMS device 510. In the depicted embodiment, the first structure layer is a back plate of the MEMS device 510. The processing of the semiconductor layer 112 of the MEMS device 510 is similar to the processing of the semiconductor layer 112 of the MEMS device 110, which is described with reference to FIG. 2 and FIG. 3. In FIG. 32, the substrate 105 is bonded with the substrate 126, such that the first structure layer of the MEMS device 510 is coupled with the substrate 126, similar to the bonding of the substrate 105 of the MEMS device 110 and substrate 126 described above with reference to FIG. 7. In FIG. 32, the patterned mask layer 118 effects a fixed coupling of the substrates 105 and 126 (particularly, coupling of the substrate 126 and the first structure layer of the MEMS device 510).

Further, similar to the MEMS device 110, in FIGS. 32-35, the semiconductor layer 114 is processed to form a second structure layer of the MEMS device 510. In the depicted embodiment, the semiconductor layer 114 is processed to form a microphone membrane of the MEMS device 510. For example, similar to processing of the second structure layer of the MEMS device 110 described with reference to FIG. 8, in FIG. 32, a thinning process is performed to reduce the thickness of the semiconductor layer 114. In the present example, after the thinning process, the semiconductor layer 114 has a thickness ($T_3$) of about 0.5 µm to about 20 µm. The thinning process is an etch back process, chemical mechanical polishing process, other thinning process, or combinations thereof. After the thinning process, a mask layer 128 is formed over the semiconductor layer 114. In the depicted embodiment, the mask layer 128 is a dielectric layer, such as an oxide-containing layer (for example, a silicon oxide layer).

Figure 33:
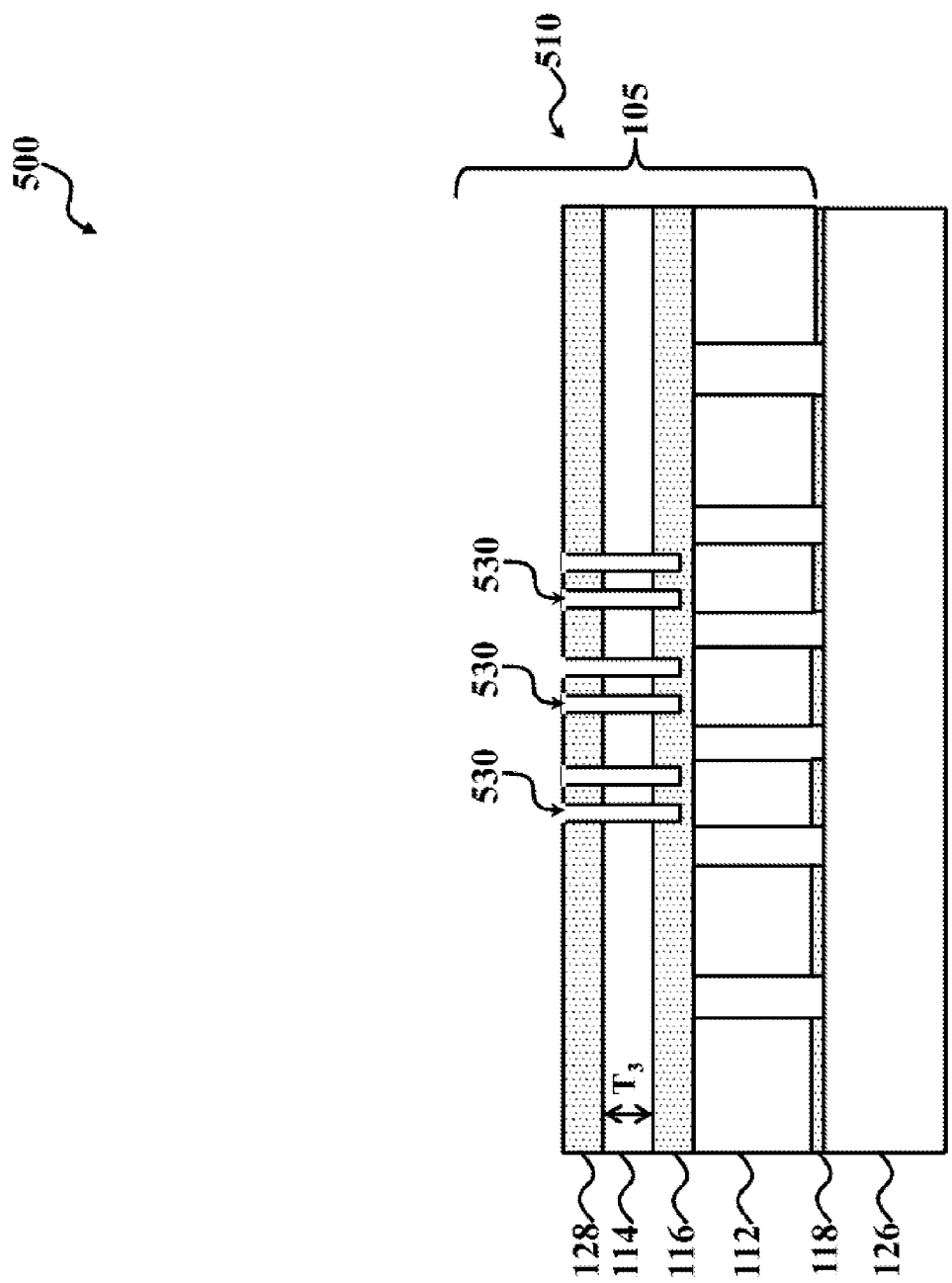
Figure 34:
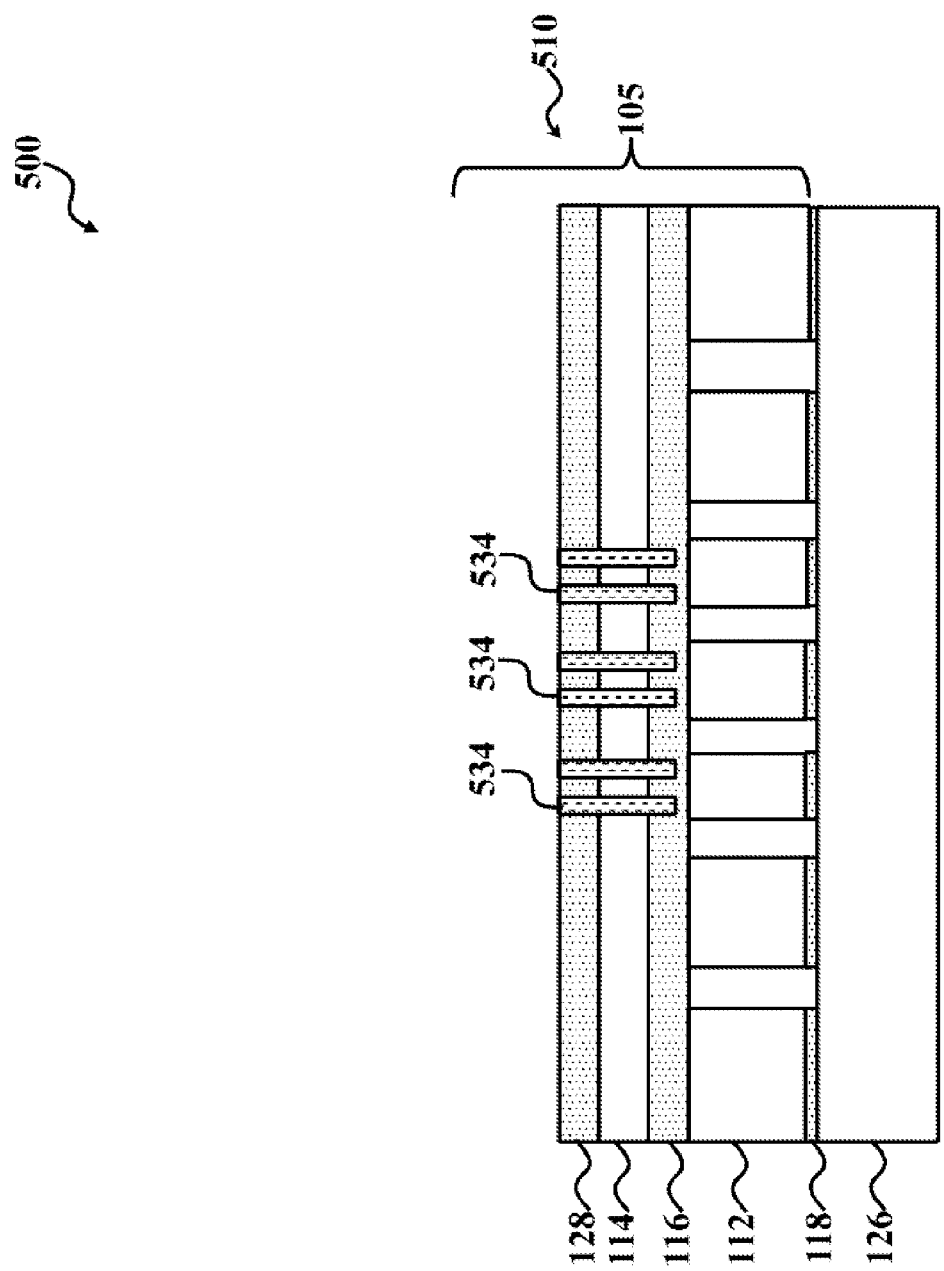

The mask layer 128 is patterned depending on design requirements of the MEMS device 510. For example, in FIG. 33, the mask layer 128 is patterned to define a location and dimension (such as width) of conductive structures that extend through the semiconductor layer 114. The conductive structures can be referred to as bump structures. In FIG. 33, portions of the mask layer 128, the semiconductor layer 114, and the insulator layer 116 are removed to define openings 530. The openings of the patterned mask layer 128, patterned semiconductor layer 114, and patterned insulator layer 116 combine to form the openings 530, which extend through the patterned mask layer 128 and patterned semiconductor layer 114, and partially through the insulator layer 116. In FIG. 34, conductive structures 534 are formed in the openings 530. In the depicted embodiment, the conductive structures 534 are polysilicon structures. In an example, the polysilicon structures are doped. The conductive structures 534 are formed by depositing a conductive layer over the patterned mask layer 128 to fill the openings 530, and then performing an etch back process, a chemical mechanical polishing (CMP) process, or a combination thereof on the conductive layer until the patterned mask layer 128 is reached, such that the patterned mask layer 128 acts as an etch stop layer. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition methods, or combinations thereof.

Figure 35:
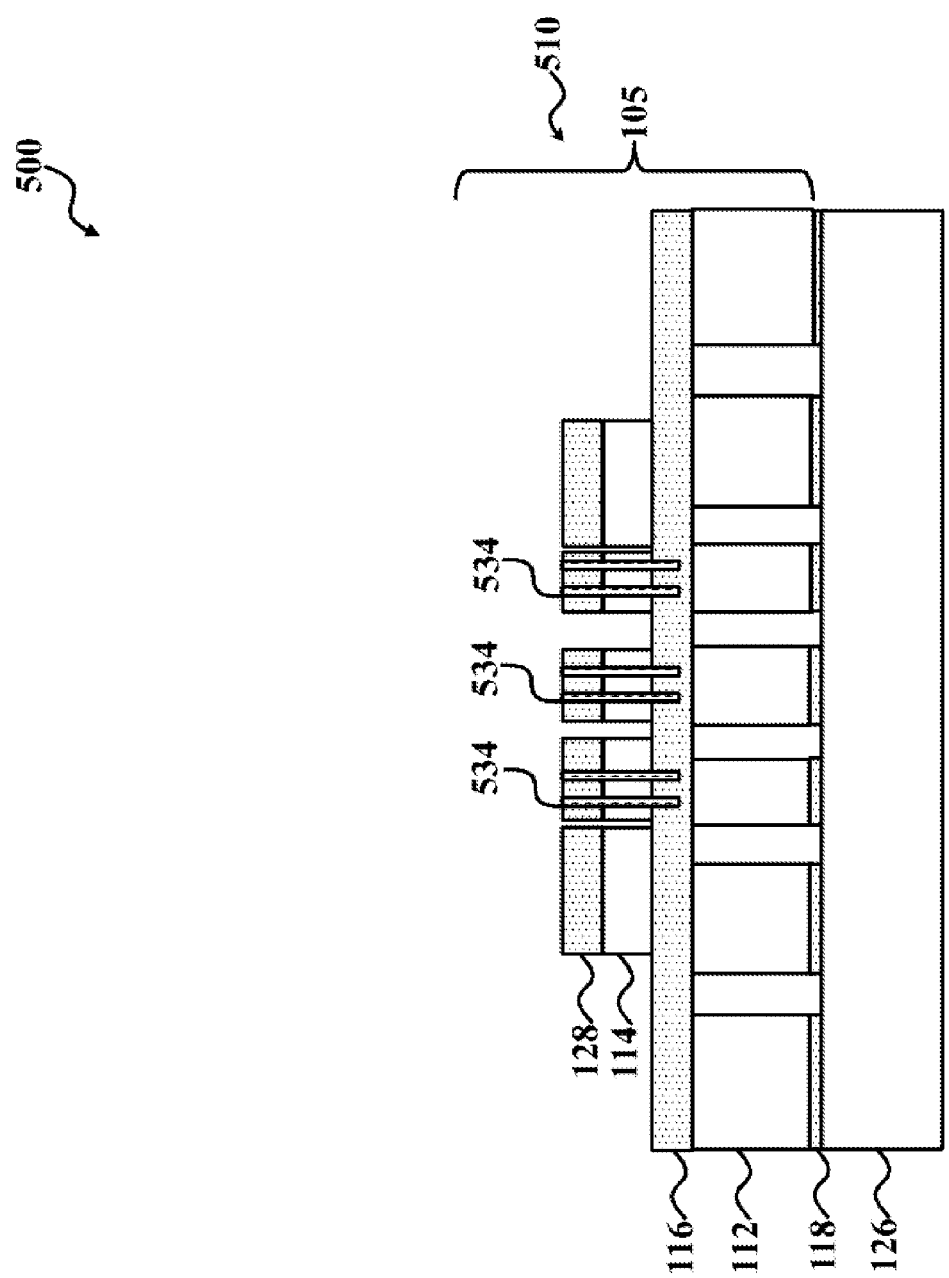
Figure 36:
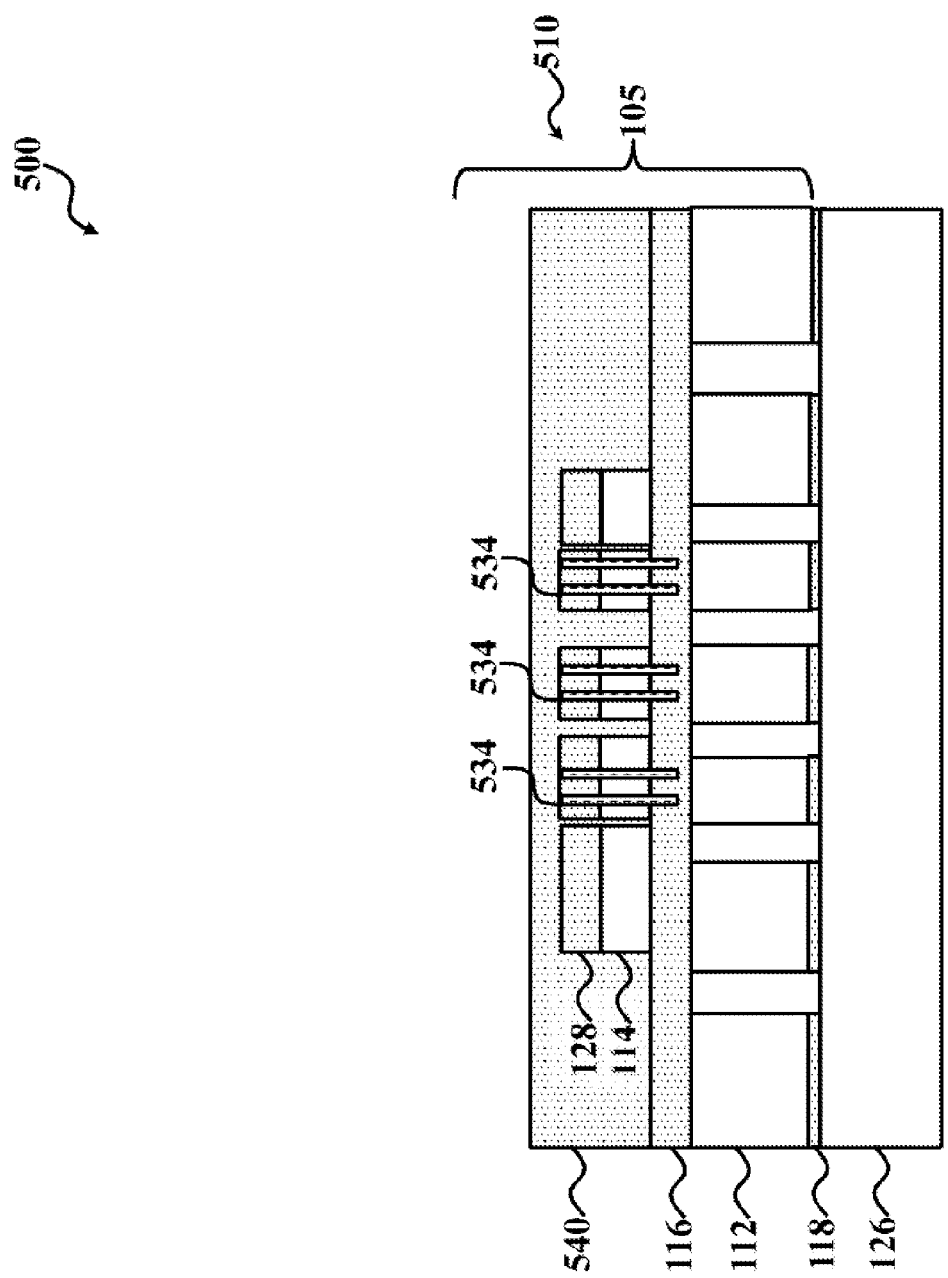

In FIG. 35, the patterned mask layer 128 and the semiconductor layer 114 are patterned to further define the second structure layer (here, the microphone membrane) of the MEMS device 510. In the present example, the patterned mask layer 128 and the semiconductor layer 114 are patterned using lithography patterning processes, etching processes, other suitable processes, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process implements nanoimprint technology. The etching processes include dry etching, wet etching, other etching methods, or combinations thereof. Thereafter, in FIG. 36, a dielectric layer 540 is formed over the second structure layer, thereby planarizing the substrate 105. In the depicted embodiment, the dielectric layer 540 is an oxide-containing layer, such as a silicon oxide layer.

Figure 37:
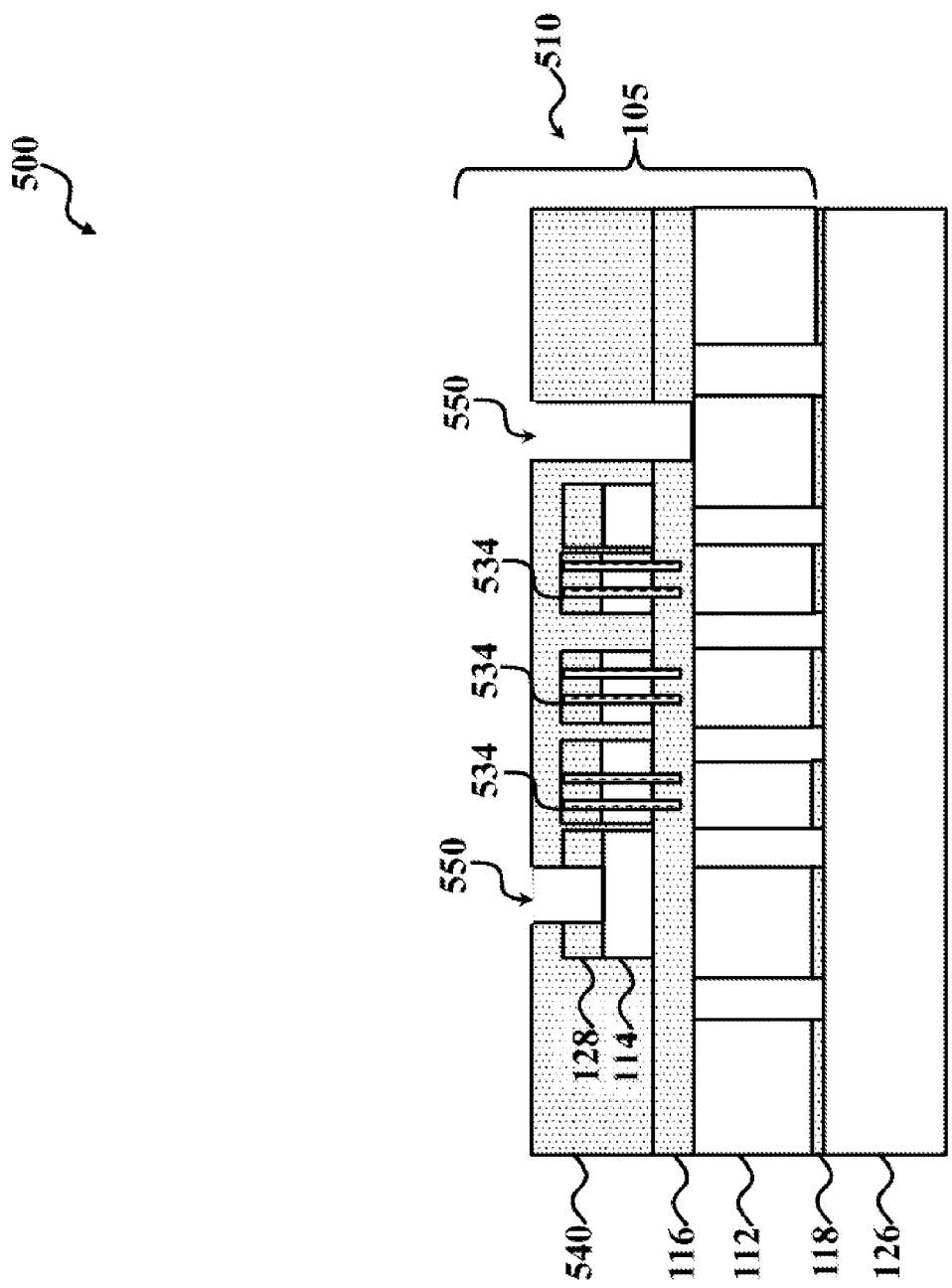
Figure 38:
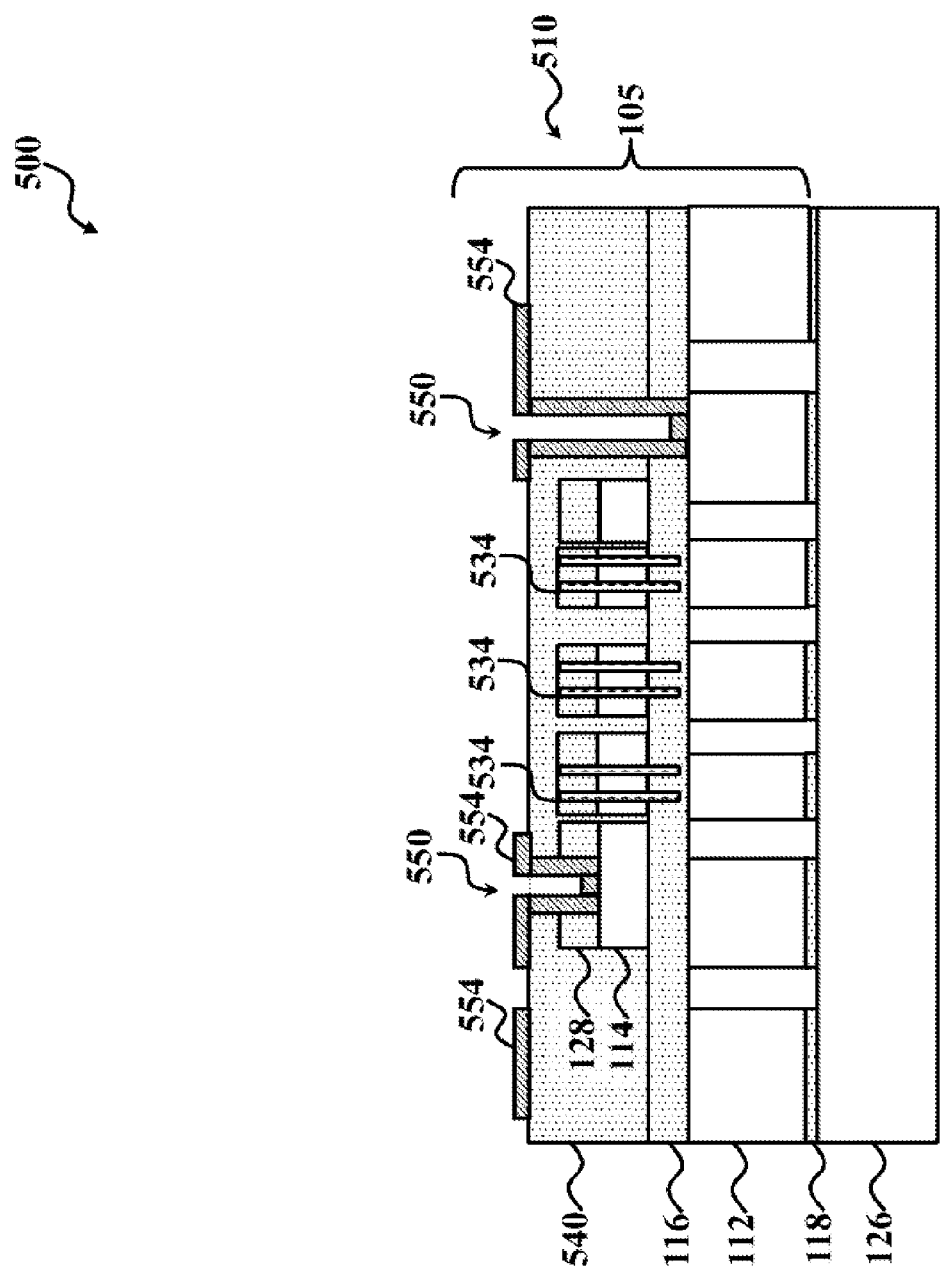

In FIG. 37, the dielectric layer 540 and the insulator layer 116 are patterned to form via openings 550. For example, portions of the dielectric layer 540 and the insulator layer 116 are removed using lithography patterning and etching processes, such as those described herein, to define the via openings 550. In the depicted embodiment, one of the via openings 550 extends through the dielectric layer 540 to expose the semiconductor layer 114, and one of the via openings 550 extends through the dielectric layer 540 and the insulator layer 116 to expose the semiconductor layer 112. In FIG. 38, conductive features 554 are formed to partially fill the via openings 550. The conductive features 554 facilitate electrical connection to the first and second structure layers of the MEMS device 510 (particularly, the semiconductor layer 112 and the semiconductor layer 114). In an example, a conductive layer is conformally deposited over the substrate 105 and patterned to form the conductive features 554. The deposition and patterning process is similar to those described herein. In the depicted embodiment, the conductive features include a metal material, such as AlCu.

Figure 39:
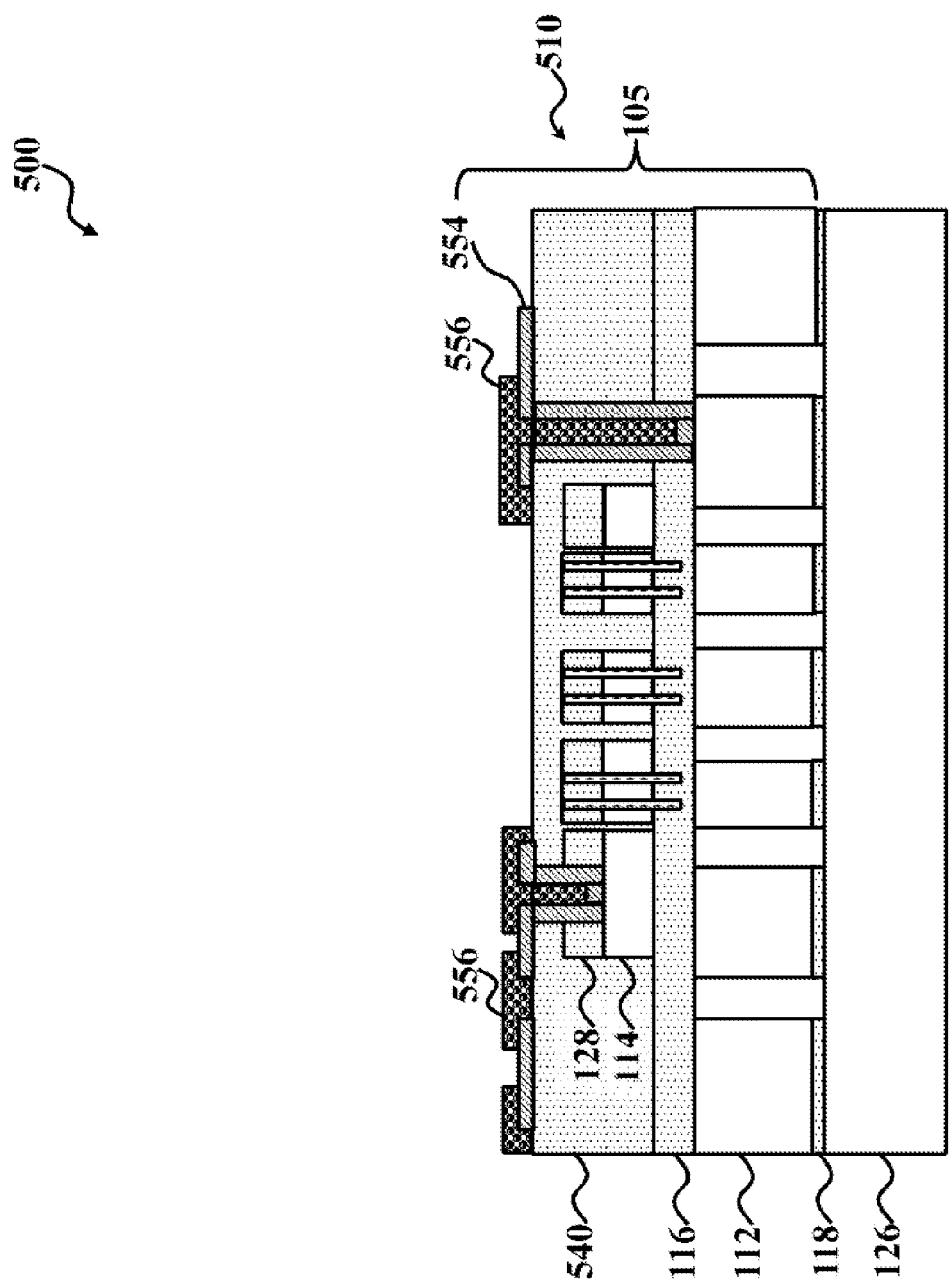

In FIG. 39, a patterned passivation layer 556 is formed over the dielectric layer 540. In the present example, the patterned passivation layer 556 fully or partially fills the via openings 550. The patterned passivation layer 556 includes a material that can withstand subsequent processing, particularly a process performed to remove portions of the dielectric layer 540, the insulator layer 116, the patterned mask layer 128, and/or the patterned mask layer 118, such as a sacrificial oxide release process. In the depicted embodiment, the patterned passivation layer 556 includes silicon carbide (SiC). Alternatively, the patterned passivation layer 556 includes aluminum nitride (AlN), aluminum oxide ($Al_2O_3$), other material that can withstand subsequent processing, or combinations thereof. The patterned passivation layer 556 is formed using deposition, lithography patterning, and etching processes, as described herein. Thereafter, in FIG. 40, a mask layer 560 is formed over the dielectric layer 540, such that the patterned passivation layer 556 and the conductive features 554 are covered and protected during subsequent processing.

Figure 41:
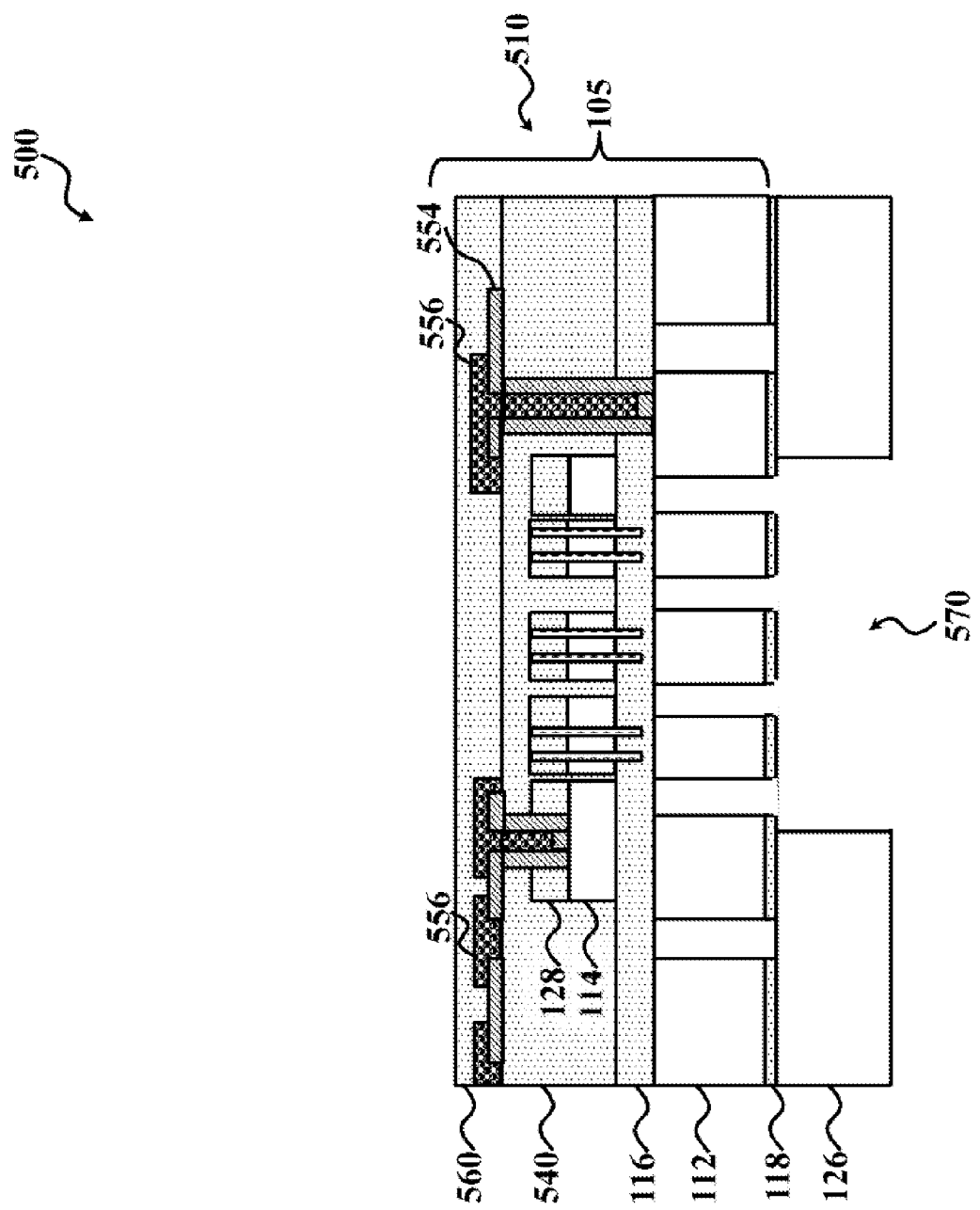
Figure 42:
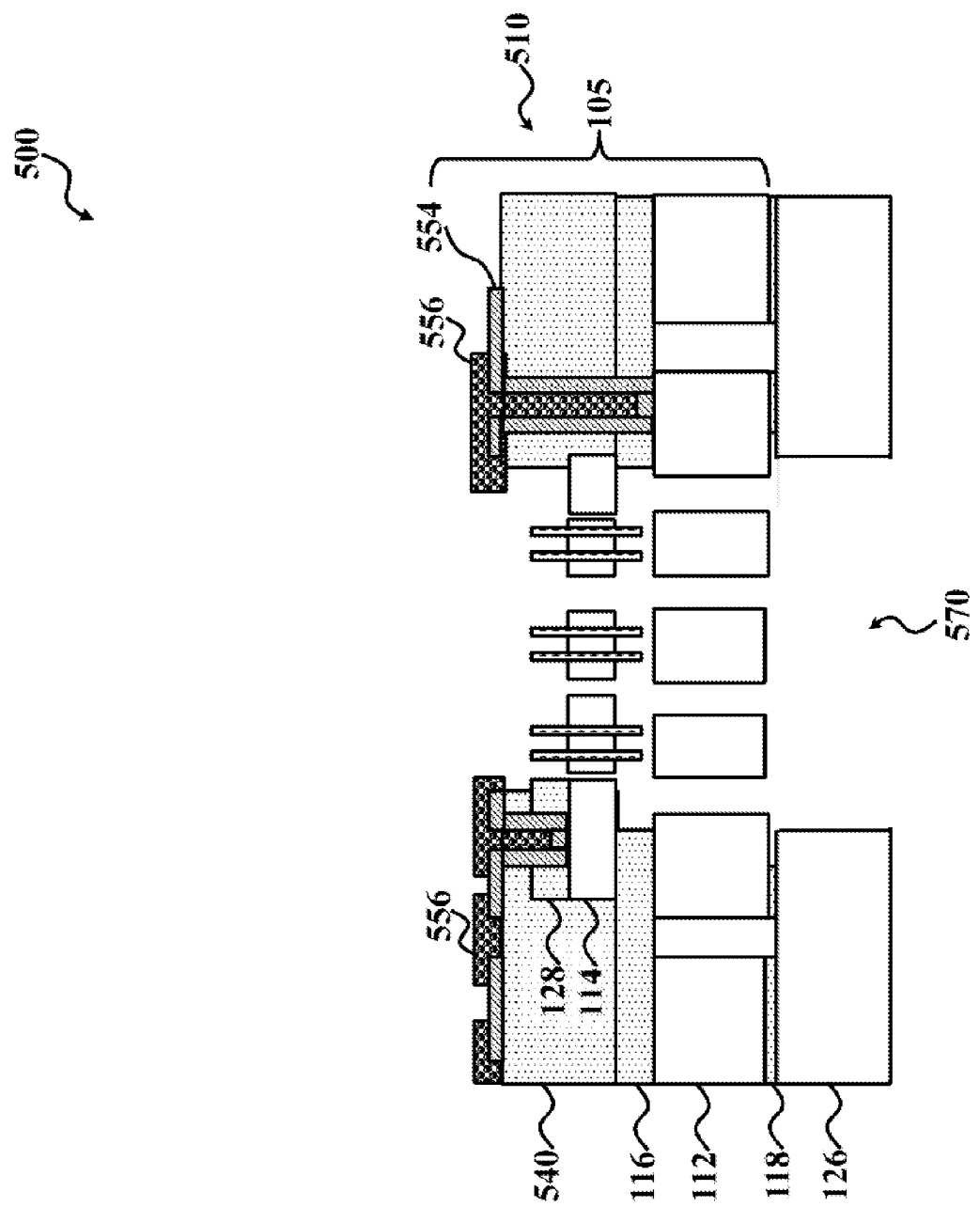

In FIG. 41, a back cavity 570 is defined for the MEMS device 510. The back cavity 570 is defined using lithography patterning and etching processes as described herein. Then, in FIG. 42, a process further defines the first structure layer (here, the back plate) and second structure layer (here, the microphone membrane) of the MEMS device 510. For example, in FIG. 42, a process is performed to remove portions of the insulator layer 116, mask layer 118, mask layer 128, dielectric layer 540, and mask layer 560. In the depicted embodiment, where the insulator layer 116, mask layer 118, mask layer 128, dielectric layer 540, and dielectric layer 560 are oxide-containing layers, a sacrificial oxide release process is performed to remove desired portions of such layers, thereby completing fabrication of the MEMS device 510. In an example, the sacrificial oxide release process is a vapor process, such as a vapor HF process. The patterned passivation layer 556 includes a material that can withstand the vapor process. The MEMS device 510 can undergo further processing to complete fabrication. It is noted that the foregoing fabrication process provides the MEMS device 510 with a thin microphone membrane (here, semiconductor layer 114) and a sufficiently thick back plate (here, the semiconductor layer 112). In an example, the thin microphone membrane has a thickness of about 1 μm to about 5 μm, and the thick back plate has a thickness of 5 μm to about 10 μm.

FIGS. 43-54 are diagrammatic cross-sectional views of another device 700, in portion or entirety, at various stages of fabrication according to the method 10 of FIG. 1. The embodiment of FIGS. 43-54 is similar in many respects to the embodiment of FIGS. 2-15 and FIGS. 30-42. For example, in the depicted embodiment, the device 700 includes a MEMS device. Accordingly, similar features in FIGS. 2-15, 30-42, and 43-54 are identified by the same reference numerals for clarity and simplicity. FIGS. 43-54 have been simplified for the sake of clarity to better understand the inventive concepts of the present disclosure. Additional features can be added in the device 700, and some of the features described below can be replaced or eliminated in other embodiments of the device 700.

In FIGS. 43-54, the substrate 105 is processed to form a MEMS device 710. In the depicted embodiment, the MEMS device 710 is a MEMS microphone. Alternatively, the MEMS device is a motion sensor (for example, a gyroscope or an accelerometer), a RF MEMS device (for example, an RF switch, resonator, or filter), a MEMS magnetometer, an optical MEMS device (for example, a MEMS micro-mirror), a MEMS oscillator, and/or any other MEMS type device. One of ordinary skill in the art will recognize that the MEMS device alternatively includes nanoelectromechanical elements, for example, the MEMS device is alternatively a nanoelectromechanical systems (NEMS) device.

Figure 43:
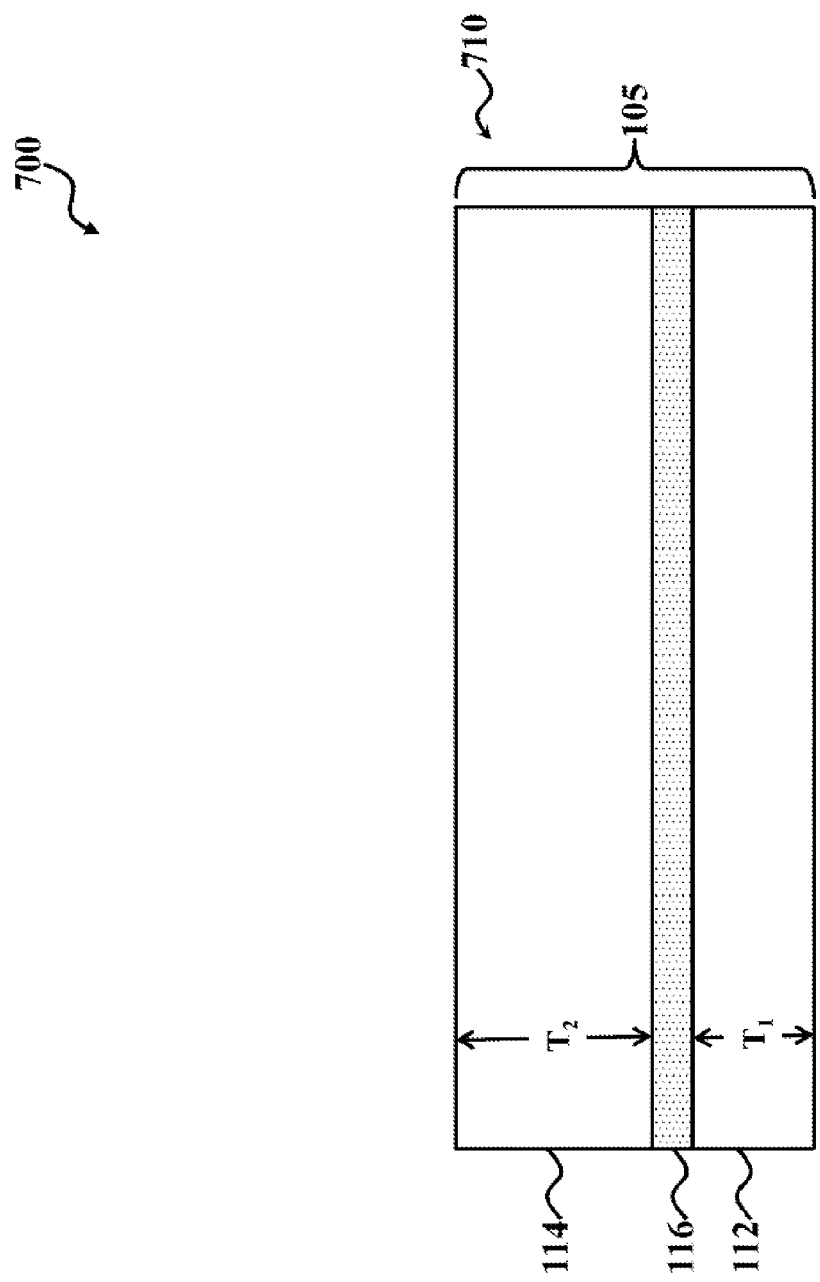
FIGS. 43-54 are diagrammatic cross-sectional views of yet another device, in portion or entirety, at various stages of fabrication according to the method of FIG. 1, according to various aspects of the present disclosure.
Figure 44:
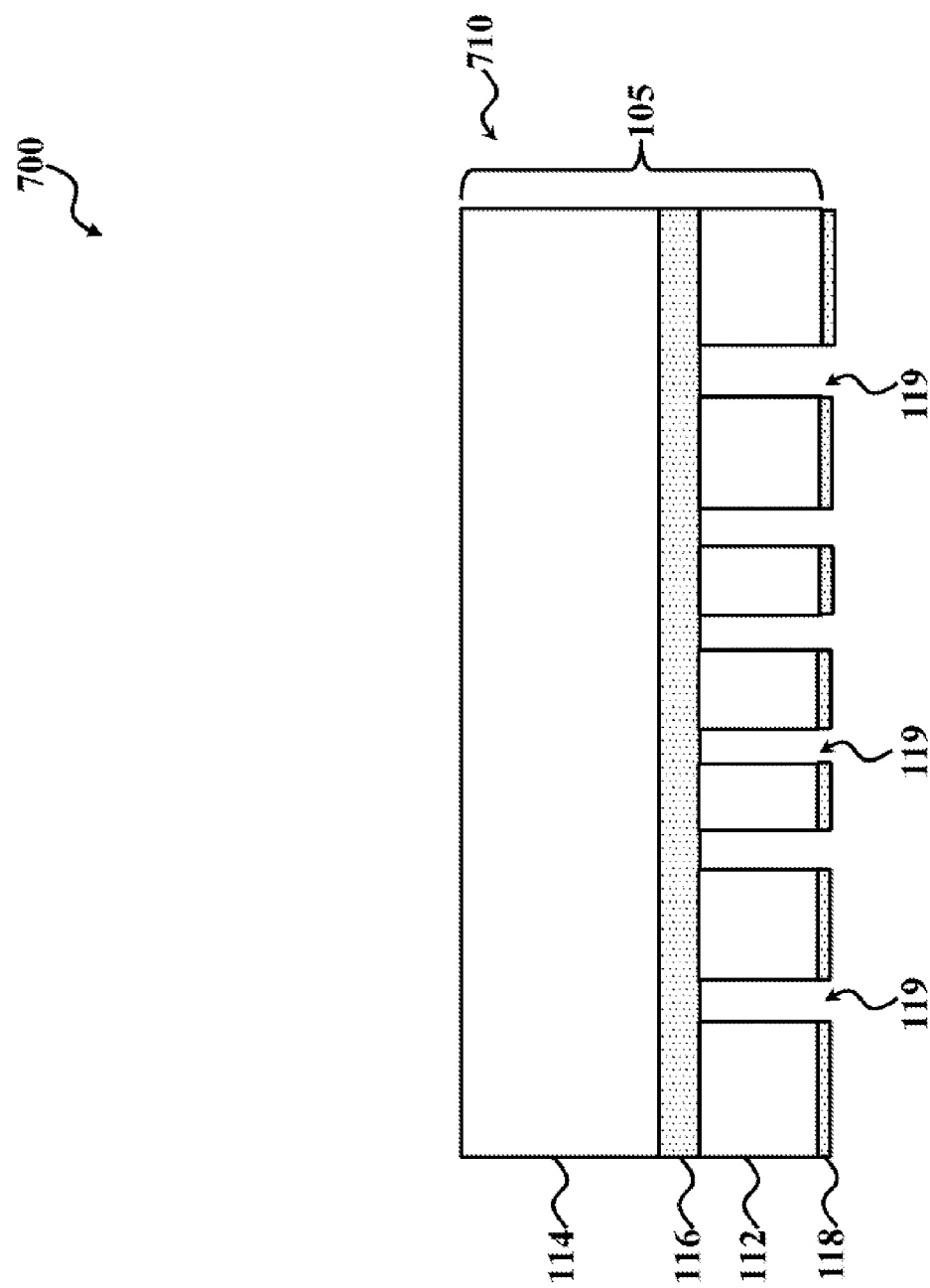

In FIG. 43 and FIG. 44, the semiconductor layer 112 is processed to form a first structure layer of the MEMS device 710. In the depicted embodiment, the first structure layer is a back plate of the MEMS device 710. The processing of the semiconductor layer 112 of the MEMS device 710 is similar to the processing of the semiconductor layer 112 of the MEMS device 510, which is described with reference to FIG. 30 and FIG. 31.

Figure 45:
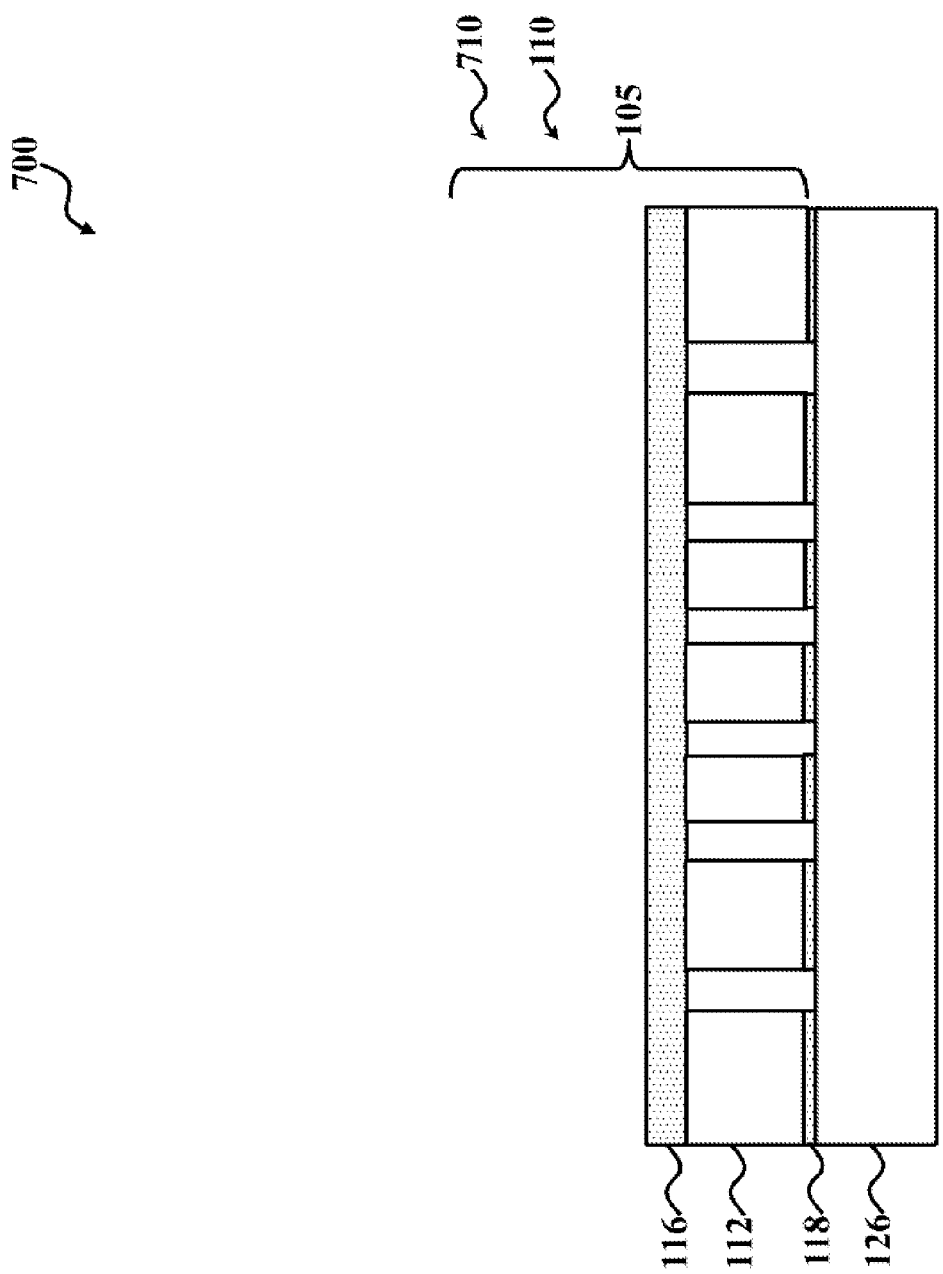
Figure 46:
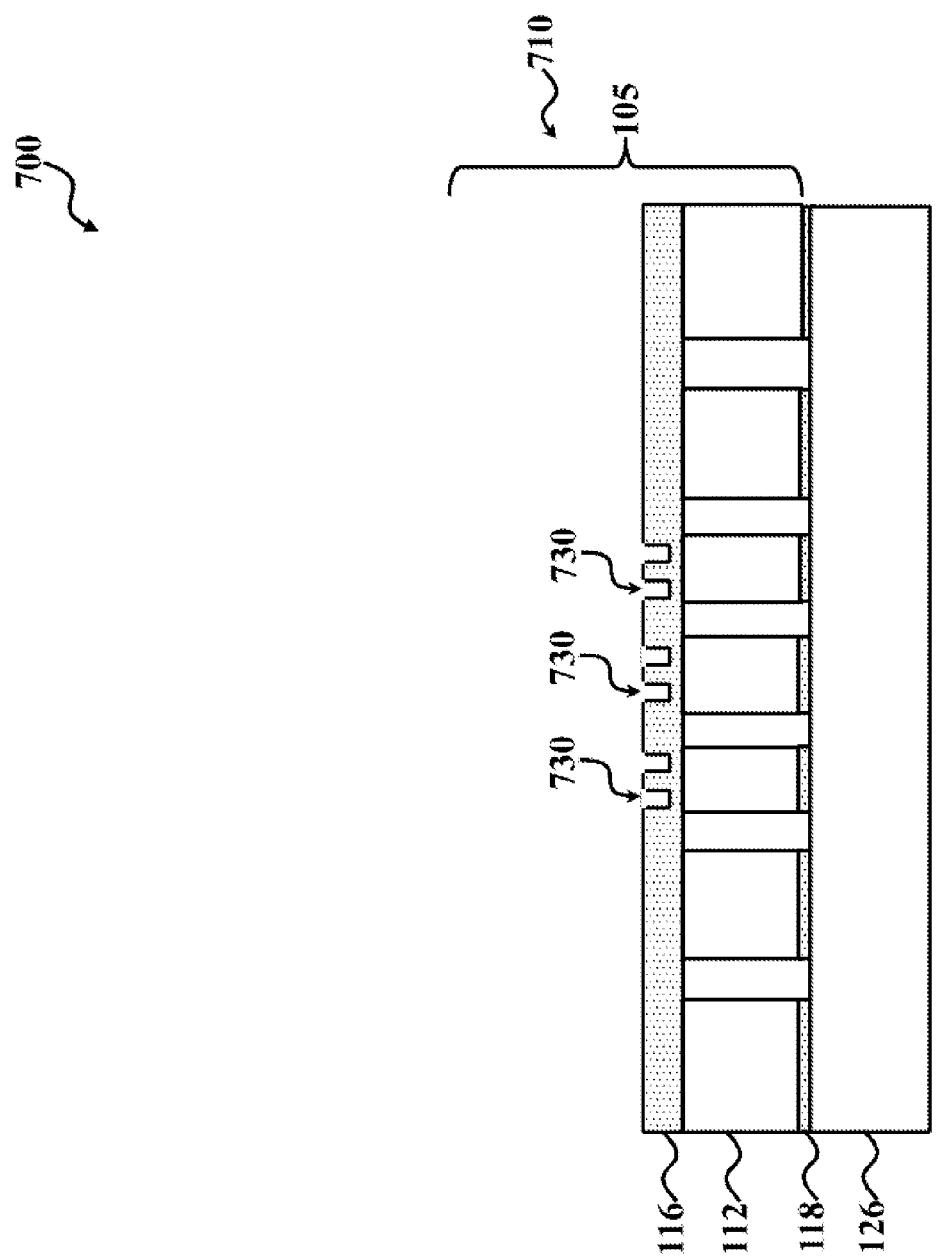
Figure 47:
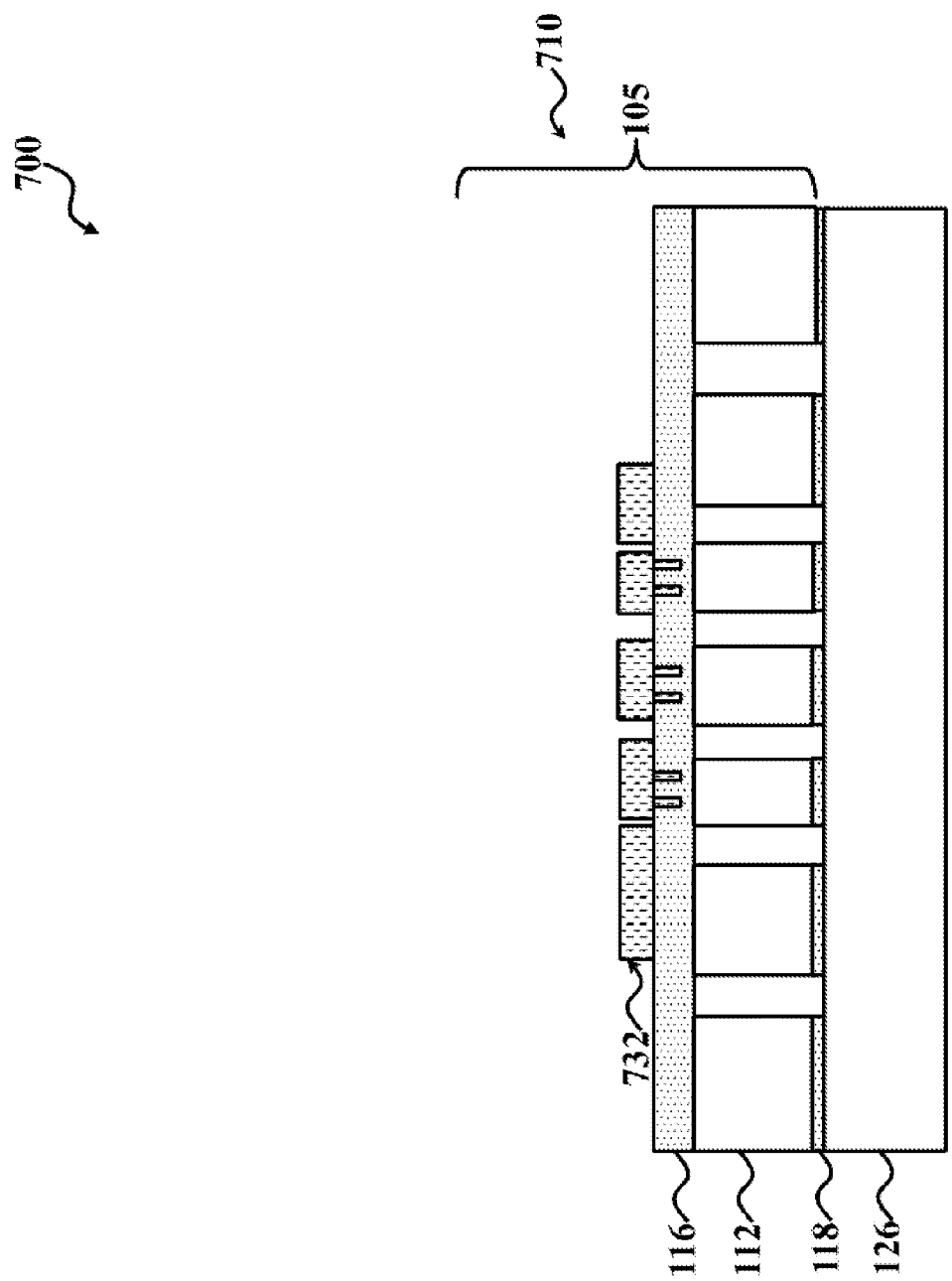
Figure 48:
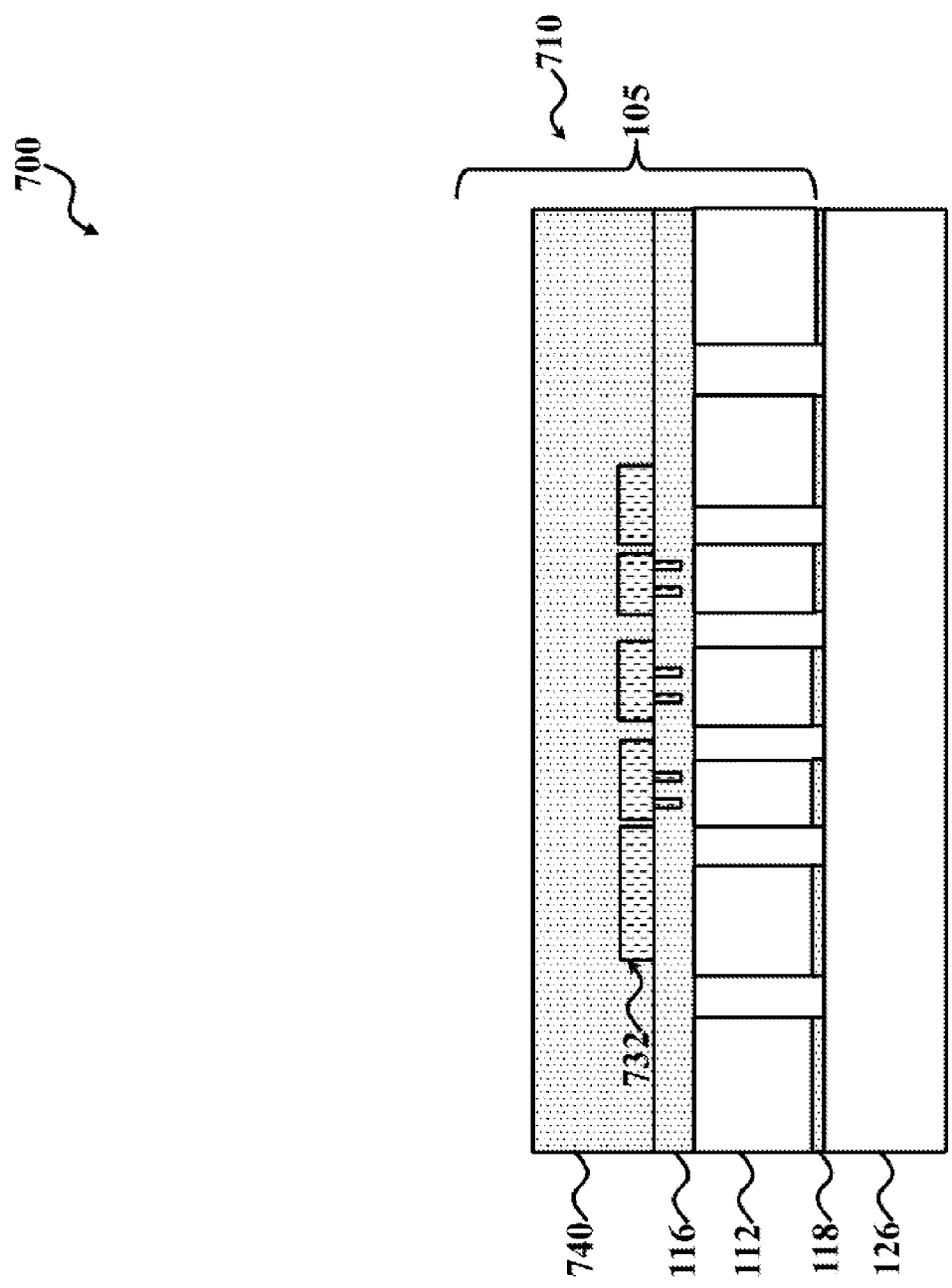

In FIG. 45, the substrate 105 is bonded with the substrate 126, such that the first structure layer of the MEMS device 710 is coupled with the substrate 126, similar to the bonding of the substrate 105 of the MEMS device 510 and substrate 126 described above with reference to FIG. 32. In contrast to processing of the semiconductor layer 114 of the MEMS device 510, the semiconductor layer 114 is completely removed to expose the insulator layer 116. An etch back process, chemical mechanical polishing process, other removal process, or combinations thereof is used to remove the semiconductor layer 114. After removing the semiconductor layer 114, a membrane structure is formed over the semiconductor layer 112. For example, in FIG. 46, portions of the insulator layer 116 are removed to define openings 730. Thereafter, in FIG. 47, a conductive membrane structure 732 is formed over the insulator layer 116, such that the conductive membrane structure 732 fills the openings 730. In the depicted embodiment, the conductive membrane structure 732 is a polysilicon structure. In an example, the polysilicon structure is doped. The conductive membrane structure 732 is formed by deposition processes, lithography patterning processes, etching processes, other processes, or a combination thereof, as described herein. For example, a conductive layer is formed over the patterned insulator layer 116 and the semiconductor layer 112, such that the conductive layer fills the openings 730. In an example, the conductive layer has a thickness of about 0.2 μm to about 10 μm. The conductive layer is formed by a deposition process, for example, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition methods, or combinations thereof. The conductive layer is then patterned to form the conductive membrane structure 732 using lithography patterning processes, etching processes, other suitable processes, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process implements nanoimprint technology. The etching processes include dry etching, wet etching, other etching methods, or combinations thereof.

Figure 40:
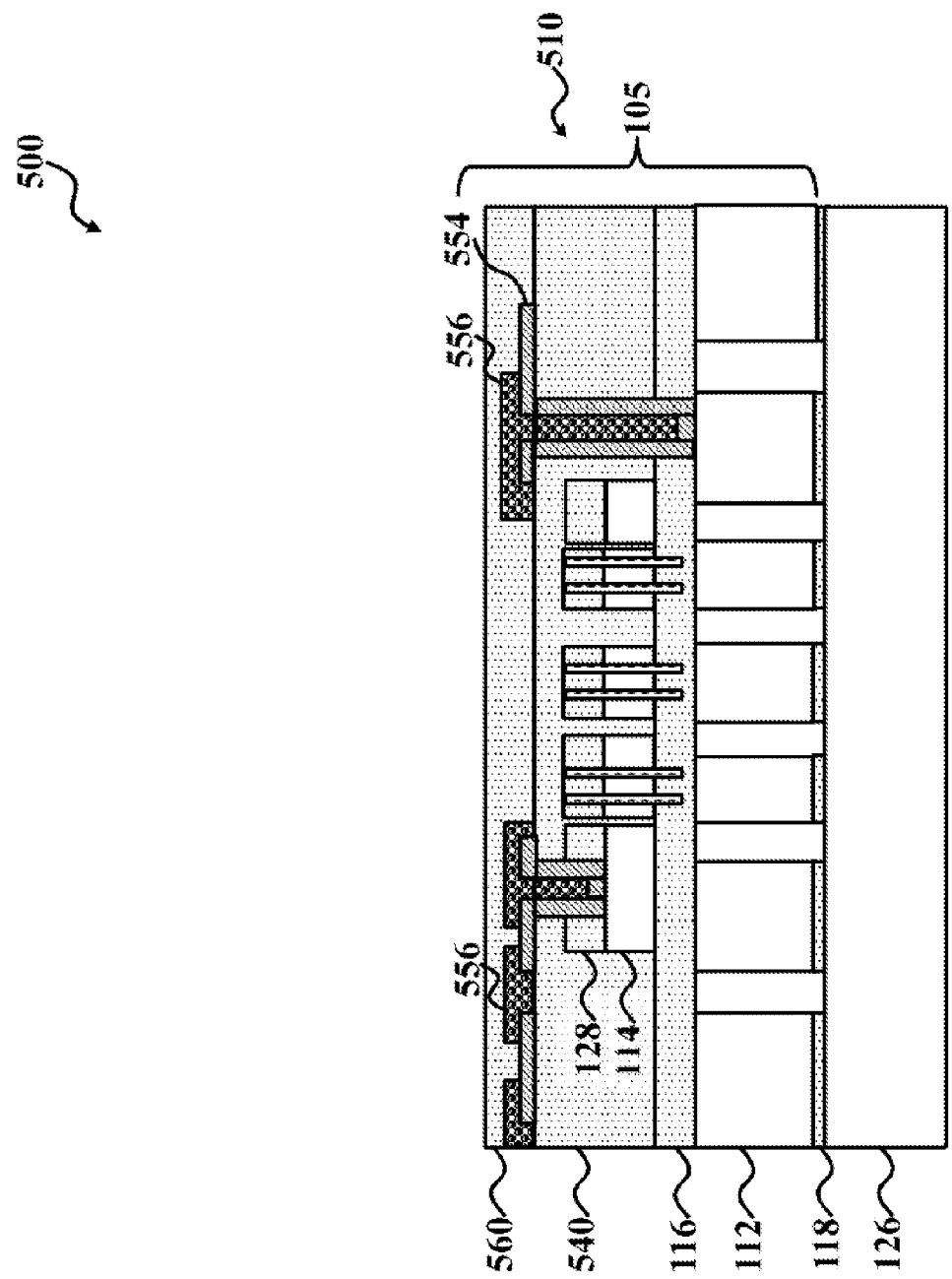
Figure 49:
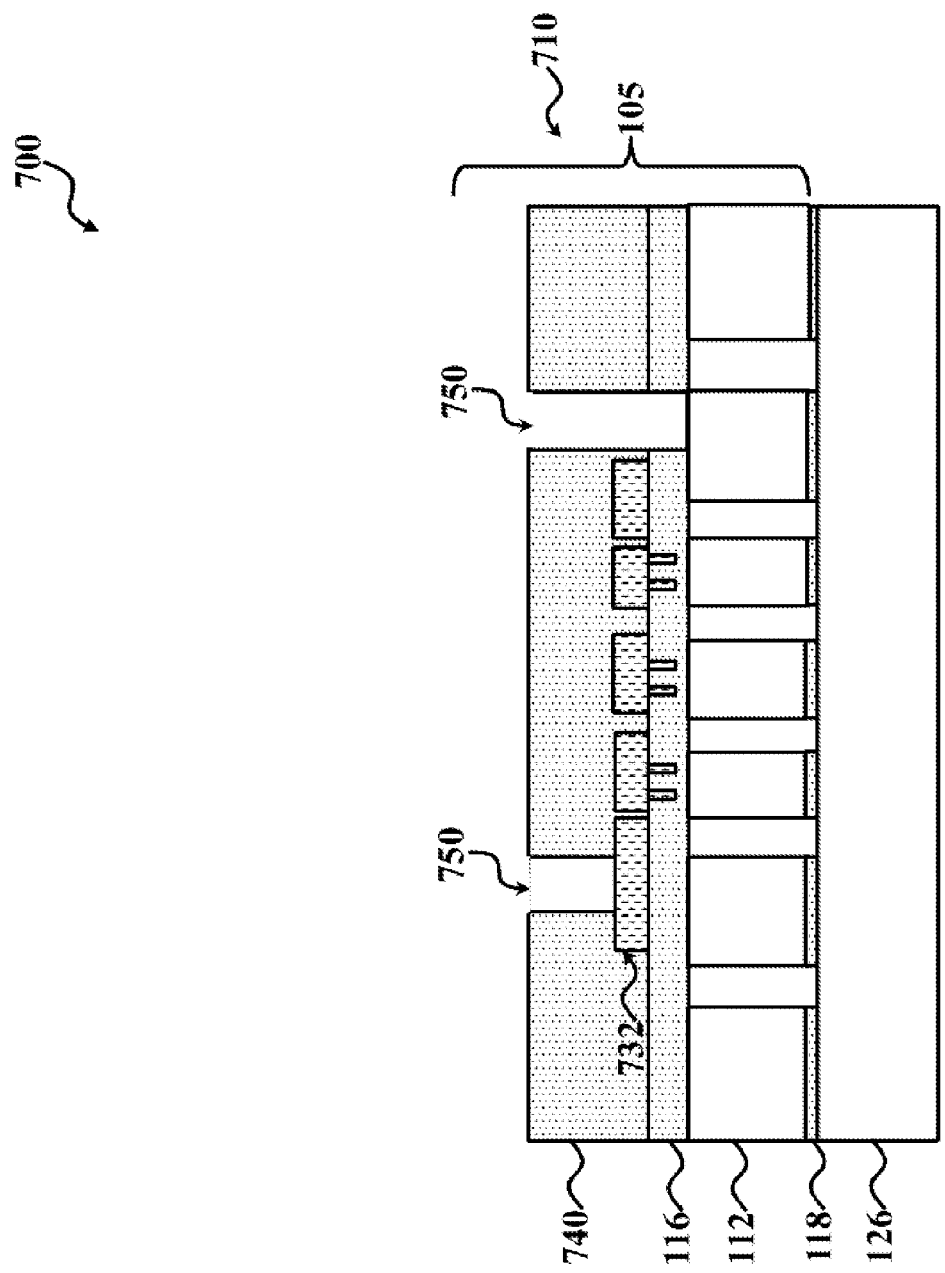
Figure 50:
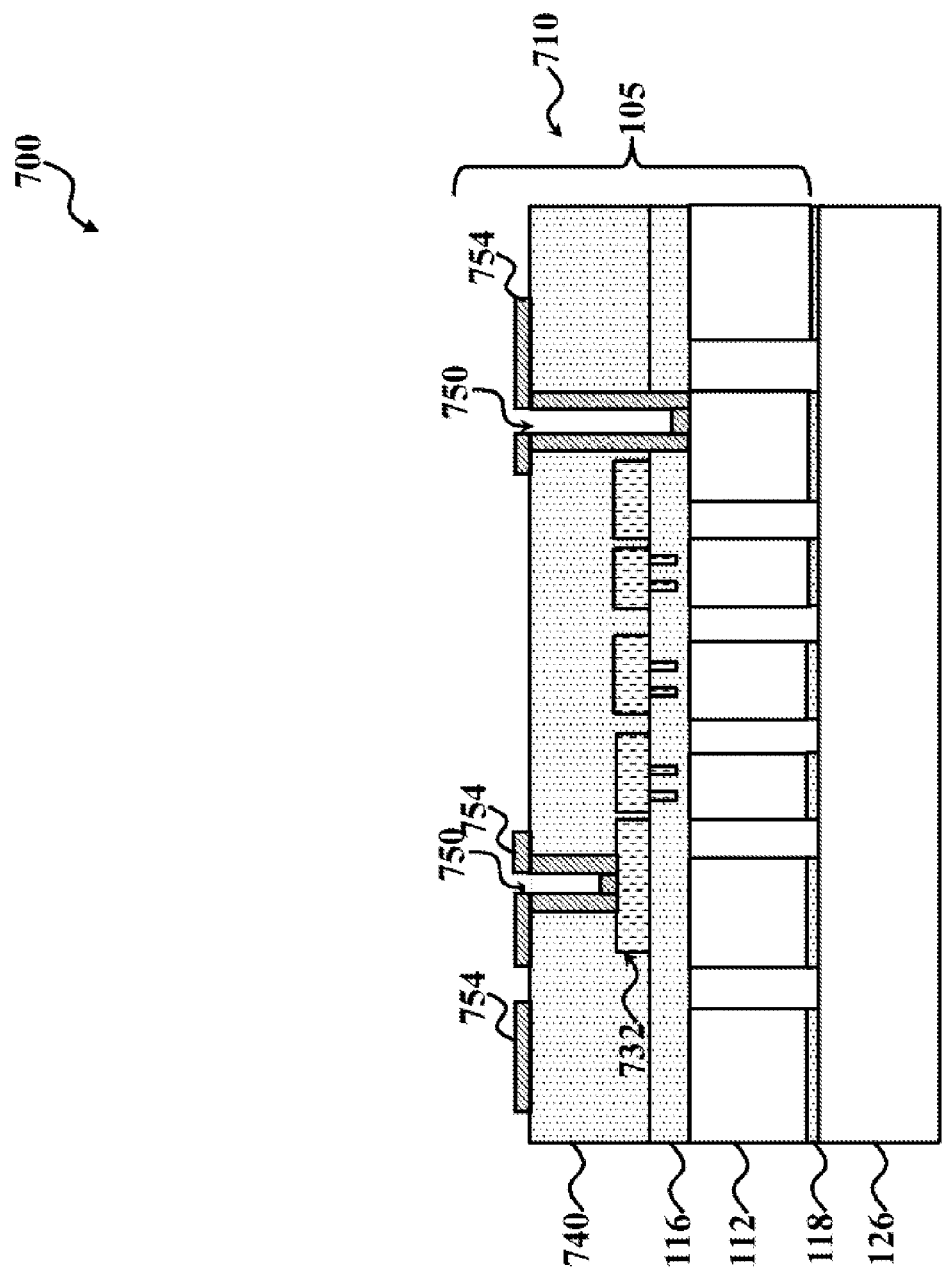
Figure 51:
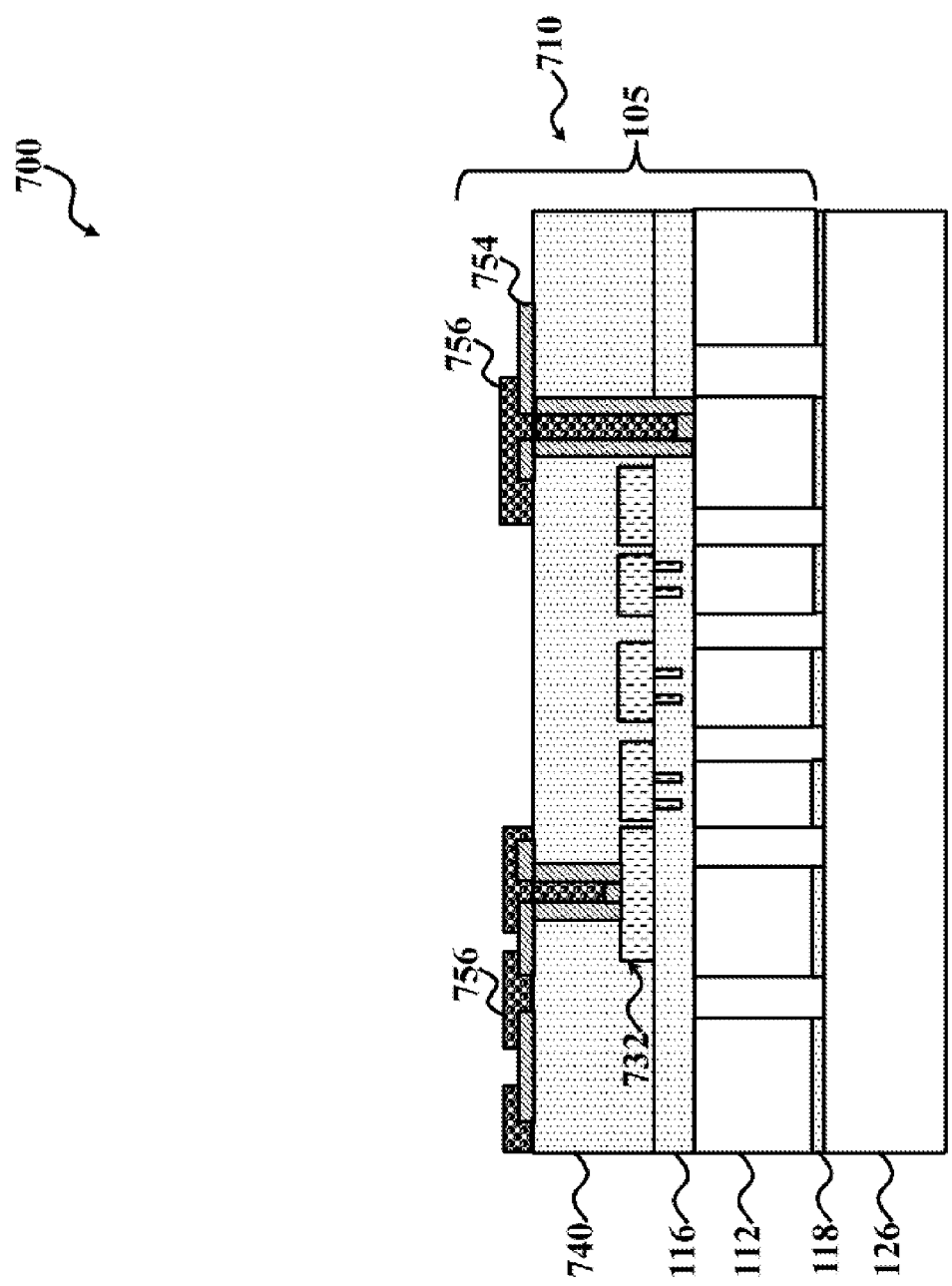
Figure 52:
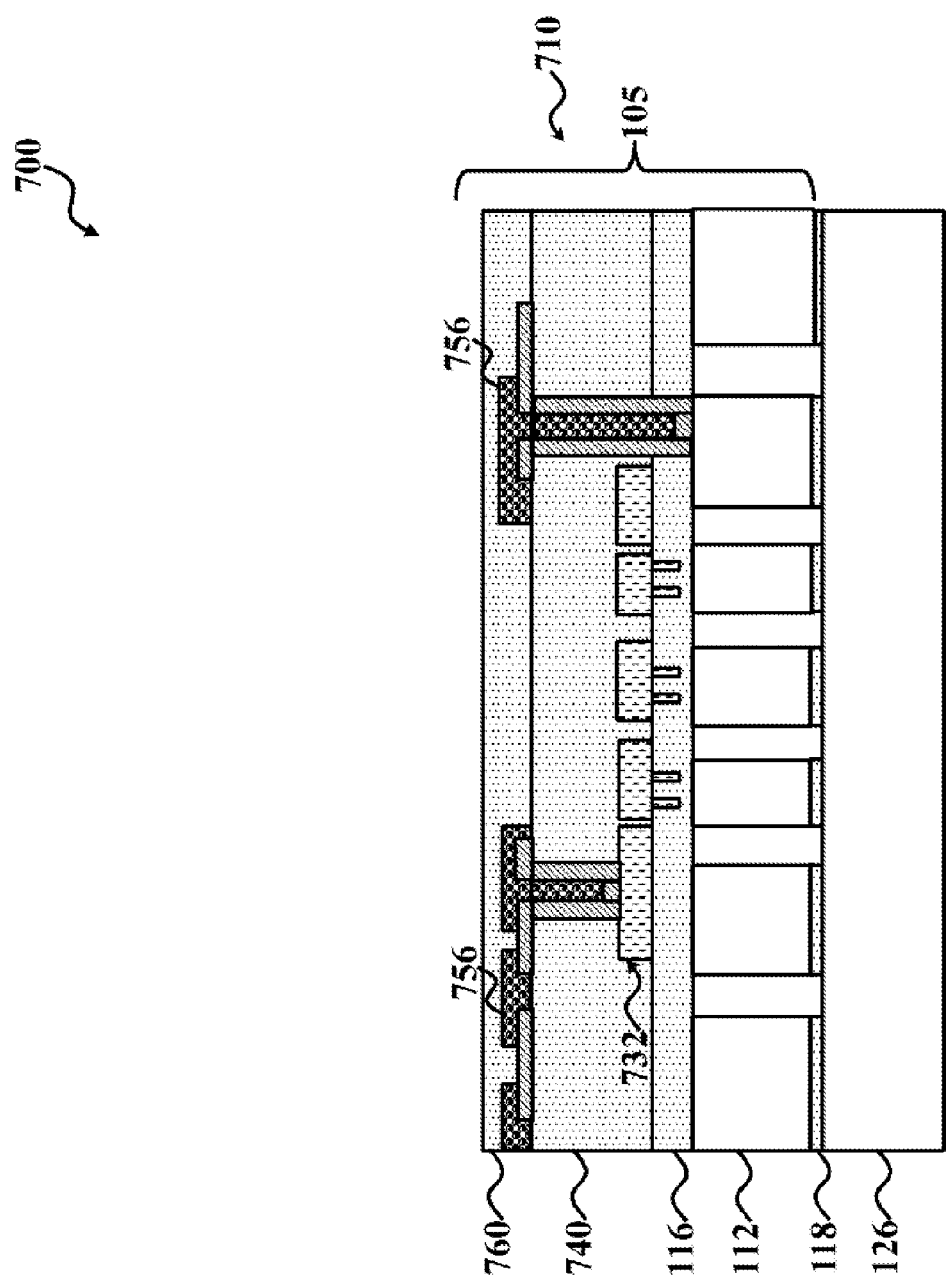
Figure 53:
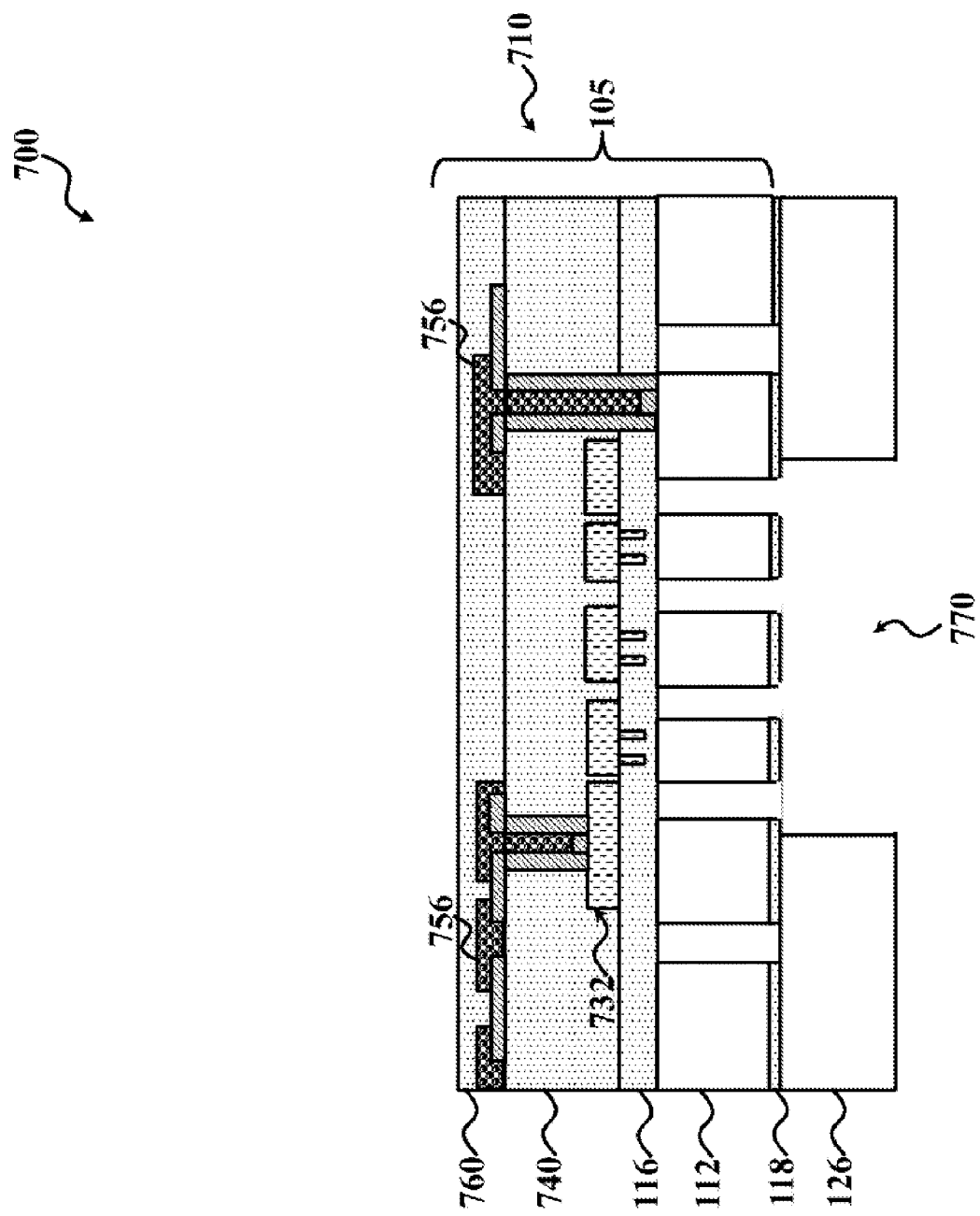
Figure 54:
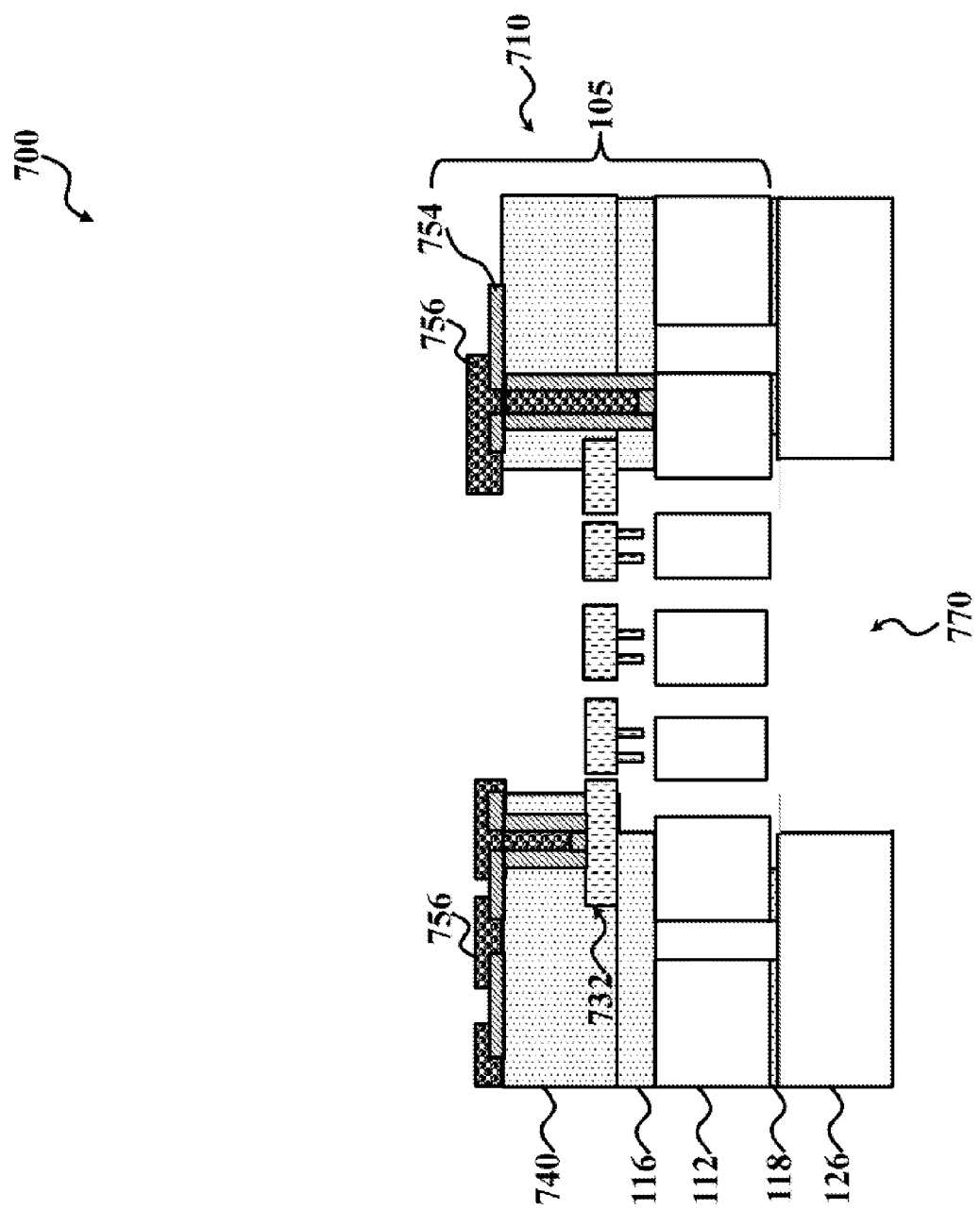

Subsequent processing of the device 700 is similar to the device 500. For example, in FIG. 48, a dielectric layer 740 is formed over the second structure layer, thereby planarizing the substrate 105. In the depicted embodiment, the dielectric layer 740 is an oxide-containing layer, such as a silicon oxide layer. In FIG. 49, the dielectric layer 740 is patterned to form via openings 750. For example, portions of the dielectric layer 740 are removed using lithography patterning and etching processes, such as those described herein, to define the via openings 750. In the depicted embodiment, one of the via openings 750 extends through the dielectric layer 740 to expose the conductive membrane feature 732, and one of the via openings 750 extends through the dielectric layer 740 to expose the semiconductor layer 112. In FIG. 50, conductive features 754 are formed to partially fill the via openings 750. The conductive features 754 facilitate electrical connection to the first and second structure layers of the MEMS device 710 (particularly, the semiconductor layer 112 and the conductive membrane feature 732). The conductive features 754 are formed similar to the conductive features 554, as described with reference to FIG. 38. In FIG. 51, a patterned passivation layer 756 is formed over the dielectric layer 740, similar to the patterned passivation layer 556 of the MEMS device 510, as described with reference to FIG. 39. Thereafter, in FIG. 52, a mask layer 760, similar to the mask layer 560 described with reference to FIG. 40, is formed over the dielectric layer 740, such that the patterned passivation layer 756 and the conductive features 754 are covered and protected during subsequent processing. In FIG. 53, a back cavity 770 is defined for the MEMS device 710, similar to the back cavity 570 defined for the MEMS device 510, as described with reference to FIG. 41. Then, in FIG. 54, a process further defines the first structure layer (here, the back plate) and second structure layer (here, the microphone membrane) of the MEMS device 710. For example, in FIG. 54, a process is performed to remove portions of the insulator layer 116, mask layer 118, dielectric layer 740, and dielectric layer 760. In the depicted embodiment, where the insulator layer 116, mask layer 118, dielectric layer 740, and dielectric layer 760 are oxide-containing layers, a sacrificial oxide release process is performed to remove desired portions of such layers, thereby completing fabrication of the MEMS device 710. In an example, the sacrificial oxide release process is a vapor process, such as a vapor HF process. The patterned passivation layer 756 includes a material that can withstand the vapor process. The MEMS device 710 can undergo further processing to complete fabrication.

The present disclosure provides various embodiments. An exemplary method includes providing a silicon-on-insulator (SOI) substrate, wherein the SOI substrate includes a first silicon layer separated from a second silicon layer by an insulator layer; processing the first silicon layer to form a first structure layer of a MEMS device; bonding the first structure layer to a substrate; and processing the second silicon layer to form a second structure layer of the MEMS device. In an example, the substrate is a silicon substrate, and the silicon substrate is bonded to the first structure layer via fusion bonding. In an example, processing the second silicon layer to form the second structure layer of the MEMS device includes reducing a thickness of the second silicon layer; and thereafter, forming a conductive structure that extends through the second silicon layer. In another example, processing the second silicon layer to form the second structure layer of the MEMS device includes removing the second silicon layer to expose the insulator layer; and thereafter, forming a conductive structure over the insulator layer. In an example, the conductive structure is a polysilicon structure. In an example, the method further includes bonding the second structure layer to a CMOS substrate. In an example, the method further includes forming a back cavity in the substrate.

Another exemplary method includes providing a silicon-on-insulator (SOI) substrate, wherein the SOI substrate includes a first silicon layer separated from a second silicon layer by an insulator layer; processing the first silicon layer to form a back plate of a MEMS device; bonding the first structure layer to a silicon substrate; and processing the second silicon layer to form a membrane of the MEMS device. In an example, processing the first silicon layer to form the back plate includes patterning the first silicon layer such that gaps extend through the first silicon layer. In an example, processing the second silicon layer to form the membrane of the MEMS device includes reducing a thickness of the second silicon layer, and thereafter, forming a polysilicon structure that extends through the second silicon layer. In an example, processing the second silicon layer to form the membrane of the MEMS device includes removing the second silicon layer to expose the insulator layer, and thereafter, forming a polysilicon structure over the insulator layer. In an example, the method further includes forming a back cavity in the silicon substrate.

Yet another exemplary method includes providing a silicon-on-insulator (SOI) substrate, wherein the SOI substrate includes a first silicon layer separated from a second silicon layer by an insulator layer; processing the first silicon layer to form a proof mass of a MEMS device; bonding the first structure layer to a silicon substrate; and processing the second silicon layer to form a back plate of the MEMS device. In an example, processing the first silicon layer to form the proof mass includes patterning the first silicon layer such that gaps extend through the first silicon layer. In an example, processing the second silicon layer to form the electrodes and/or mechanical springs of the MEMS device includes reducing a thickness of the second silicon layer, and thereafter, forming a polysilicon structure that extends through the second silicon layer. In an example, processing the second silicon layer to form the membrane of the MEMS device includes removing the second silicon layer to expose the insulator layer, and thereafter, forming a polysilicon structure over the insulator layer. In an example, the method further includes bonding the second structure layer to a CMOS substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate having a first semiconductor material layer, a second semiconductor material layer, and an insulator layer between the first and second semiconductor material layers;
processing the first semiconductor material layer to form a first structure layer of a MEMS device, wherein processing the first semiconductor material layer to form the first structure layer includes:
forming a first trench within the first semiconductor material layer;
forming a dielectric material layer within the first trench; and
forming a first conductive layer within the first trench; and
processing the second semiconductor material layer to form a second structure layer of the MEMS device; and
removing the first conductive layer from the first trench prior to processing the second semiconductor material layer.

2. The method of claim 1, wherein forming the first trench within the first semiconductor material layer further includes forming a second trench within the first semiconductor material layer,
wherein forming the first conductive layer within the first trench further includes forming the first conductive layer within the second trench, and
wherein the first conductive layer is positioned within the second trench during processing of the second semiconductor layer.

3. The method of claim 1, wherein processing the second semiconductor material layer to form the second structure layer of the MEMS device further includes:
forming a second trench that extends through the second semiconductor layer and the insulator layer to expose a portion of the first semiconductor material layer; and
forming a second conductive layer within the second trench, wherein the second conductive layer physically contacts the portion of the first semiconductor material layer.

4. The method of claim 3, wherein processing the second semiconductor material layer to form the second structure layer of the MEMS device further includes:
forming a bonding structure directly on the second conductive layer; and
bonding a capping structure to the bonding structure, wherein the capping structure includes an interconnect structure.

5. The method of claim 2, wherein processing the second semiconductor material layer to form the second structure layer of the MEMS device further includes:
forming a third trench that extends through the second semiconductor layer and the insulator layer to expose a portion of the first conductive layer within the second trench; and
forming a second conductive layer within the third trench such that the second conductive layer physically contacts the portion of the first conductive layer within the second trench.

6. The method of claim 5, wherein processing the second semiconductor material layer to form the second structure layer of the MEMS device further includes: after forming the second conductive layer within the third trench, removing the dielectric material layer from the second trench.

7. The method of claim 1, wherein processing the second semiconductor material layer to form the second structure layer of the MEMS device further includes:
completely removing the second semiconductor material layer to expose the insulator layer; after completely removing the second semiconductor material layer to expose the insulator layer, forming a second trench that extends through the insulator layer to expose a portion of the first semiconductor material layer and a third trench that extends through the insulator layer to expose a portion of the first conductive layer within the first trench; and
forming a second conductive layer within the first and second trenches such that the second conductive layer physically contacts the portion of the first semiconductor material layer and the portion of the first conductive layer within the first trench.

8. A method comprising:
providing a substrate having a first semiconductor material layer, a second semiconductor material layer, and an insulator layer between the first and second semiconductor material layers;
processing the first semiconductor material layer to form a first structure layer of a MEMS device, wherein processing the first semiconductor material layer to form the first structure layer of the MEMS device includes:
forming a second trench within the first semiconductor material layer; and
forming a second conductive layer within the second trench;
processing the second semiconductor material layer to form a second structure layer of the MEMS device, wherein processing the second semiconductor material layer to form a second structure layer of the MEMS device includes:
forming a first trench that extends through the insulator layer; and
forming a first conductive layer within the first trench; and
removing the second conductive layer from the second trench prior to processing the second semiconductor material layer.

9. The method of claim 8, wherein forming the first trench that extends through the insulator layer includes forming the first trench through the second semiconductor material layer.

10. The method of claim 8, wherein processing the second semiconductor material layer to form the second structure layer of the MEMS device further includes completely removing the second semiconductor material layer to expose the insulator layer prior to forming the first trench.

11. The method of claim 8, wherein processing the first semiconductor material layer to form the first structure layer of a MEMS device includes:
forming a third trench within the first semiconductor material layer;
forming another substrate on the first semiconductor material layer; and
removing a portion of the another substrate to expose a portion of the first semiconductor material layer.

12. The method of claim 8, wherein forming the second trench within the first semiconductor material layer includes forming a third trench within the first semiconductor material layer,
wherein forming the second conductive layer within the second trench includes forming the second conductive layer within the third trench,
wherein the first trench exposes the second conductive layer within the third trench, and
wherein the first conductive layer within the first trench physically contacts the second conductive layer within the third trench.

13. The method of claim 8, wherein the first trench extends through the second semiconductor layer and the insulator layer to expose a portion of the first semiconductor material layer, and
wherein the first conductive layer physically contacts the portion of the first semiconductor material layer.

14. A method comprising:
providing a substrate having a first semiconductor material layer, a second semiconductor material layer, and an insulator layer between the first and second semiconductor material layers;
processing the first semiconductor material layer to form a first structure layer of a MEMS device, wherein processing the first semiconductor material layer to form the first structure layer includes:
forming a first trench within the first semiconductor material layer that exposes a portion of the insulator layer; and
forming another conductive layer within the first trench; and
processing the second semiconductor material layer to form a second structure layer of the MEMS device, wherein processing the second semiconductor material layer to form the second structure layer includes:
forming a second trench within the insulator layer; and
forming a conductive layer within the second trench; and
removing the another conductive layer from the first trench prior to processing the second semiconductor material layer.

15. The method of claim 14, wherein processing the first semiconductor material layer to form the first structure layer further includes forming a dielectric material layer within the first trench.

16. The method of claim 14, wherein processing the second semiconductor material layer to form the second structure layer further includes:
completely removing the second semiconductor material layer to expose the insulator layer, and
wherein the second trench extends to the first semiconductor material layer and exposes a portion of the first semiconductor material layer.

17. The method of claim 14, wherein processing the second semiconductor material layer to form the second structure layer further includes:
forming a dielectric material layer over the second semiconductor material layer;
forming a third trench that extends through the dielectric material and extends to a portion of the second semiconductor material layer to thereby expose a portion of the second semiconductor material layer, and
wherein the second trench exposes a portion of the first semiconductor material layer, and
wherein forming the conductive layer within the second trench includes forming the conductive layer within the third trench.

18. The method of claim 14, wherein processing the first semiconductor material layer to form the first structure layer further includes:
forming a mask layer on the first semiconductor layer;
bonding another substrate to the mask layer; and removing a portion of the another substrate and masking layer to expose a portion of the first semiconductor material layer.

19. The method of claim 14, wherein processing the second semiconductor material layer to form the second structure layer further includes reducing a thickness of the second semiconductor material layer prior to forming the second trench.

20. The method of claim 14, wherein the second trench extends through the second semiconductor layer and the insulator layer to expose a portion of the first semiconductor material layer, and wherein the conductive layer physically contacts the portion of the first semiconductor material layer.

* * * * *